(12) United States Patent
Seo

(10) Patent No.: US 12,394,487 B2
(45) Date of Patent: Aug. 19, 2025

(54) METHOD OF PROGRAMMING DATA IN NONVOLATILE MEMORY DEVICE AND NONVOLATILE MEMORY DEVICE PERFORMING THE SAME

(71) Applicant: Samsung Electronics Co., Ltd., Suwon-si (KR)

(72) Inventor: Hyun Seo, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 162 days.

(21) Appl. No.: 18/464,383

(22) Filed: Sep. 11, 2023

(65) Prior Publication Data

US 2024/0212761 A1  Jun. 27, 2024

(30) Foreign Application Priority Data

Dec. 22, 2022  (KR) .................. 10-2022-0181303

(51) Int. Cl.
*G11C 7/10* (2006.01)
*G11C 7/04* (2006.01)
*G11C 7/14* (2006.01)
*G11C 16/04* (2006.01)
*G11C 16/08* (2006.01)
*G11C 16/10* (2006.01)
*G11C 16/24* (2006.01)
*G11C 16/32* (2006.01)

(52) U.S. Cl.
CPC .......... *G11C 16/10* (2013.01); *G11C 16/0483* (2013.01); *G11C 16/08* (2013.01); *G11C 16/24* (2013.01); *G11C 16/32* (2013.01)

(58) Field of Classification Search
CPC ... G11C 7/1063; G11C 7/1045; G11C 7/1069; G11C 7/1096; G11C 7/14
See application file for complete search history.

(56) References Cited

U.S. PATENT DOCUMENTS

| 7,519,130 | B2* | 4/2009 | Hsu ..................... H04L 25/0274 |
| | | | 327/107 |
| 7,924,046 | B1* | 4/2011 | Ding ................... H04L 25/0286 |
| | | | 326/26 |
| 7,936,812 | B2* | 5/2011 | Hollis ............... H04L 25/03057 |
| | | | 375/233 |
| 8,091,008 | B2* | 1/2012 | Oku ....................... G11C 7/106 |
| | | | 714/766 |

(Continued)

FOREIGN PATENT DOCUMENTS

KR    100842758 B1    7/2008

*Primary Examiner* — Jason Lappas
(74) *Attorney, Agent, or Firm* — Myers Bigel, P.A.

(57) ABSTRACT

In a method of programming data in a nonvolatile memory device including memory cells and a page buffer, the memory cells are electrically connected to wordlines and bitlines, and the page buffer controls the memory cells. In a first program time period of a first program loop, a program voltage having a first program voltage is applied to a selected wordline that is electrically connected to a target memory cell, and a bitline shut-off signal having a first delay is applied to the page buffer. The program voltage is applied to the selected wordline multiple times during one program loop while a magnitude of the program voltage is changed. The delay of the bitline shut-off signal corresponds to a time period during which the bitline shut-off signal maintains a ground voltage.

20 Claims, 43 Drawing Sheets

(56) References Cited

U.S. PATENT DOCUMENTS

| | | | |
|---|---|---|---|
| 8,112,680 B2* | 2/2012 | Chung | G11C 7/1006 |
| | | | 714/701 |
| 8,385,492 B2* | 2/2013 | Ho | H04L 25/03057 |
| | | | 375/340 |
| 8,588,002 B2 | 11/2013 | Han | |
| 8,624,653 B2* | 1/2014 | Nagda | G01R 31/31703 |
| | | | 327/307 |
| 8,767,487 B2 | 7/2014 | Goda et al. | |
| 9,087,601 B2 | 7/2015 | Dutta et al. | |
| 9,230,659 B2 | 1/2016 | Choi et al. | |
| 10,347,358 B2* | 7/2019 | Kim | G11C 29/022 |
| 10,523,204 B2* | 12/2019 | Koo | G11C 7/10 |
| 11,200,955 B2 | 12/2021 | Jung et al. | |
| 11,456,041 B2 | 9/2022 | Kim | |
| 2020/0058332 A1* | 2/2020 | Choi | G11C 8/06 |
| 2020/0125505 A1* | 4/2020 | Brox | G11C 7/1084 |
| 2022/0191069 A1* | 6/2022 | Dong | H04L 25/0272 |
| 2023/0138604 A1 | 5/2023 | Choi et al. | |
| 2023/0145750 A1 | 5/2023 | Park et al. | |

\* cited by examiner

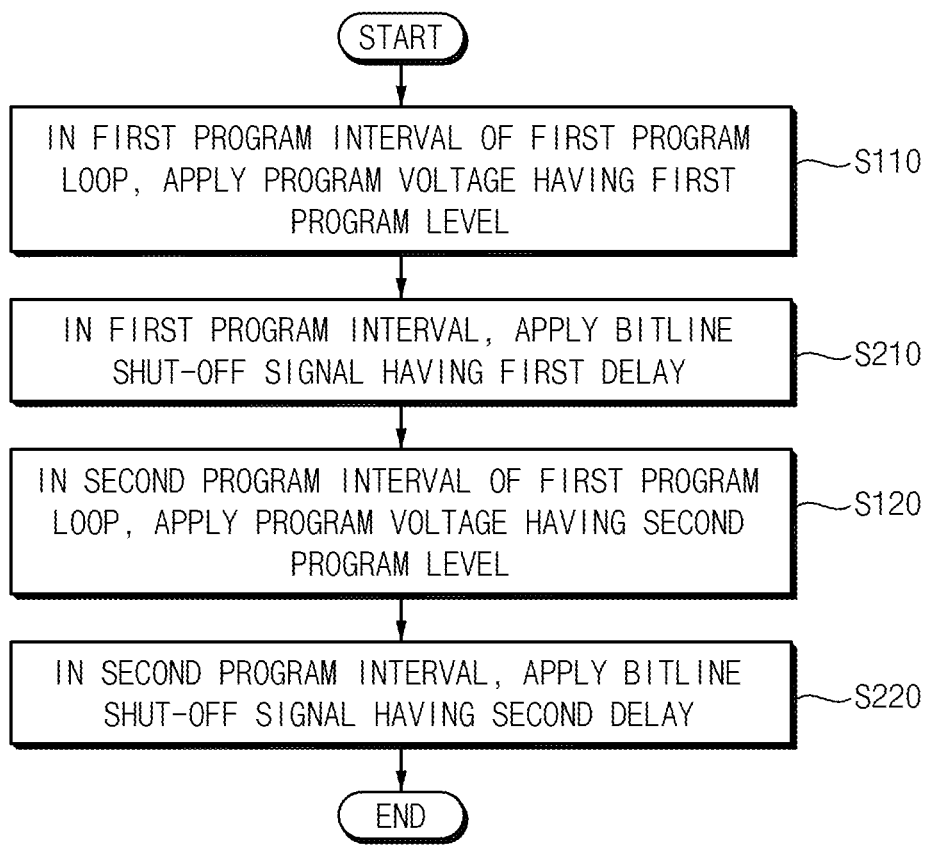

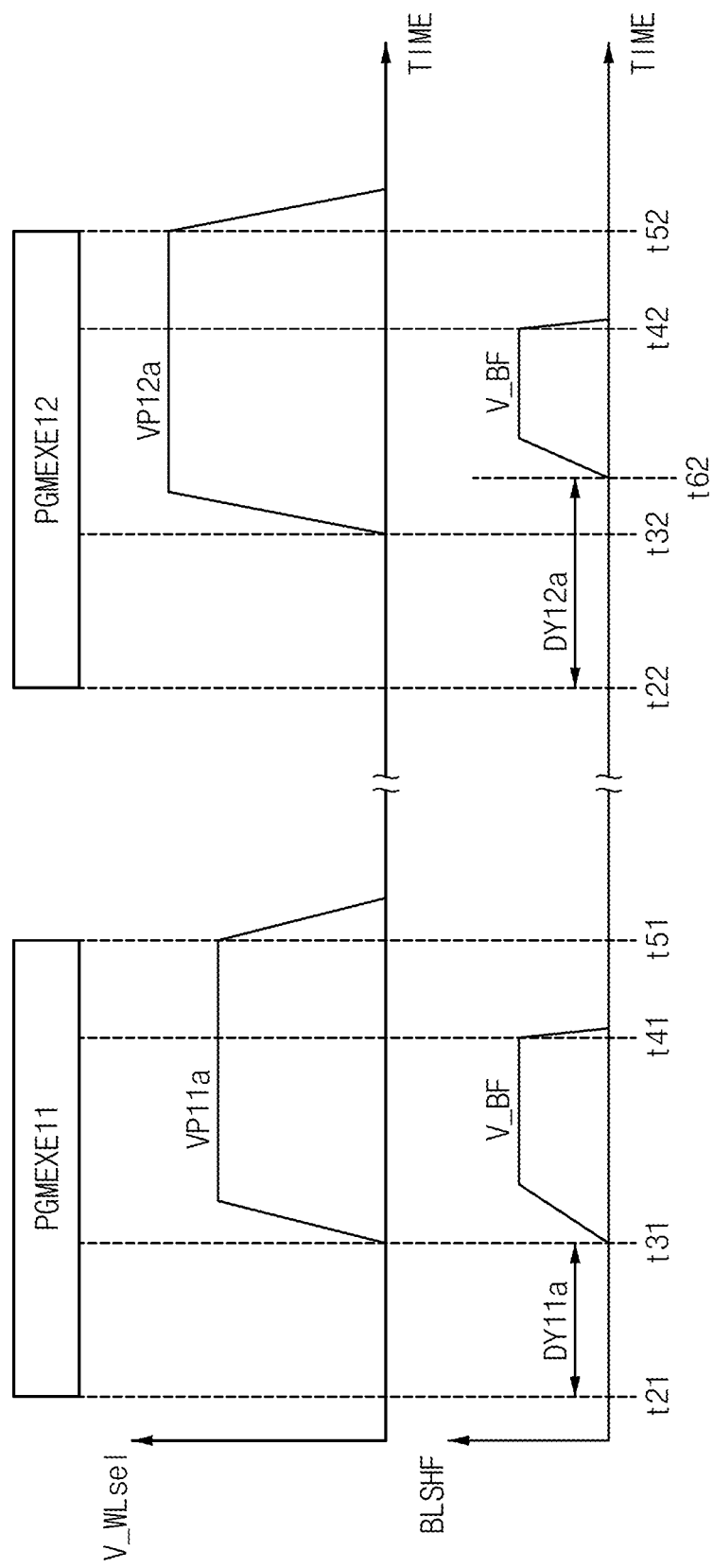

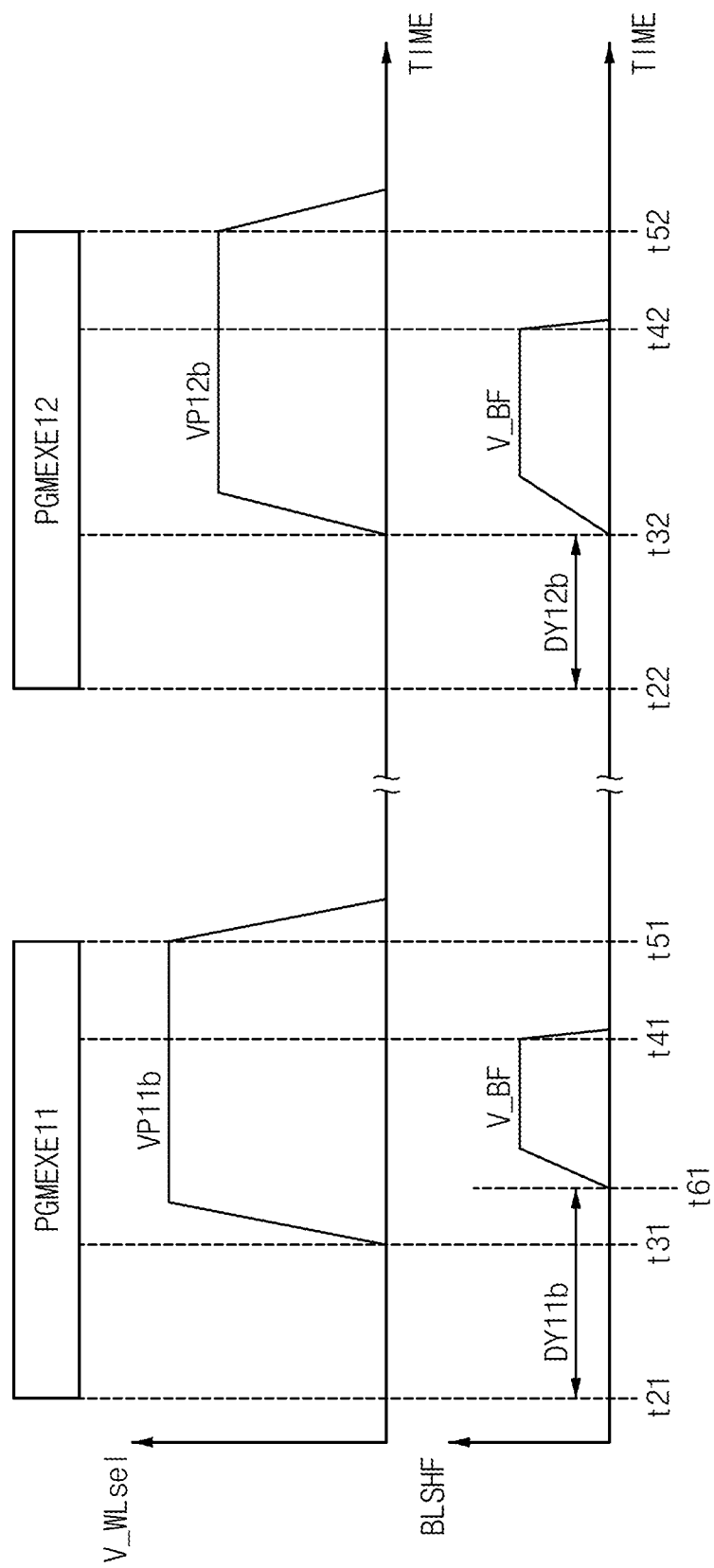

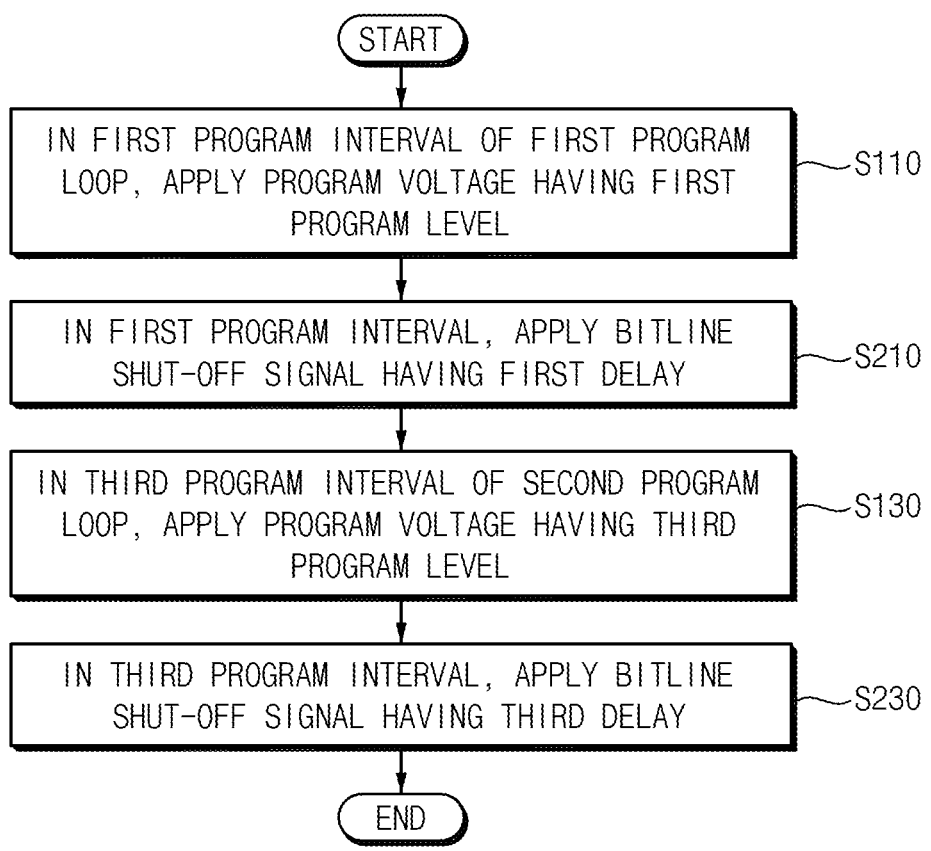

METHOD OF PROGRAMMING DATA IN NONVOLATILE MEMORY DEVICE AND NONVOLATILE MEMORY DEVICE PERFORMING THE SAME

CROSS-REFERENCE TO RELATED APPLICATION

This application claims priority under 35 USC § 119 to Korean Patent Application No. 10-2022-0181303 filed on Dec. 22, 2022 in the Korean Intellectual Property Office (KIPO), the contents of which are herein incorporated by reference in their entirety.

BACKGROUND

Example embodiments relate generally to semiconductor integrated circuits, and more particularly to methods of programming data in nonvolatile memory devices, and nonvolatile memory devices performing the methods.

Semiconductor memory devices include volatile and nonvolatile memory devices. Volatile memory devices lose stored data when disconnected from power, and nonvolatile memory devices retain stored data when disconnected from power. Volatile memory devices may perform read and write operations at a higher speed than nonvolatile memory devices. Nonvolatile memory devices may be used to store data that needs be retained regardless of whether power is provided.

Recently, nonvolatile memory devices including three-dimensional structures such as vertical NAND memory devices have been developed to increase the degree of device integration and memory capacity of the nonvolatile memory devices. Along with increases in the integration degree and memory capacity, disturbance of unselected memory cells may increase while selected memory cells are programmed.

SUMMARY

At least one example embodiment of the present disclosure provides a method of programming data in a nonvolatile memory device capable of enhancing the efficiency of a program operation.

At least one example embodiment of the present disclosure provides a nonvolatile memory device that performs the method of programming data in the nonvolatile memory device.

According to example embodiments, in a method of programming data in a nonvolatile memory device including a plurality of memory cells and a page buffer, the plurality of memory cells are electrically connected to a plurality of wordlines and a plurality of bitlines, and the page buffer controls the plurality of memory cells. In a first program interval of a first program loop, a program voltage having a first program voltage is applied to a selected wordline that is electrically connected to a target memory cell on which a program operation is performed. In the first program time period, a bitline shut-off signal having a first delay is applied to the page buffer. The program voltage is applied to the selected wordline multiple times during one program loop while a magnitude of the program voltage is changed for each of the multiple times that the program voltage is applied. As the magnitude of the program voltage increases, a delay of the bitline shut-off signal increases. The delay of the bitline shut-off signal corresponds to a time interval during which the bitline shut-off signal maintains a ground voltage.

According to example embodiments, a nonvolatile memory device includes a memory cell array, a page buffer circuit and a control circuit. The memory cell array includes a plurality of memory cells electrically connected to a plurality of wordlines and a plurality of bitlines. The page buffer circuit includes a page buffer that controls the plurality of memory cells. The control circuit applies a program voltage having a first program voltage to a selected wordline that is electrically connected to a target memory cell on which a program operation is performed in a first program time period of a first program loop, and configured to apply a bitline shut-off signal having a first delay to the page buffer in the first program time period. The control circuit is configured to apply the program voltage to the selected wordline multiple times during one program loop while a magnitude of the program voltage is changed for each of the multiple times that the program voltage is applied. As the magnitude of the program voltage increases, a delay of the bitline shut-off signal increases. The delay of the bitline shut-off signal corresponds to a time period during which the bitline shut-off signal maintains a ground voltage.

According to example embodiments, in a method of programming data in a nonvolatile memory device including a plurality of memory cells and a page buffer, the plurality of memory cells are electrically connected to a plurality of wordlines and a plurality of bitlines, and the page buffer controls the plurality of memory cells. In a first program time period of a first program loop, a program voltage having a first program voltage is applied to a selected wordline that is electrically connected to a target memory cell on which a program operation is performed. In the first program time period, a bitline shut-off signal having a first delay is applied to the page buffer. In a second program time period of the first program loop after the first program time period of the first program loop, the program voltage having a second program voltage different from the first program voltage is applied to the selected wordline. In the second program time period, the bitline shut-off signal having a second delay different from the first delay is applied to the page buffer. In a third program time period of a second program loop after the first program loop, the program voltage having a third program voltage higher than the first program voltage is applied to the selected wordline. In the third program time period, the bitline shut-off signal having a third delay longer than the first delay is applied to the page buffer. The program voltage is applied to the selected wordline multiple times during one program loop while a magnitude of the program voltage is changed for each of the multiple times that the program voltage is applied. As the magnitude of the program voltage increases, a delay of the bitline shut-off signal increases, and a slope of the bitline shut-off signal increases. The delay of the bitline shut-off signal corresponds to a time time period during which the bitline shut-off signal maintains a ground voltage. The slope of the bitline shut-off signal corresponds to an increase from the ground voltage to a bitline forcing voltage. In response to the second program voltage being higher than the first program voltage, the second delay is longer than the first delay. In response to the second program voltage being lower than the first program voltage, the second delay is shorter than the first delay.

In the method of programming data in the nonvolatile memory device and the nonvolatile memory device according to example embodiments, the program operation may be performed based on the multi-pulse program scheme, and the delay of the bitline shut-off signal may be controlled to become different for each program pulse and/or each program loop. For example, the delay of the bitline shut-off signal may increase as the magnitude of the program voltage increases. For example, the delay of the bitline shut-off signal may increase in a later program loop than in an early program loop. Accordingly, the program disturbance may be efficiently improved or enhanced, and the efficiency of the program operation may increase or enhance.

BRIEF DESCRIPTION OF THE DRAWINGS

Illustrative, non-limiting example embodiments will be more clearly understood from the following detailed description taken in conjunction with the accompanying drawings.

FIG. 8 is a flowchart illustrating an example of a method of programming data in a nonvolatile memory device of FIG. 1.

FIGS. 9A and 9B are diagrams for describing operations of FIG. 8.

FIG. 10 is a flowchart illustrating an example of a method of programming data in a nonvolatile memory device of FIG. 1.

DETAILED DESCRIPTION

Figure 1:
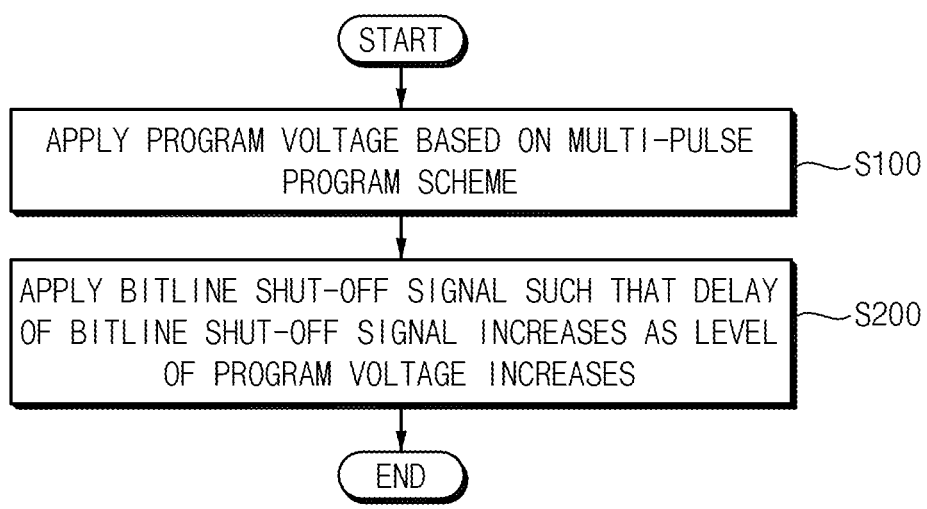
FIG. 1 is a flowchart illustrating a method of programming data in a nonvolatile memory device according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a flowchart illustrating a method of programming data in a nonvolatile memory device according to example embodiments.

Referring to FIG. 1, a method of programming data according to example embodiments is performed by a nonvolatile memory device that includes a plurality of memory cells and a page buffer. The plurality of memory cells are connected to a plurality of wordlines and a plurality of bitlines, and the page buffer controls the plurality of memory cells. A configuration of the nonvolatile memory device will be described in detail with reference to FIGS. 2, 3 and 4.

In the method of programming data in the nonvolatile memory device according to example embodiments, a program voltage is applied to a target memory cell based on a multi-pulse program scheme (or method) (operation S100). For example, the program voltage may be applied to a selected wordline connected to the target memory cell.

A plurality of program loops may be sequentially performed while a programming procedure is performed on the target memory cell, and each program loop may include a program operation using the program voltage and a program verification operation using a program verification voltage. Unlike a single-pulse program scheme in which one program loop includes only one program operation, one program loop may include two or more program operations in the multi-pulse program scheme. In addition, in the multi-pulse program scheme, the program voltage may be applied to the selected wordline multiple times during one program loop while the level or voltage of the program voltage is changing. For example, the program voltage having a first program level or voltage may be applied to the selected wordline in a first program interval (e.g., time interval, period, or time period) of a first program loop, and the program voltage having a second program level or voltage different from the first program level or voltage may be applied to the selected wordline in a second program interval of the first program loop after the first program interval of the first program loop. The multi-pulse program scheme will be described in detail with reference to FIGS. 6A and 6B.

A bitline shut-off signal BLSHF is applied such that a delay of the bitline shut-off signal BLSHF increases as the level or voltage of the program voltage increases (operation S200). The delay of the bitline shut-off signal BLSHF corresponds to a time interval or time period during which the bitline shut-off signal BLSHF maintains a ground level (or ground voltage level or ground voltage). For example, the bitline shut-off signal BLSHF may be applied to a page buffer connected to the target memory cell. For example, the bitline shut-off signal BLSHF having a first delay may be applied to the page buffer in the first program interval, and the bitline shut-off signal BLSHF having a second delay different from the first delay may be applied to the page buffer in the second program interval. A configuration and operation of the page buffer will be described in detail with reference to FIGS. 5A and 5B.

In some example embodiments, as the level or voltage of the program voltage increases, the delay of the bitline shut-off signal BLSHF may increase, and a slope of the bitline shut-off signal BLSHF may increase, which will be described with reference to FIGS. 14A and 14B. The slope of the bitline shut-off signal BLSHF may correspond to an increase from the ground level or voltage to a bitline forcing level or voltage.

In the multi-pulse program scheme, boosting levels or voltages needed to improve or enhance the program disturbance may be different for each pulse. For example, an initial precharge level or voltage may increase for a higher boosting level or voltage, and channel recovery capability should become better in a program execution interval.

In the method of programming data in the nonvolatile memory device according to example embodiments, the program operation may be performed based on the multi-pulse program scheme, and the delay of the bitline shut-off signal BLSHF may be controlled to become different for each program pulse and/or each program loop. For example, the delay of the bitline shut-off signal BLSHF may increase as the level or voltage of the program voltage increases. For example, the delay of the bitline shut-off signal BLSHF may increase in a later program loop than in an early program loop. Accordingly, the program disturbance may be efficiently improved or enhanced, and the efficiency of the program operation may increase or enhance.

Figure 2:
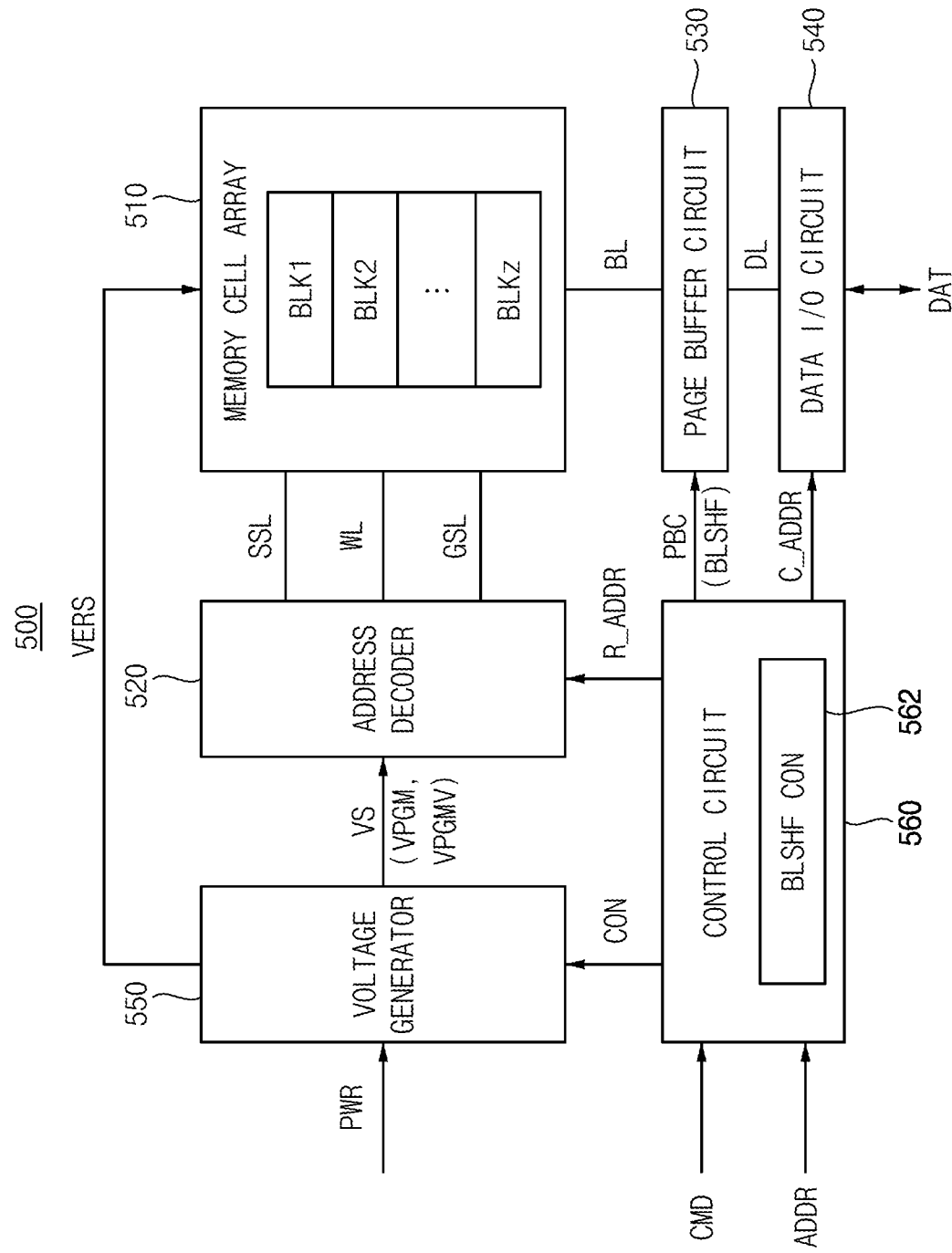
FIG. 2 is a block diagram illustrating a nonvolatile memory device according to example embodiments.

FIG. 2 is a block diagram illustrating a nonvolatile memory device according to example embodiments.

Referring to FIG. 2, a nonvolatile memory device 500 includes a memory cell array 510, a page buffer circuit 530 and a control circuit 560. The nonvolatile memory device 500 may further include an address decoder 520, a data input/output (I/O) circuit 540 and a voltage generator 550.

The memory cell array 510 is connected to the address decoder 520 via a plurality of string selection lines SSL, a plurality of wordlines WL and a plurality of ground selection lines GSL. The memory cell array 510 is further connected to the page buffer circuit 530 via a plurality of bitlines BL.

The memory cell array 510 may include a plurality of memory cells (e.g., a plurality of nonvolatile memory cells) that are connected to the plurality of wordlines WL and the plurality of bitlines BL. The memory cell array 510 may be divided into a plurality of memory blocks BLK1, BLK2, . . . , BLKz each of which includes memory cells. In addition, each of the plurality of memory blocks BLK1 to BLKz may be divided into a plurality of pages.

In some example embodiments, as will be described with reference to FIGS. 3 and 4, the memory cell array 510 may be a three-dimensional (3D) memory cell array, which is formed on a substrate in a three-dimensional structure (or a vertical structure). In this example, the memory cell array 510 may include a plurality of cell strings (e.g., a plurality of vertical NAND strings) that are vertically oriented such that at least one memory cell is located over another memory cell.

The control circuit 560 receives a command CMD and an address ADDR from external to the nonvolatile memory device 500 (e.g., from a memory controller 20 in FIG. 32), and controls erasure, programming and/or read operations of the nonvolatile memory device 500 based on the command CMD and the address ADDR. An erasure operation may include performing a sequence of erase loops, and a programming operation may include performing a sequence of program loops. Each program loop may include a program operation and a program verification operation. Each erase loop may include an erase operation and an erase verification operation. The read operation may include a normal read operation and a data recovery read operation.

For example, the control circuit 560 may generate control signals CON, which are used for controlling the voltage generator 550, and may generate control signals PBC for controlling the page buffer circuit 530, based on the command CMD, and may generate a row address R_ADDR and a column address C_ADDR based on the address ADDR. For example, the control signals PBC may include a bitline shut-off signal BLSHF. The control circuit 560 may provide the row address R_ADDR to the address decoder 520 and may provide the column address C_ADDR to the data I/O circuit 540.

The control circuit 560 may control the address decoder 520, the page buffer circuit 530, the data I/O circuit 540 and the voltage generator 550 such that the nonvolatile memory device 500 performs the method of programming data according to example embodiments described with reference to FIG. 1. For example, the control circuit 560 may control the program operation based on the multi-pulse program scheme, and may control a delay of the bitline shut-off signal BLSHF to be different for each program pulse and/or each program loop. For example, the control circuit 560 may include a bitline shut-off signal controller (CON) 562 that controls or adjusts the delay of the bitline shut-off signal BLSHF. In addition, the control circuit 560 may control the address decoder 520, the page buffer circuit 530, the data I/O circuit 540 and the voltage generator 550 such that the nonvolatile memory device 500 performs methods of programming data according to example embodiments, which will be described with reference to FIGS. 15, 22, 28 and 30.

The address decoder 520 may be connected to the memory cell array 510 via the plurality of string selection lines SSL, the plurality of wordlines WL and the plurality of ground selection lines GSL. For example, in the data erase/write/read operations, the address decoder 520 may determine at least one of the plurality of wordlines WL as a selected wordline, may determine at least one of the plurality of string selection lines SSL as a selected string selection line, and may determine at least one of the plurality of ground selection lines GSL as a selected ground selection line, based on the row address R_ADDR.

The voltage generator 550 may generate voltages VS that are required for an operation of the nonvolatile memory device 500 based on a power PWR and the control signals CON. The voltages VS may be applied to the plurality of string selection lines SSL, the plurality of wordlines WL and/or the plurality of ground selection lines GSL via the address decoder 520. For example, the voltages VS may include a program voltage VPGM and a program verification voltage VPGMV required for the program loop, etc. In addition, the voltage generator 550 may generate an erase voltage VERS that is required for the data erase operation based on the power PWR and the control signals CON. The erase voltage VERS may be applied to the memory cell array 510 directly or via the bitline BL.

For example, during the program operation, the voltage generator 550 may apply the program voltage VPGM to the selected wordline and may apply a program pass voltage to unselected wordlines via the address decoder 520. In addition, during the program verification operation, the voltage generator 550 may apply the program verification voltage VPGMV to the selected wordline and may apply a verification pass voltage to the unselected wordlines via the address decoder 520.

The page buffer circuit 530 may be connected to the memory cell array 510 via the plurality of bitlines BL. The page buffer circuit 530 may include a plurality of page buffers (e.g., page buffers PB1 to PBm in FIG. 5A). The page buffer circuit 530 may store data DAT to be programmed into the memory cell array 510 or may read data DAT sensed from the memory cell array 510. In other words, the page buffer circuit 530 may operate as a write driver or a sensing amplifier according to an operation mode of the nonvolatile memory device 500.

The data I/O circuit 540 may be connected to the page buffer circuit 530 via data lines DL. The data I/O circuit 540 may provide the data DAT from outside of or external to the nonvolatile memory device 500 (e.g., from the memory controller 20 in FIG. 32) to the memory cell array 510 via the page buffer circuit 530 or may provide the data DAT from the memory cell array 510 to the outside of the nonvolatile memory device 500 (e.g., to the memory controller 20 in FIG. 32), based on the column address C_ADDR.

Figure 3:
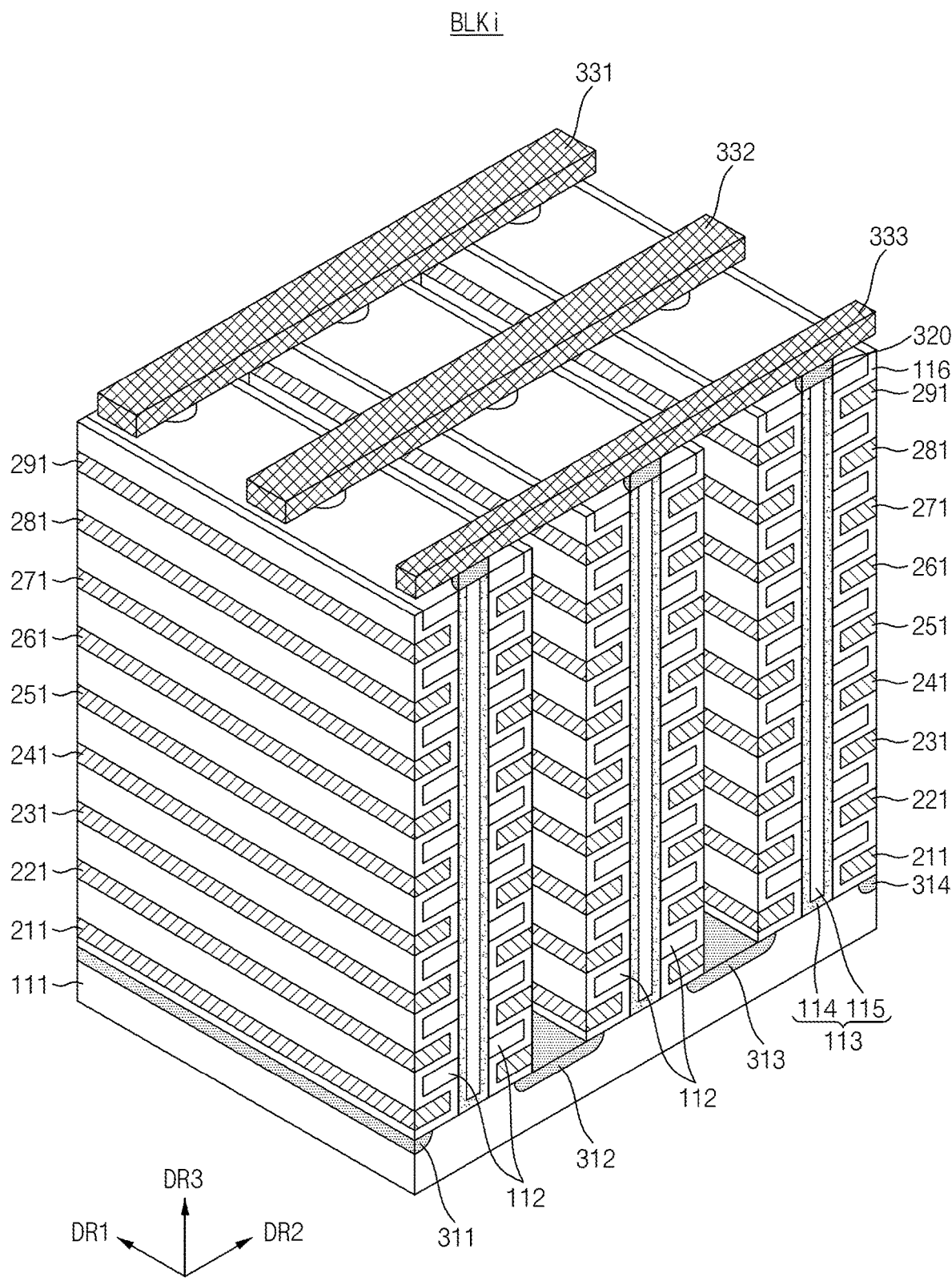
FIG. 3 is a perspective view of an example of a memory block included in a memory cell array in a nonvolatile memory device of FIG. 2.

FIG. 3 is a perspective view of an example of a memory block included in a memory cell array in a nonvolatile memory device of FIG. 2.

Referring to FIG. 3, a memory block BLKi includes a plurality of cell strings (e.g., a plurality of vertical NAND strings) which are formed on a substrate in a three-dimensional structure (or a vertical structure). The memory block BLKi includes structures extending along first, second and third directions DR1, DR2 and DR3. Two directions substantially parallel to a first surface (e.g., a top surface) of a substrate 111 and crossing each other are referred to as the first direction DR1 (e.g., a X-axis direction) and the second direction DR2 (e.g., a Y-axis direction). In addition, a direction substantially vertical to the first surface of the substrate 111 is referred to as the third direction DR3 (e.g., a Z-axis direction). For example, the first and second directions DR1 and DR2 may be substantially perpendicular to each other. In addition, the third direction DR3 may be substantially perpendicular to both the first and second directions DR1 and DR2.

The substrate 111 is provided. For example, the substrate 111 may have a well of a first type of charge carrier impurity (e.g., a first conductivity type) therein. For example, the substrate 111 may have a p-well formed by implanting a group 3 element such as boron (B). In particular, the substrate 111 may have a pocket p-well provided within an n-well. In some embodiments, the substrate 111 has a p-type well (or a p-type pocket well). However, the conductive type of the substrate 111 is not limited to p-type.

A plurality of doping regions 311, 312, 313 and 314 arranged along the second direction DR2 are provided in/on the substrate 111. These plurality of doping regions 311 to 314 may have a second type of charge carrier impurity (e.g., a second conductivity type) different from the first type of the substrate 111. In some embodiments, the first to fourth doping regions 311 to 314 may be an n-type. However, the conductive type of the first to fourth doping regions 311 to 314 is not limited to n-type.

A plurality of insulation materials 112 extending along the first direction DR1 are sequentially provided along the third direction DR3 on a region of the substrate 111 between the first and second doping regions 311 and 312. For example, the plurality of insulation materials 112 are provided along the third direction DR3, being spaced apart by a specific distance. For example, the insulation materials 112 may include an insulation material such as an oxide layer.

A plurality of pillars 113 penetrating the insulation materials along the third direction DR3 are sequentially disposed along the first direction DR1 on a region of the substrate 111 between the first and second doping regions 311 and 312. For example, the plurality of pillars 113 may penetrate the insulation materials 112 to contact the substrate 111.

In some example embodiments, each pillar 113 includes a plurality of materials. For example, a channel layer 114 of each pillar 113 may include a silicon material having a first conductivity type. For example, the channel layer 114 of each pillar 113 may include a silicon material having the same conductivity type as the substrate 111. In some embodiments, the channel layer 114 of each pillar 113 includes p-type silicon. However, the channel layer 114 of each pillar 113 is not limited to the p-type silicon.

An internal material 115 of each pillar 113 includes an insulation material. For example, the internal material 115 of each pillar 113 may include an insulation material such as a silicon oxide. In an example, the internal material 115 of each pillar 113 includes an air gap. The term 'air' as discussed herein, may refer to atmospheric air, or other gases that may be present during the manufacturing process.

An insulation layer 116 is provided along the exposed surfaces of the insulation materials 112, the pillars 113, and the substrate 111, on a region between the first and second doping regions 311 and 312. For example, the insulation layer 116 provided on surfaces of the insulation material 112 may be interposed between pillars 113 and a plurality of stacked first conductive materials 211, 221, 231, 241, 251, 261, 271, 281 and 291, as illustrated. In some examples, the insulation layer 116 need not be provided between the first conductive materials 211 to 291 corresponding to ground selection lines GSL (e.g., 211) and string selection lines SSL (e.g., 291). In this example, the ground selection lines GSL are the lowermost ones of the stack of first conductive materials 211 to 291 and the string selection lines SSL are the uppermost ones of the stack of first conductive materials 211 to 291.

The plurality of first conductive materials 211 to 291 are provided on surfaces of the insulation layer 116, in a region between the first and second doping regions 311 and 312.

For example, the first conductive material 211 extending along the first direction DR1 is provided between the insulation material 112 adjacent to the substrate 111 and the substrate 111. In more detail, the first conductive material 211 extending along the first direction DR1 is provided between the insulation layer 116 at the bottom of the insulation material 112 adjacent to the substrate 111 and the substrate 111.

A first conductive material extending along the first direction DR1 is provided between the insulation layer 116 at the top of the specific insulation material among the insulation materials 112 and the insulation layer 116 at the bottom of a specific insulation material among the insulation materials 112. For example, a plurality of first conductive materials 221 to 281 extending along the first direction DR1 are provided between the insulation materials 112 and it may be understood that the insulation layer 116 is provided between the insulation materials 112 and the first conductive materials 221 to 281. The first conductive materials 211 to 291 may be formed of a conductive metal, but the first conductive materials 211 to 291 may include a conductive material such as a polysilicon in some embodiments.

The same structures as those on the first and second doping regions 311 and 312 may be provided in a region between the second and third doping regions 312 and 313. In the region between the second and third doping regions 312 and 313, a plurality of insulation materials 112 are provided, which extend along the first direction DR1. A plurality of pillars 113 are provided that are disposed sequentially along the first direction DR1 and penetrate the plurality of insulation materials 112 along the third direction DR3. An insulation layer 116 is provided on the exposed surfaces of the plurality of insulation materials 112 and the plurality of pillars 113, and a plurality of first conductive materials 211 to 291 extend along the first direction DR1. Similarly, the same structures as those on the first and second doping regions 311 and 312 may be provided in a region between the third and fourth doping regions 313 and 314.

A plurality of drain regions 320 are provided on the plurality of pillars 113, respectively. The drain regions 320 may include silicon materials doped with a second type of charge carrier impurity. For example, the drain regions 320 may include silicon materials doped with an n-type dopant. In some embodiments, the drain regions 320 include n-type silicon materials. However, the drain regions 320 are not limited to n-type silicon materials.

On the drain regions, a plurality of second conductive materials 331, 332 and 333 are provided, which extend along the second direction DR2. The second conductive materials 331 to 333 are disposed along the first direction DR1, being spaced apart from each other by a specific distance. The second conductive materials 331 to 333 are respectively connected to the drain regions 320 in a corresponding region. The drain regions 320 and the second conductive material 333 extending along the second direction DR2 may be connected through each contact plug. Each contact plug may be, for example, a conductive plug formed of a conductive material such as a metal. The second conductive materials 331 to 333 may include metal materials. The second conductive materials 331 to 333 may include conductive materials such as a polysilicon.

In the example of FIG. 3, the first conductive materials 211 to 291 may be used to form the wordlines WL, the string selection lines SSL and the ground selection lines GSL. For example, the first conductive materials 221 to 281 may be used to form the wordlines WL, where conductive materials belonging to the same layer may be interconnected. The second conductive materials 331 to 333 may be used to form the bitlines BL. The number of layers of the first conductive materials 211 to 291 may be variously determined according to process and control techniques.

Figure 4:
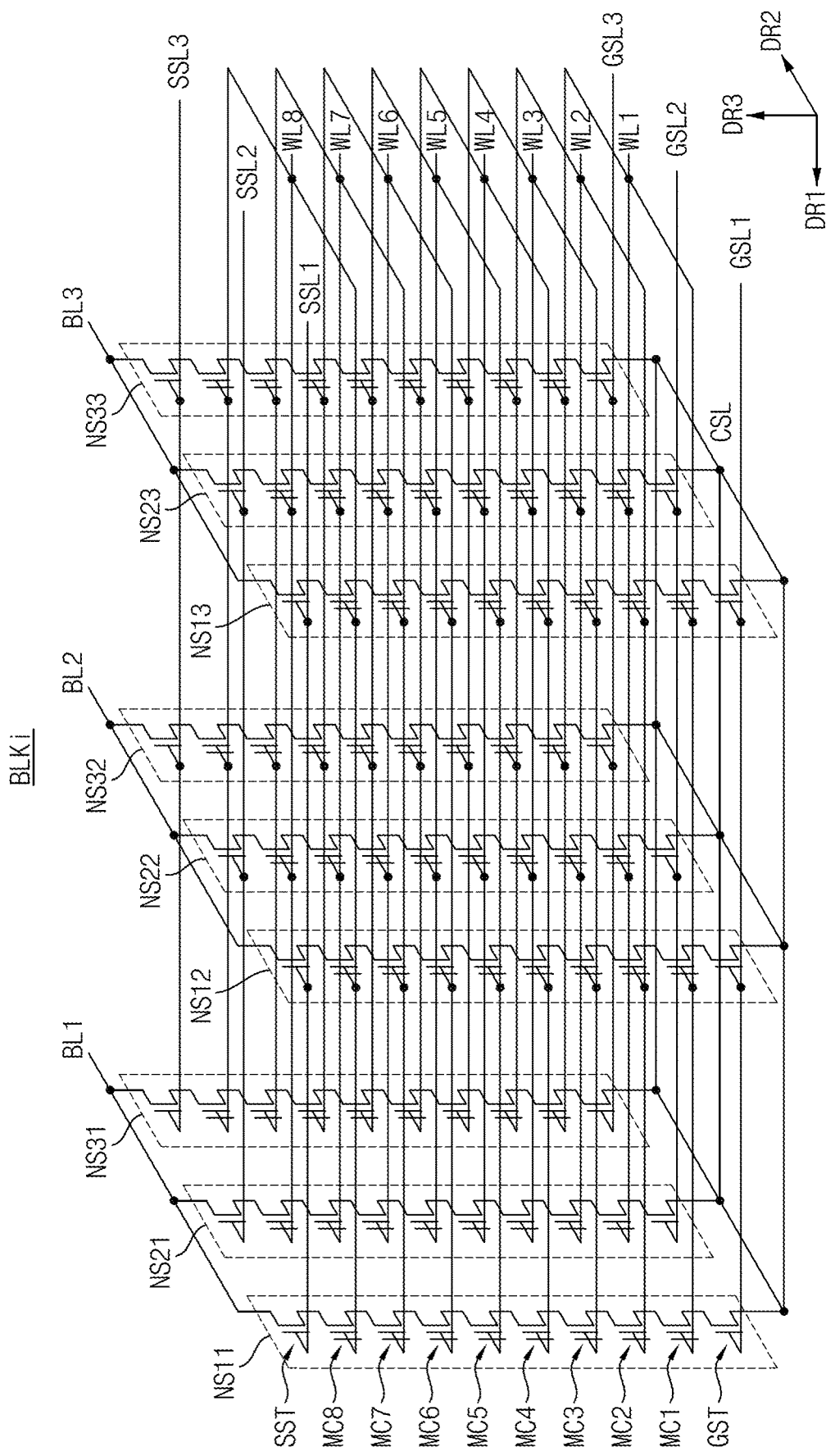
FIG. 4 is a circuit diagram illustrating an equivalent circuit of a memory block described with reference to FIG. 3.

FIG. 4 is a circuit diagram illustrating an equivalent circuit of a memory block described with reference to FIG. 3.

A memory block BLKi of FIG. 4 may be formed on a substrate in a three-dimensional structure (or a vertical structure). For example, a plurality of cell strings included in the memory block BLKi may be formed in a direction perpendicular to the substrate.

Referring to FIG. 4, the memory block BLKi may include a plurality of cell strings NS11, NS12, NS13, NS21, NS22, NS23, NS31, NS32 and NS33 connected between bitlines BL1, BL2 and BL3 and a common source line CSL. Each of the cell strings NS11 to NS33 may include a string selection transistor SST, a plurality of memory cells MC1, MC2, MC3, MC4, MC5, MC6, MC7 and MC8, and a ground selection transistor GST. For example, the bitlines BL1 to BL3 may correspond to the second conductive materials 331 to 333 in FIG. 3, and the common source line CSL may be formed by interconnecting the first to fourth doping regions 311 to 314 in FIG. 3.

Each string selection transistor SST may be connected to a corresponding string selection line (one of SSL1, SSL2 and SSL3). The plurality of memory cells MC1 to MC8 may be connected to corresponding wordlines WL1, WL2, WL3, WL4, WL5, WL6, WL7 and WL8, respectively. Each ground selection transistor GST may be connected to a corresponding ground selection line (one of GSL1, GSL2 and GSL3). Each string selection transistor SST may be connected to a corresponding bitline (e.g., one of BL1 to BL3), and each ground selection transistor GST may be connected to the common source line CSL. In the example of FIG. 4, some of the string selection transistors SST are connected to the same bitline (e.g., one of BL1 to BL3) to connect corresponding cell strings to the same bitline via appropriate selection via selection voltages applied to the appropriate sting selection lines SSL1 to SSL3 and ground selection lines GSL1 to GSL3.

The cell strings connected in common to one bitline may form one column, and the cell strings connected to one string selection line may form one row. For example, the cell strings NS11, NS21 and NS31 connected to the first bitline BL1 may correspond to a first column, and the cell strings NS11, NS12 and NS13 connected to the first string selection line SSL1 may form a first row.

Wordlines (e.g., WL1) having the same height may be commonly connected, and the ground selection lines GSL1 to GSL3 and the string selection lines SSL1 to SSL3 may be separated. Memory cells located at the same semiconductor layer share a wordline. Cell strings in the same row share a string selection line. The common source line CSL is connected in common to all of the cell strings.

In FIG. 4, the memory block BLKi is illustrated to be connected to eight wordlines WL1 to WL8 and three bitlines BL1 to BL3, and each of the cell strings NS11 to NS33 is illustrated to include eight memory cells MC1 to MC8. However, example embodiments are not limited thereto. In some example embodiments, each memory block may be connected to any number of wordlines and bitlines, and each cell string may include any number of memory cells.

A three-dimensional vertical array structure may include vertical NAND strings that are vertically oriented such that at least one memory cell is located over another memory cell. The at least one memory cell may comprise a charge trap layer. The following patent documents, which are hereby incorporated by reference in their entirety, describe suitable configurations for a memory cell array including a 3D vertical array structure, in which the three-dimensional memory array is configured as a plurality of levels, with wordlines and/or bitlines shared between levels: U.S. Pat. Nos. 7,679,133; 8,553,466; 8,654,587; 8,559,235; and US Pat. Pub. No. 2011/0233648.

Although the memory cell array included in the nonvolatile memory device according to example embodiments is described based on a NAND flash memory device, the nonvolatile memory device according to example embodiments may be any nonvolatile memory device, e.g., a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), etc.

Figure 5A:
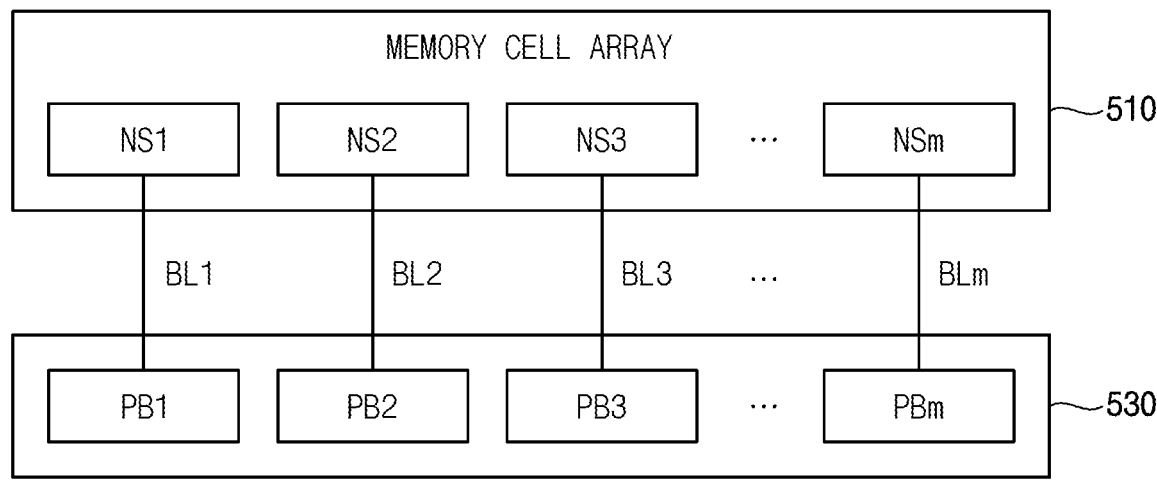
FIGS. 5A and 5B are diagrams illustrating an example of a memory cell array and an example of a page buffer circuit included in a nonvolatile memory device of FIG. 2.
Figure 5B:
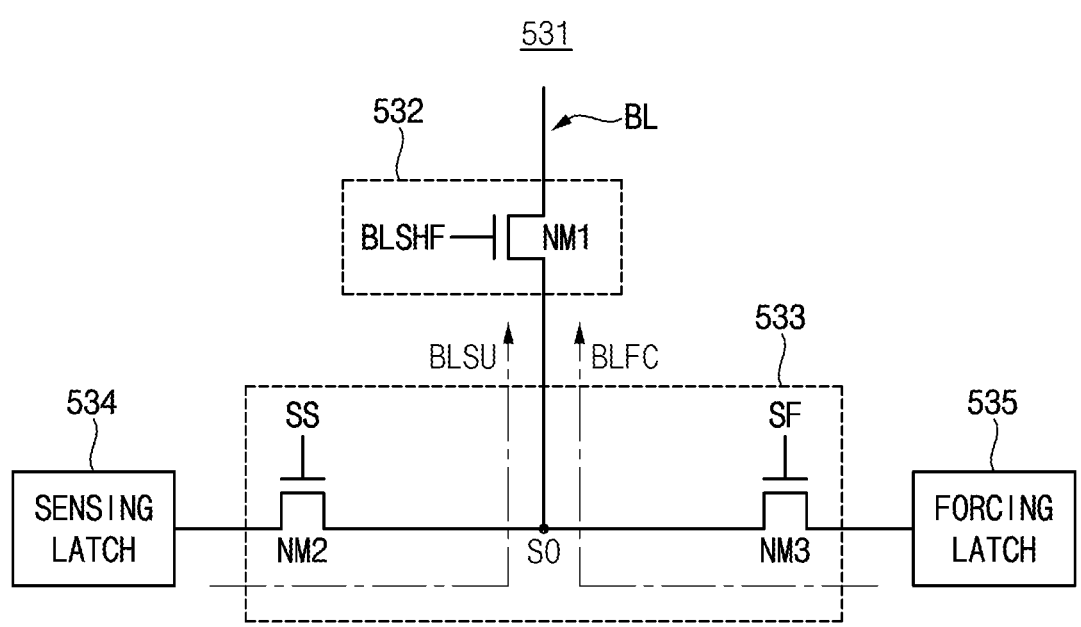

FIGS. 5A and 5B are diagrams illustrating an example of a memory cell array and an example of a page buffer circuit included in a nonvolatile memory device of FIG. 2.

Referring to FIG. 5A, the memory cell array 510 may include a plurality of cell strings NS1, NS2, NS3, . . . , NSm, and the page buffer circuit 530 may include a plurality of page buffers PB1, PB2, PB3, . . . , PBm, where m is a natural number or positive integer greater than or equal to two.

The plurality of cell strings NS1 to NSm may extend in a direction perpendicular to a substrate, and may correspond to the cell strings NS11 to NS33 in FIG. 4. The plurality of cell strings NS1 to NSm may be connected to the plurality of page buffers PB1 to PBm, respectively, through a plurality of bitlines BL1, BL2, BL3, . . . , BLm, respectively. The page buffers PB1 to PBm may control the cell strings NS1 to NSm and memory cells included therein.

For convenience of illustration, FIG. 5A illustrates an example where one page buffer is connected to one cell string, but example embodiments are not limited thereto. For example, two or more cell strings may be connected to one page buffer through one bitline, and one page buffer may control two or more cell strings.

Referring to FIG. 5B, a page buffer 531 may include a bitline selection circuit 532, a switching circuit 533, a sensing latch 534 and a forcing latch 535. Although not illustrated in detail, the page buffer 531 may further include a data latch (e.g., an upper bit latch or a lower bit latch), a cache latch, and/or a precharge circuit, etc. For example, the page buffer 531 may be one of the page buffers PB1 to PBm in FIG. 5A.

The bitline selection circuit 532 may be disposed between a bitline BL and a sensing node SO, and may be selectively connected to the bitline BL based on the bitline shut-off signal BLSHF. The bitline selection circuit 532 may include a bitline shut-off transistor NM1 that is driven based on the bitline shut-off signal BLSHF. The control circuit 560 may control the bitline shut-off signal BLSHF for each of the program operation, the read operation and the erase operation.

When the bitline shut-off signal BLSHF has an enable level or enable voltage (e.g., a logic low level), the bitline shut-off transistor NM1 may be turned on, the bitline BL and the page buffer 531 may be electrically connected to each other, and thus the bitline BL and the sensing node SO may be electrically connected to each other. For example, the enable level or enable voltage may correspond to a bitline setup level or voltage (e.g., V_BS in FIG. 7) or a bitline forcing level or voltage (e.g., V_BF in FIG. 7). When the bitline shut-off signal BLSHF has a disable level or disable voltage (e.g., a logic low level), the bitline shut-off transistor NM1 may be turned off, the bitline BL and the page buffer 531 may not be electrically connected, and thus the bitline BL and the sensing node SO may not be electrically connected.

The switching circuit 533 may include a sensing transistor NM2 and a forcing transistor NM3. The sensing transistor NM2 may be disposed between the sensing node SO and the sensing latch 534, and may be driven by a sensing latch selection signal SS. For example, in a bitline setup interval (e.g., BLSETUP in FIG. 7), the control circuit 560 may control the sensing latch selection signal SS to have an enable level or enable voltage, the sensing transistor NM2 may be turned on based on the sensing latch selection signal SS, and thus the sensing latch 534 may be electrically connected to the bitline BL through the sensing node SO. The forcing transistor NM3 may be disposed between the sensing node SO and the forcing latch 535, and may be driven by a forcing latch selection signal SF. For example, in a bitline forcing interval (e.g., WBF in FIG. 10), the control circuit 560 may control the forcing latch selection signal SF to have an enable level or enable voltage, the forcing transistor NM3 may be turned on based on the forcing latch selection signal SF, and thus the forcing latch 535 may be electrically connected to the bitline BL through the sensing node SO.

The sensing latch 534 may store bitline setup information BLSU, and may provide the bitline setup information BLSU to a selected cell string through the bitline BL in the bitline setup interval. For example, the bitline setup information BLSU may correspond to a program bitline voltage or a program inhibit voltage. As such, the sensing latch 534 may be used to apply the program bitline voltage or the program inhibit voltage to the bitline BL during the program operation. In addition, the sensing latch 534 may store data stored in a memory cell or a result of sensing a threshold voltage of the memory cell during the read operation or the program verification operation.

The forcing latch 535 may store bitline forcing information BLFC, and may provide the bitline forcing information BLFC to the selected cell string through the bitline BL in the bitline forcing interval. For example, the bitline forcing information BLFC may correspond to forcing data or force data. The force data may be initially set to '1' and then reversed to '0' when the threshold voltage of the memory cell enters a forcing region that is less than a target region. The force data may be used to control the bitline voltage during the program operation and to form a narrower program threshold voltage distribution. As such, the forcing latch 535 may be used to improve the threshold voltage distribution during the program operation.

Figure 6A:
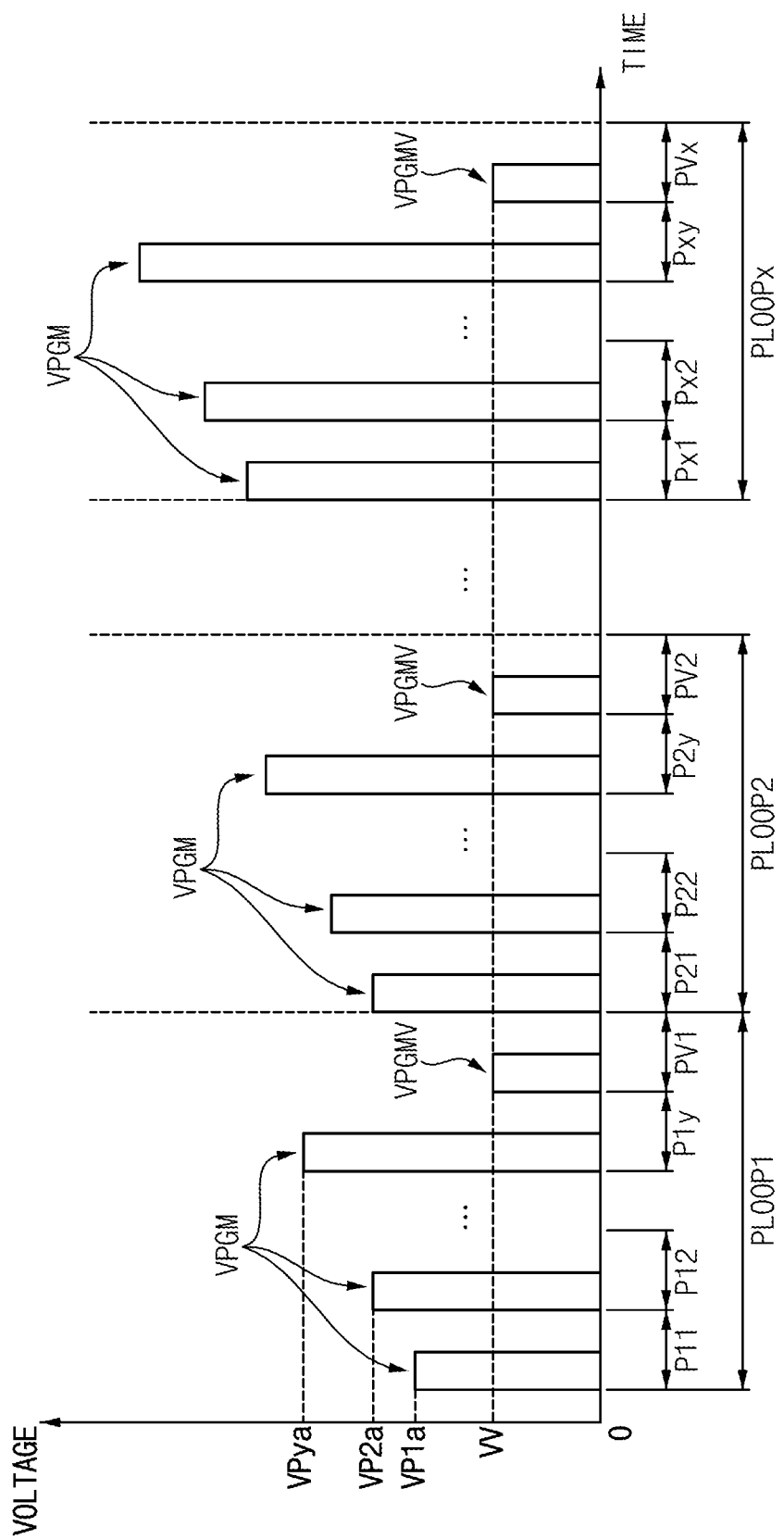
FIGS. 6A, 6B and 7 are diagrams for describing operations of a nonvolatile memory device according to example embodiments.
Figure 6B:
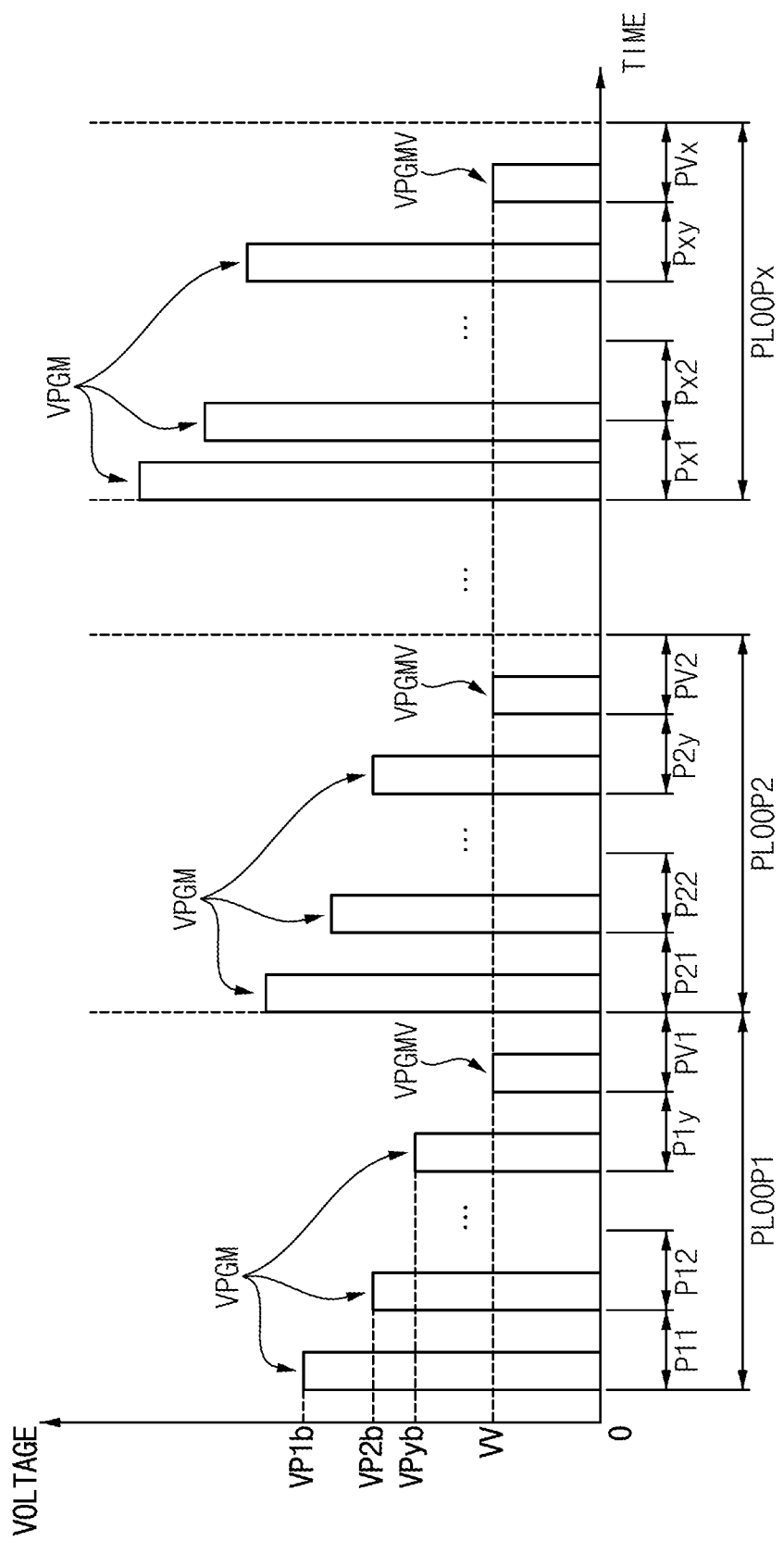
Figure 7:
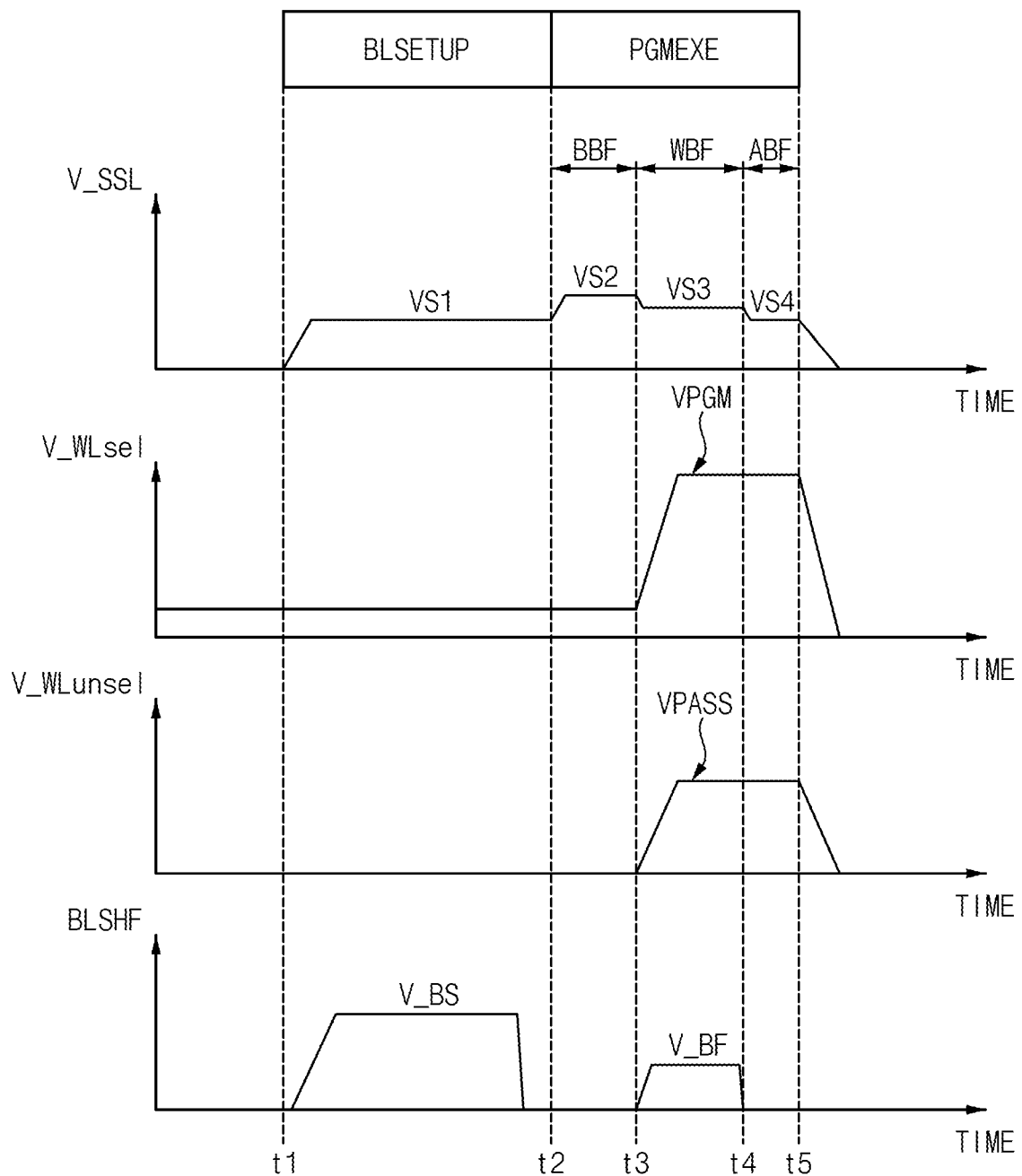

FIGS. 6A, 6B and 7 are diagrams for describing an operation of a nonvolatile memory device according to example embodiments.

Referring to FIG. 6A, an example of the multi-pulse program scheme is illustrated.

For example, a plurality of program loops PLOOP1, PLOOP2, . . . , PLOOPx may be sequentially performed, where x is a natural number or positive integer greater than or equal to two. The program loops PLOOP1 to PLOOPx may include program intervals P11, P12, . . . , P1y, P21, P22, . . . , P2y, Px1, Px2, . . . , Pxy, and program verification intervals PV1, PV2, . . . , PVx, where y is a natural number or positive integer greater than or equal to two. In each of the program intervals P11 to P1y, P21 to P2y, and Px1 to Pxy, the program operation may be performed using the program voltage VPGM. In each of the program verification intervals PV1 to PVx, the program verification operation may be performed using the program verification voltage VPGMV. In addition, in one program loop, two or more program operations may be sequentially performed, and one program verification operation may be performed.

In some example embodiments, the multi-pulse program scheme may be implemented based on a low-to-high (L2H) scheme in which the voltage or level of the program voltage PGM increases as the program operations are repeated during one program loop. For example, while the first program loop PLOOP1 is being performed, a voltage or level VP2a of the program voltage VPGM in the second program interval P12 may be higher than a voltage or level VP1a of the program voltage VPGM in the first program interval P11, and a voltage or level VPya of the program voltage VPGM in the y-th program interval P1y may be higher than the voltage or level VP2a of the program voltage VPGM in the second program interval P12.

In some example embodiments, the multi-pulse program scheme may be implemented based on an incremental step pulse program (ISPP) scheme in which the voltage or level of the program voltage PGM increases as the program loops are repeated. For example, voltages or levels of the program voltage VPGM in the program intervals P21 to P2y of the second program loop PLOOP2 may be higher than the voltages or levels VP1a to VPya of the program voltage VPGM in the program intervals P11 to P1y of the first program loop PLOOP1, respectively, and voltages or levels of the program voltage VPGM in the program intervals Px1 to Pxy of the x-th program loop PLOOPx may be higher than the voltages or levels of the program voltage VPGM in the program intervals P21 to P2y of the second program loop PLOOP2, respectively. For example, the program verification voltage VPGMV may maintain a constant voltage or level VV even if the program loops are repeated.

In some example embodiments, when a program operation and a program verification operation in a specific program loop are successfully completed, subsequent program loops may not be performed, and the programming procedure or process may be terminated.

Referring to FIG. 6B, an example of the multi-pulse program scheme is illustrated. The descriptions repeated with FIG. 6A will be omitted for brevity.

In some example embodiments, the multi-pulse program scheme may be implemented based on a high-to-low (H2L) scheme in which the voltage or level of the program voltage PGM decreases as the program operations are repeated during one program loop. For example, while the first program loop PLOOP1 is being performed, a voltage or level VP2b of the program voltage VPGM in the second program interval P12 may be lower than a voltage or level VP1b of the program voltage VPGM in the first program interval P11, and a voltage or level VPyb of the program voltage VPGM in the y-h program interval P1y may be lower than the voltage or level VP2b of the program voltage VPGM in the second program interval P12.

Although FIGS. 6A and 6B illustrate the examples where the program verification voltage VPGMV always maintains the constant level VV, but example embodiments are not limited thereto, and the level or voltage of the program verification voltage VPGMV may be changed during one program verification interval and/or as the program loops are repeated. In some example embodiments, as the program operations are repeated during one program loop and/or as the program loops are repeated, the amount of change in the level or voltage of the program voltage VPGM may be fixed or changed.

Referring to FIG. 7, an example of the program operation for the target memory cell during one program interval is illustrated. In FIG. 7, 'V_WLsel' represents a voltage or level change in a voltage of the selected wordline connected to the target memory cell, 'V_SSL' represents a voltage or level change in a voltage of a selected string selection line connected to a target string selection transistor connected to the target memory cell, 'BLSHF' represents a voltage or level change of the bitline shut-off signal applied to the page buffer controlling the target memory cell, and 'V_WLunsel' represents a voltage or level change in a voltage of an unselected wordline connected to a non-target memory cell other than the target memory cell.

A bitline setup interval BLSETUP may be a time interval from time point t1 to time point t2. The bitline setup interval BLSETUP may be defined as a time interval during which the bitline shut-off signal BLSHF has a bitline setup voltage or bitline setup level V_BS and a time interval during which a bitline setup operation (and/or an initial precharge operation) is performed. In the bitline setup interval BLSETUP, the voltage V_SSL of the selected string selection line may increase to a first voltage or first level VS1.

In a program execution interval PGMEXE, the voltage V_WLsel of the selected wordline may correspond to the program voltage VPGM, and the voltage V_WLunsel of the unselected wordline may correspond to a program pass voltage VPASS. The program execution interval PGMEXE may be divided into a first interval BBF from time point t2 to time point t3, a second interval WBF from time point t3 to time point t4, and a third interval ABF from time point t4 to time point t5.

The second interval WBF may be defined as a time interval during which the bitline shut-off signal BLSHF has a bitline forcing voltage or bitline forcing level V_BF. The second interval WBF may be referred to as an interval while bitline forcing or a bitline forcing interval. In the second interval WBF, the voltage applied to the bitline BL may be changed depending on the value (e.g., forcing information) stored in the forcing latch 535 during the program operation. The first interval BBF may correspond to an interval before bitline forcing in the program execution interval PGMEXE, and the third interval ABF may correspond to an interval after bitline forcing in the program execution interval PGMEXE.

In some example embodiments, in the program execution interval PGMEXE, the voltage V_SSL of the selected string selection line may be controlled for each of the first to third intervals BBF, WBF and ABF. For example, the voltage V_SSL of the selected string selection line may be controlled to have a second voltage or second level VS2 in the first interval BBF, may be controlled to have a third voltage or third level VS3 in the second interval WBF, and may be controlled to have a fourth voltage or fourth level VS4 in the third interval ABF. For example, at least two of the second to fourth voltages or second to fourth levels VS2, VS3, and VS4 may be different from each other.

In some example embodiments, the delay of the bitline shut-off signal BLSHF may correspond to a time interval during which the bitline shut-off signal BLSHF maintains the ground level or ground voltage after the program execution interval PGMEXE starts. For example, the delay of the bitline shut-off signal BLSHF may correspond to a time interval from time point t2 at which the program execution interval PGMEXE starts to time point t3 at which the voltage or level of the bitline shut-off signal BLSHF starts to increase. In the method of programming data in the nonvolatile memory device according to example embodiments, the delay of the bitline shut-off signal BLSHF in the program execution interval PGMEXE, e.g., the time point at which the voltage or level of the bitline shut-off signal BLSHF starts to increase, may be controlled for each program pulse and/or for each program loop.

FIG. 8 is a flowchart illustrating an example of a method of programming data in a nonvolatile memory device of FIG. 1. FIGS. 9A and 9B are diagrams for describing an operation of FIG. 8.

Referring to FIGS. 8, 9A and 9B, the delay of the bitline shut-off signal may be changed or become different for each program pulse during one program loop. In addition, as the voltage or level of the program voltage increases, the delay of the bitline shut-off signal may increase.

In a first program interval of a first program loop, a program voltage having a first program voltage or first program level may be applied to a selected wordline connected to a target memory cell on which a program operation is performed (operation S110), and a bitline shut-off signal having a first delay may be applied to a page buffer connected to the target memory cell (operation S210). In a second program interval of the first program loop after the first program interval of the first program loop, the program voltage having a second program voltage or second program level different from the first program voltage or first program level may be applied to the selected wordline (operation S120), and the bitline shut-off signal having a second delay different from the first delay may be applied to the page buffer (operation S220). Operations S110 and S120 may be included in operation S100 of FIG. 1, and operations S210 and S220 may be included in operation S200 of FIG. 1.

In some example embodiments, in the L2H scheme described with reference to FIG. 6A, the second program level or voltage may be higher than the first program level or voltage, and the second delay may be longer than the first delay. For example, as illustrated in FIG. 9A, the program voltage VPGM may have a first program level VP11$a$ or voltage in a first program execution interval PGMEXE11 included in the first program interval, and the program voltage VPGM may have a second program level VP12$a$ or voltage higher than the first program level VP11$a$ or voltage in a second program execution interval PGMEXE12 included in the second program interval. In this example, the bitline shut-off signal BLSHF may have a first delay DY11$a$ from time point t21 to time point t31 in the first program execution interval PGMEXE11, the bitline shut-off signal BLSHF may have a second delay DY12$a$ from time point t22 to time point t62 in the second program execution interval PGMEXE12, and the second delay DY12$a$ may be longer than the first delay DY11$a$. For example, time points t21, t31, t41 and t51 may correspond to time points t2, t3, t4 and t5 in FIG. 7, respectively, and time points t22, t32, t42 and t52 may also correspond to time points t2, t3, t4 and t5 in FIG. 7, respectively.

In some example embodiments, in the H2L scheme described with reference to FIG. 6B, the second program level or voltage may be lower than the first program level or voltage, and the second delay may be shorter than the first delay. For example, as illustrated in FIG. 9B, the program voltage VPGM may have a first program level VP11$b$ or voltage in a first program execution interval PGMEXE11, and the program voltage VPGM may have a second program level VP12$b$ or voltage lower than the first program level VP11$b$ or voltage in a second program execution interval PGMEXE12. In this example, the bitline shut-off signal BLSHF may have a first delay DY11$b$ from time point t21 to time point t61 in the first program execution interval PGMEXE11, the bitline shut-off signal BLSHF may have a second delay DY12$b$ from time point t22 to time point t32 in the second program execution interval PGMEXE12, and the second delay DY12$b$ may be shorter than the first delay DY11$b$.

Figure 11A:
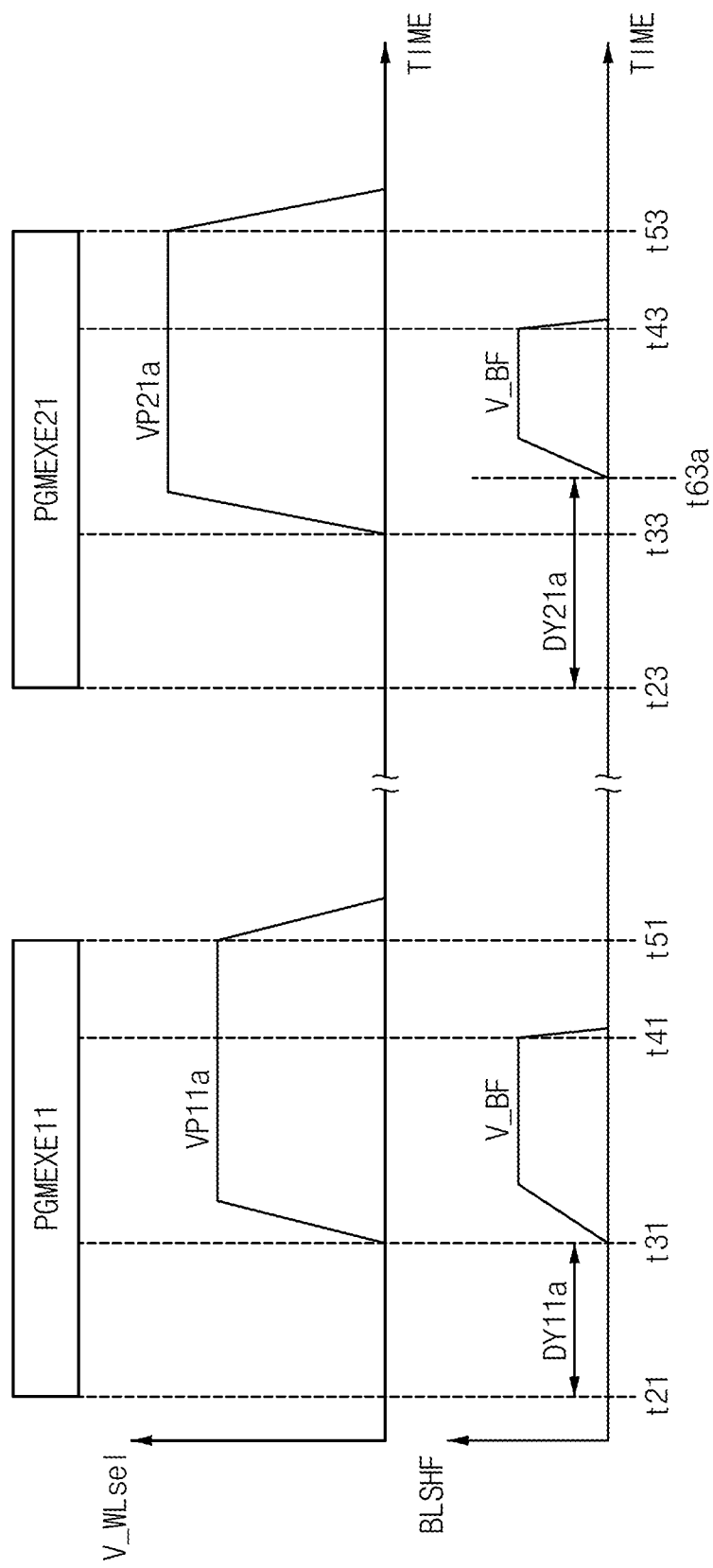
FIGS. 11A and 11B are diagrams for describing operations of FIG. 10.
Figure 11B:
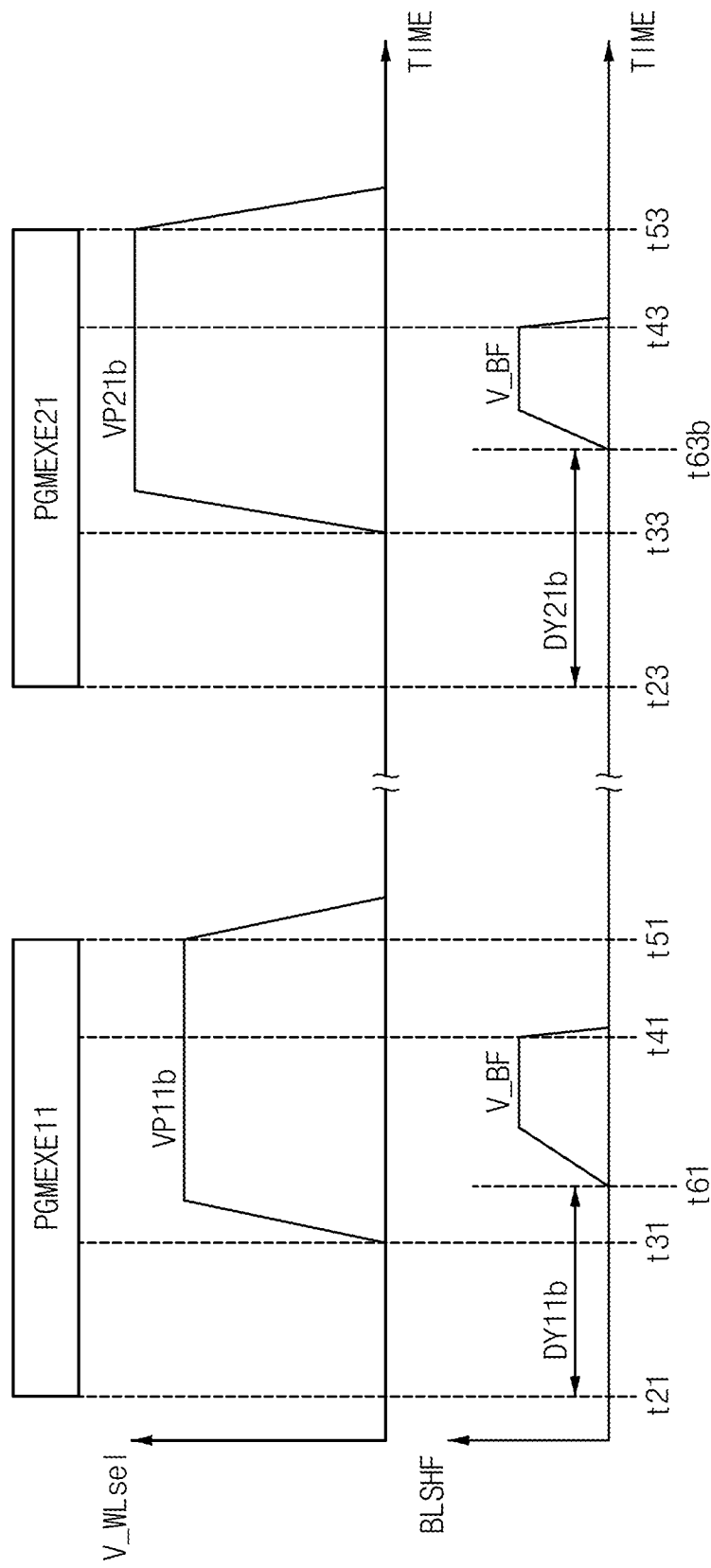

FIG. 10 is a flowchart illustrating an example of a method of programming data in a nonvolatile memory device of FIG. 1. FIGS. 11A and 11B are diagrams for describing an operation of FIG. 10. The descriptions repeated with FIGS. 8, 9A and 9B will be omitted for brevity.

Referring to FIGS. 10, 11A and 11B, as the program loops are repeatedly performed, the delay of the bitline shut-off signal may be changed or become different. In addition, as the level or voltage of the program voltage increases, the delay of the bitline shut-off signal may increase. For example, when the multi-pulse program scheme is implemented based on the ISPP scheme as described with reference to FIGS. 6A and 6B, the level or voltage of the program voltage may increase as the number of times of the program loops increases, and thus the delay of the bitline shut-off signal may increase as the number of times of the program loops increases.

Operations S110 and S210 in FIG. 10 may be substantially the same as those described with reference to FIG. 8. In a third program interval of a second program loop after the first program loop, the program voltage having a third program level or voltage higher than the first program level or voltage may be applied to the selected wordline (operation S130), and the bitline shut-off signal having a third delay longer than the first delay may be applied to the page buffer (operation S230). Operations S130 and S230 may be included in operations S100 and S200 of FIG. 1, respectively.

In some example embodiments, in the L2H scheme described with reference to FIG. 6A, the operations of FIG. 10 may be implemented as illustrated in FIG. 11A. For example, the operations in the first program execution interval PGMEXE11 of FIG. 11A may be substantially the same as those described with reference to FIG. 9A. In a third program execution interval PGMEXE21 included in the third program interval, the program voltage VPGM may have a third program level VP21$a$ or voltage higher than the first program level VP11$a$ or voltage, the bitline shut-off signal BLSHF may have a third delay DY21$a$ from time point t23 to time point t63$a$, and the third delay DY21$a$ may be longer than the first delay DY11$a$. For example, time points t23, t33, t43 and t53 may correspond to time points t2, t3, t4 and t5 in FIG. 7, respectively.

In some example embodiments, in the H2L scheme described with reference to FIG. 6B, the operations of FIG. 10 may be implemented as illustrated in FIG. 11B. For example, the operations in the first program execution interval PGMEXE11 of FIG. 11B may be substantially the same as those described with reference to FIG. 9B. In the third program execution interval PGMEXE21, the program voltage VPGM may have a third program level VP21$b$ or voltage higher than the first program level VP11$b$ or voltage, the bitline shut-off signal BLSHF may have a third delay DY21$b$ from time point t23 to time point t63$b$, and the third delay DY21$b$ may be longer than the first delay DY11$b$.

Figure 12:
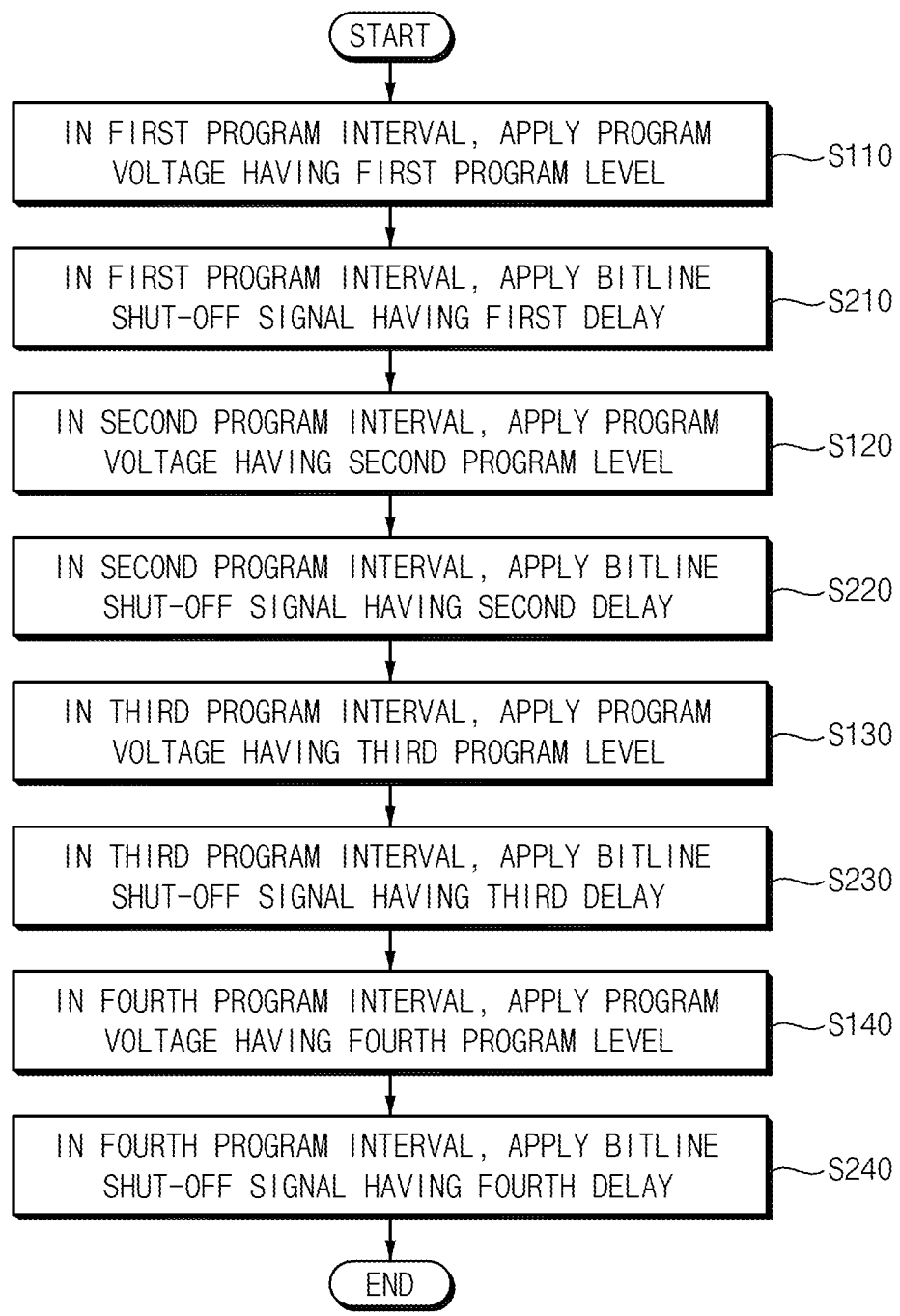
FIG. 12 is a flowchart illustrating an example of a method of programming data in a nonvolatile memory device of FIG. 1.
Figure 13A:
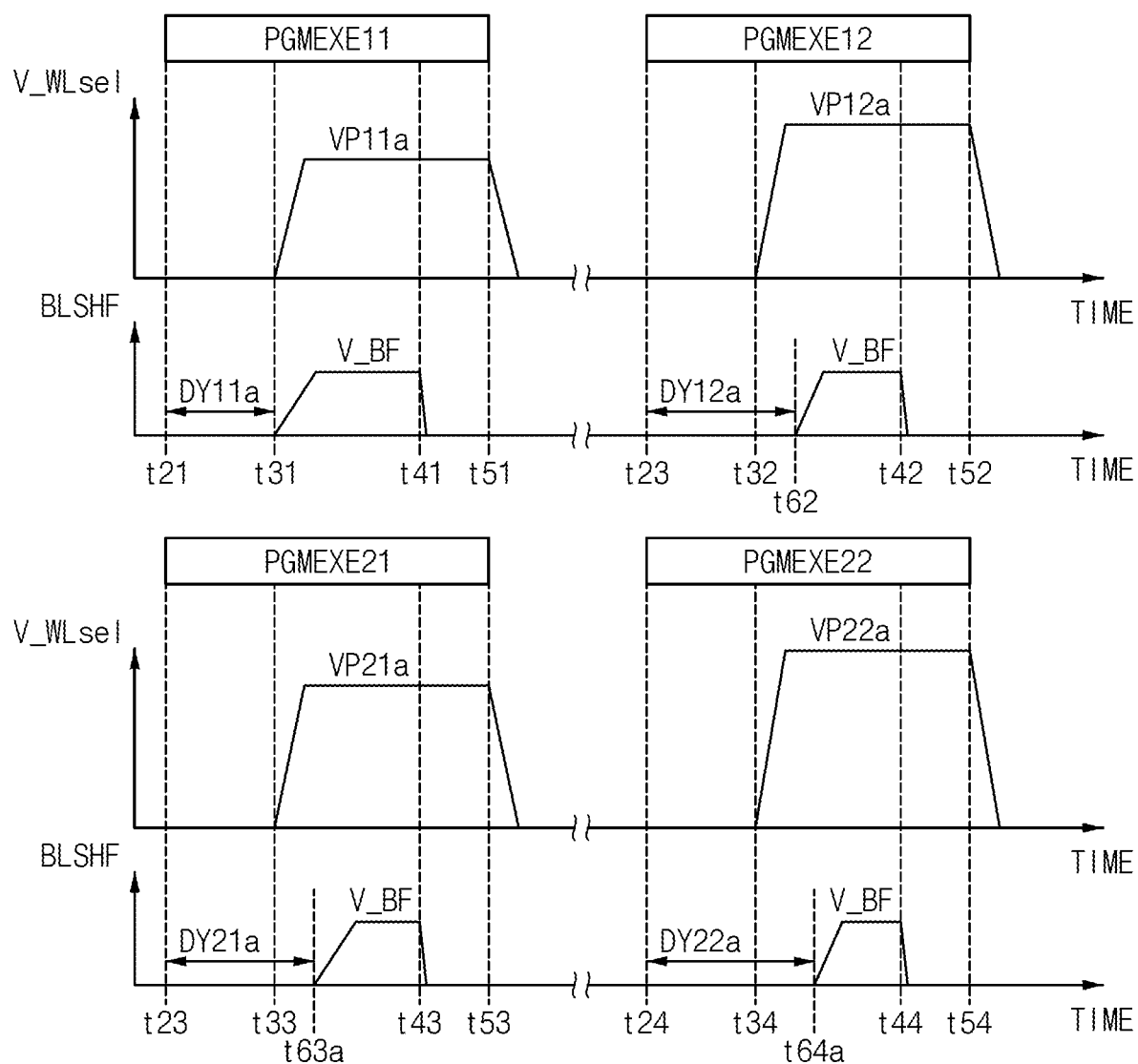
FIGS. 13A and 13B are diagrams for describing operations of FIG. 12.
Figure 13B:
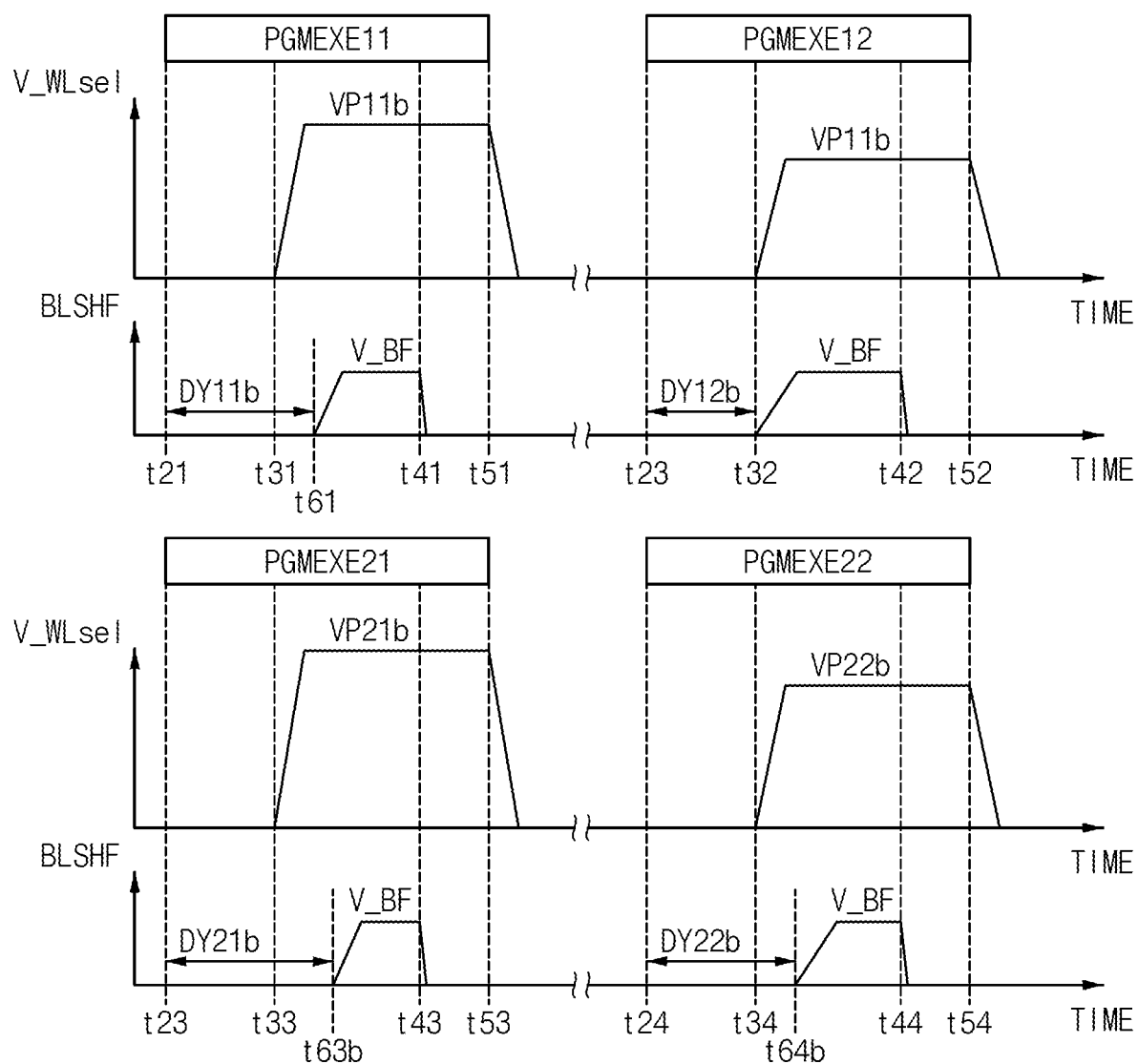

FIG. 12 is a flowchart illustrating an example of a method of programming data in a nonvolatile memory device of FIG. 1. FIGS. 13A and 13B are diagrams for describing an operation of FIG. 12. The descriptions repeated with FIGS. 8, 9A, 9B, 10, 11A and 11B will be omitted for brevity.

Referring to FIGS. 12, 13A and 13B, the delay of the bitline shut-off signal may be changed or become different for each program pulse during one program loop. In addition, as the program loops are repeatedly performed, the delay of the bitline shut-off signal may be changed or become different. Further, as the level or voltage of the program voltage increases, the delay of the bitline shut-off signal may increase. FIG. 12 illustrates that the example of FIG. 8 and the example of FIG. 10 are combined.

Operations S110, S210, S120, S220, S130 and S230 in FIG. 12 may be substantially the same as those described with reference to FIGS. 8 and 10. In a fourth program interval of the second program loop after the third program interval of the second program loop, the program voltage having a fourth program level or voltage, which is higher than the second program level or voltage and different from the third program level or voltage, to the selected wordline (operation S140), and the bitline shut-off signal having a fourth delay, which is longer than the second delay and different from the third delay, may be applied to the page buffer (operation S240). Operations S140 and S240 may be included in operations S100 and S200 of FIG. 1, respectively.

In some example embodiments, in the L2H scheme described with reference to FIG. 6A, the fourth program level or voltage may be higher than the third program level or voltage, the fourth delay may be longer than the third delay, and the operations of FIG. 12 may be implemented as illustrated in FIG. 13A. For example, the operations in the first, second and third program execution intervals PGMEXE11, PGMEXE12 and PGMEXE21 of FIG. 13A may be substantially the same as those described with reference to FIGS. 9A and 11A. For example, in a fourth program execution interval PGMEXE22 included in the fourth program interval, the program voltage VPGM may have a fourth program level VP22a or voltage higher than the third program level VP21a or voltage, the bitline shut-off signal BLSHF may have a fourth delay DY22a from time point t24 to time point t64a, and the fourth delay DY22a may be longer than the third delay DY21a. For example, time points t24, t34, t44 and t54 may correspond to time points t2, t3, t4 and t5 in FIG. 7, respectively.

In some example embodiments, in the H2L scheme described with reference to FIG. 6B, the fourth program level or voltage may be lower than the third program level or voltage, the fourth delay may be shorter than the third delay, and the operations of FIG. 12 may be implemented as illustrated in FIG. 13B. For example, the operations in the first, second and third program execution intervals PGMEXE11, PGMEXE12 and PGMEXE21 of FIG. 13B may be substantially the same as those described with reference to FIGS. 9B and 11B. For example, in the fourth program execution interval PGMEXE22, the program voltage VPGM may have a fourth program level VP22b or voltage lower than the third program level VP21b or voltage, the bitline shut-off signal BLSHF may have a fourth delay DY22b from time point t24 to time point t64b, and the fourth delay DY22b may be shorter than the third delay DY21b.

Figure 14A:
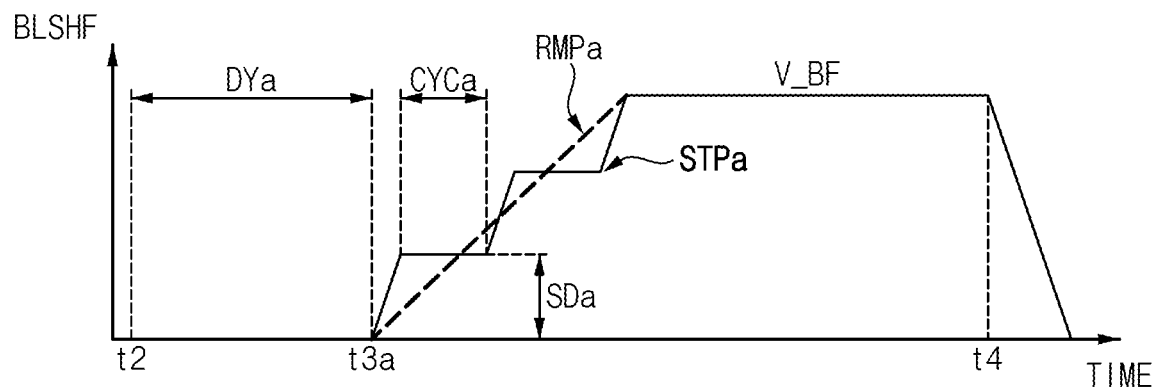
FIGS. 14A and 14B are diagrams for describing operations of controlling a slope of a bitline shut-off signal in a method of programming data in a nonvolatile memory device according to example embodiments.
Figure 14B:
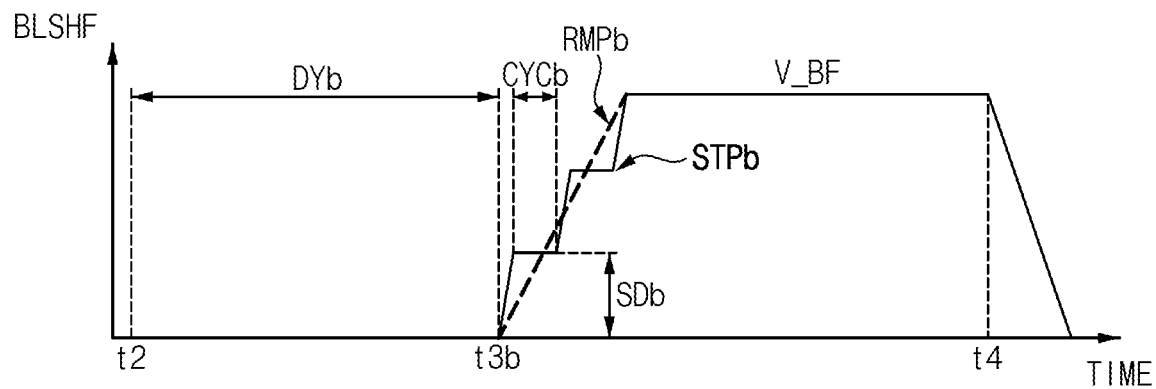

FIGS. 14A and 14B are diagrams for describing an operation of controlling a slope of a bitline shut-off signal in a method of programming data in a nonvolatile memory device according to example embodiments.

Referring to FIGS. 14A and 14B, as the level or voltage of the program voltage increases, the delay of the bitline shut-off signal may increase. In addition, as the delay of the bitline shut-off signal increases, a slope of the bitline shut-off signal may increase.

For example, as illustrated in FIG. 14A, when the bitline shut-off signal BLSHF has a first delay DYa from time point t2 to time point t3a, the bitline shut-off signal BLSHF may have a first slope, which corresponds to a value obtained by dividing the bitline forcing level V_BF or voltage by time required to increase from the ground level or ground voltage to the bitline forcing level V_BF or voltage. As illustrated in FIG. 14B, when the bitline shut-off signal BLSHF has a second delay DYb from time point t2 to time point t3b, the bitline shut-off signal BLSHF may have a second slope, which corresponds to a value obtained by dividing the bitline forcing level V_BF or voltage by time required to increase from the ground level or ground voltage to the bitline forcing level V_BF or voltage. The second delay DYb may be longer than the first delay DYa, and the second slope may be greater than the first slope. When the slope of the bitline shut-off signal BLSHF increases, the delay of the bitline shut-off signal BLSHF may increase without decreasing a time interval during which the bitline shut-off signal BLSHF has the bitline forcing level V_BF or voltage.

In some example embodiments, as illustrated by dotted lines in FIGS. 14A and 14B, the bitline shut-off signal BLSHF may be generated to have a ramp waveform with a predetermined slope, and may rise from the ground level or ground voltage to the bitline forcing level V_BF or voltage linearly. For example, a first ramp waveform RMPa having the first slope may be generated in the example of FIG. 14A, and a second ramp waveform RMPb having the second slope may be generated in the example of FIG. 14B.

In some example embodiments, as illustrated by solid lines in FIGS. 14A and 14B, the bitline shut-off signal BLSHF may be generated to have a plurality of step waveforms, and may rise from the ground level or ground voltage to the bitline forcing level V_BF or voltage scalariformly. For example, during the program operation for the selected wordline, the control circuit 560 may control the bitline shut-off signal BLSHF as step waveforms before a bitline forcing operation for providing the bitline forcing information to the selected cell string through the bitline is performed.

In some example embodiments, the slope of the bitline shut-off signal BLSHF may be controlled by adjusting at least one of a cycle and a step difference. The cycle may correspond to a time interval during which each of the plurality of step waveforms has a fixed level or voltage, and the step difference may correspond to a difference between levels or voltages of adjacent step waveforms. For example, the bitline shut-off signal BLSHF may be controlled to have the first slope by generating step waveforms STPa having a cycle CYCa and a step difference SDa in the example of FIG. 14A, and the bitline shut-off signal BLSHF may be controlled to have the second slope by generating step waveforms STPb having a cycle CYCb and a step difference SDb in the example of FIG. 14B. In some example embodiments, the number of step waveforms may be changed depending on a position or location of the selected wordline.

Figure 15:
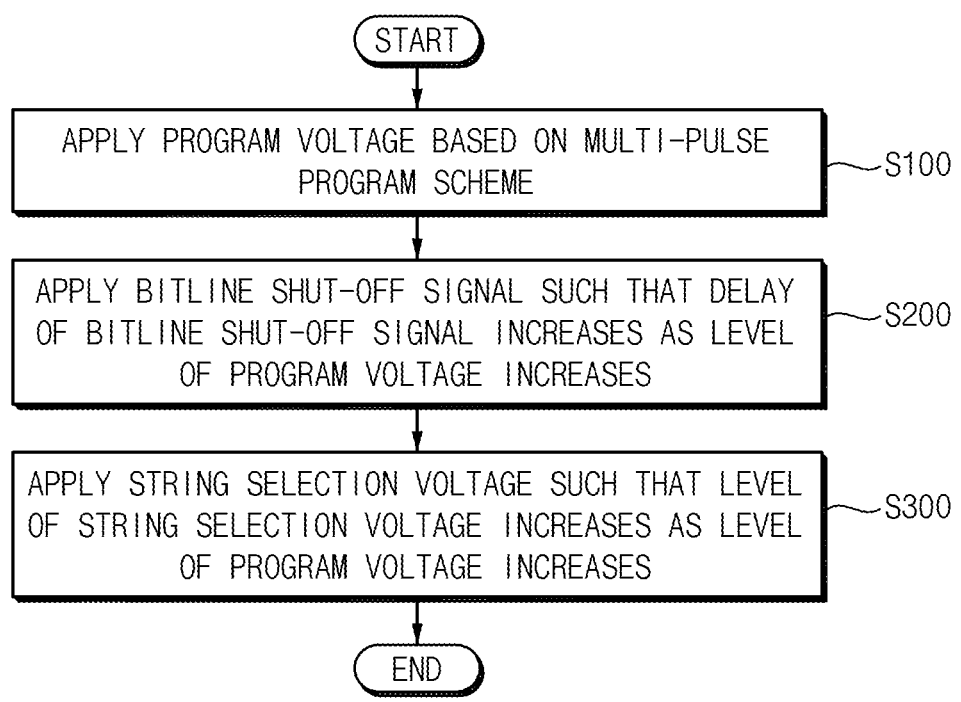
FIG. 15 is a flowchart illustrating a method of programming data in a nonvolatile memory device according to example embodiments.

FIG. 15 is a flowchart illustrating a method of programming data in a nonvolatile memory device according to example embodiments. The descriptions repeated with FIG. 1 will be omitted for brevity.

Referring to FIG. 15, in a method of programming data in a nonvolatile memory device according to example embodiments, operations S100 and S200 may be substantially the same as those described with reference to FIG. 1.

A string selection voltage may be applied such that a level or voltage of the string selection voltage increases as the level or voltage of the program voltage increases (operation S300). For example, the string selection voltage may be applied to a selected string selection line connected to a target string selection transistor connected to the target memory cell. In the example of FIG. 15, both the delay of the bitline shut-off signal and the level or voltage of the string selection voltage may be controlled together.

Figure 16:
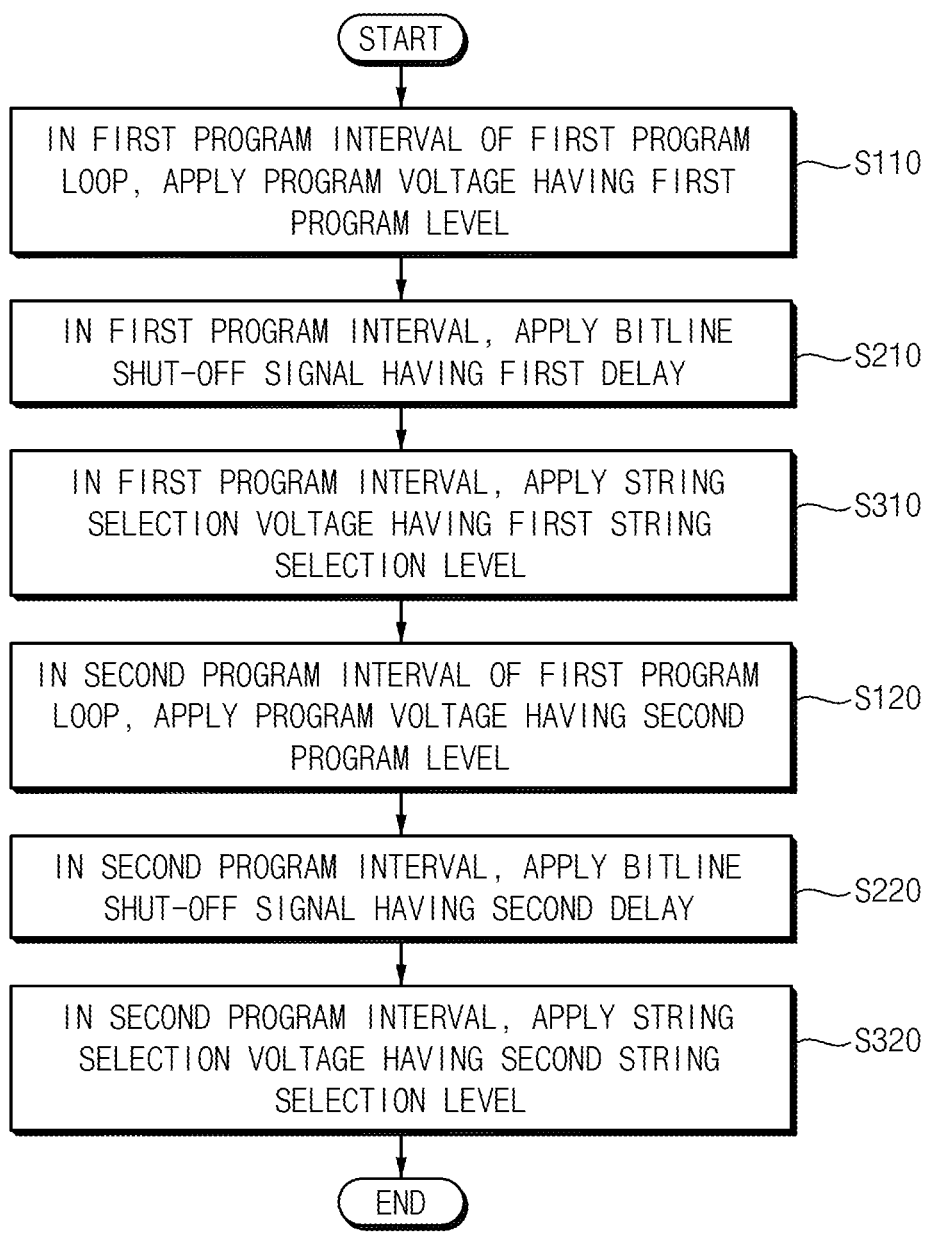
FIG. 16 is a flowchart illustrating an example of a method of programming data in a nonvolatile memory device of FIG. 15.
Figure 17A:
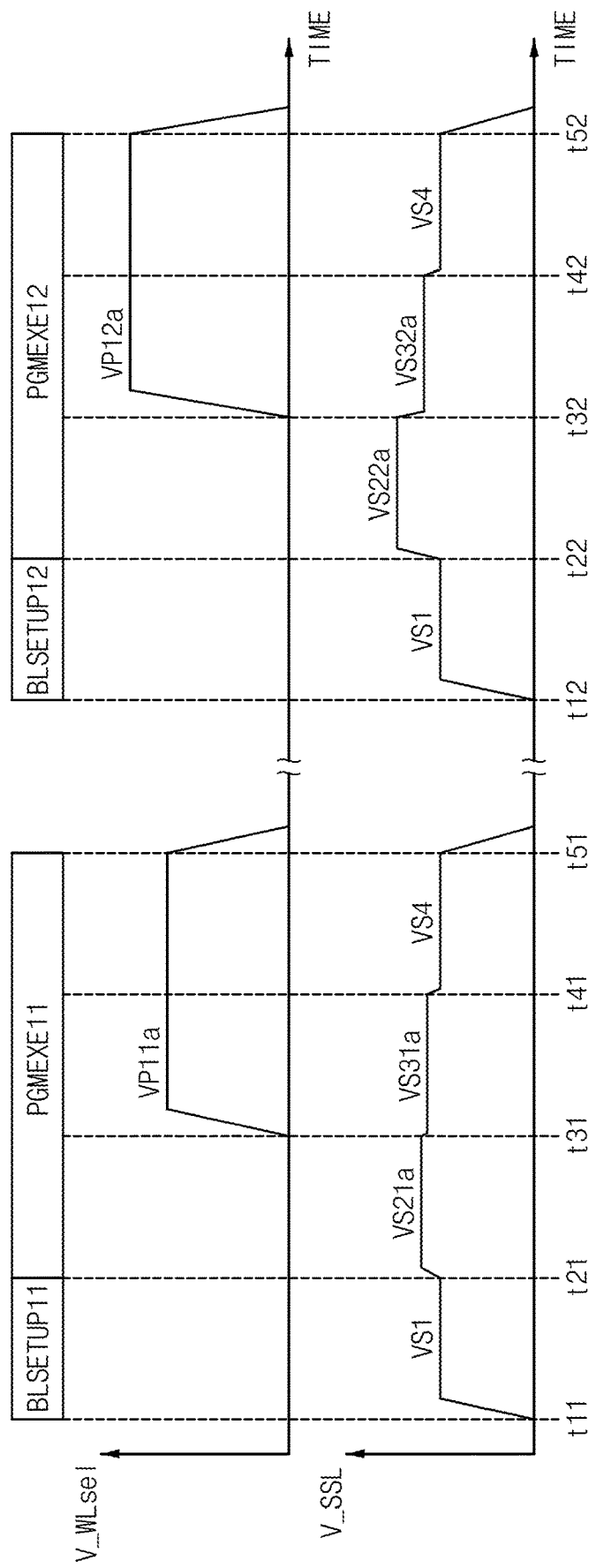
FIGS. 17A and 17B are diagrams for describing operations of FIG. 16.
Figure 17B:
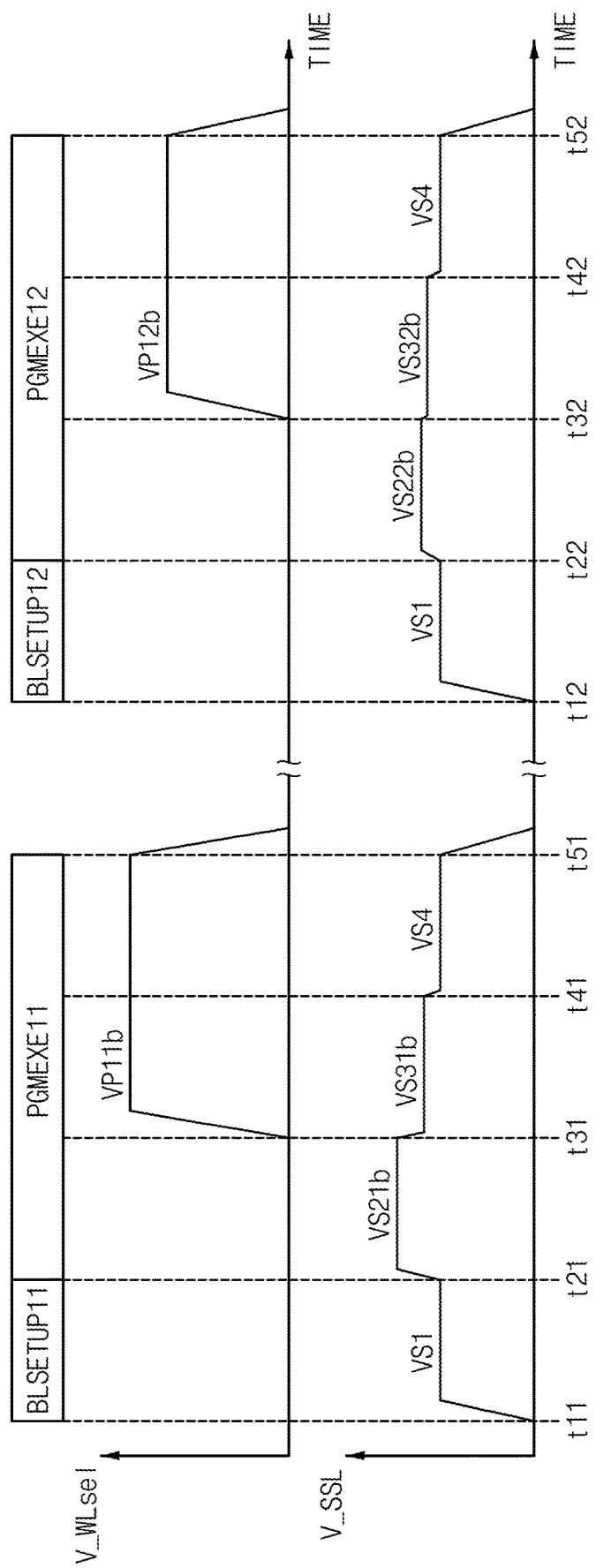

FIG. 16 is a flowchart illustrating an example of a method of programming data in a nonvolatile memory device of FIG. 15. FIGS. 17A and 17B are diagrams for describing an operation of FIG. 16. The descriptions repeated with FIGS. 8, 9A and 9B will be omitted for brevity.

Referring to FIGS. 16, 17A and 17B, the level or voltage of the string selection voltage may be changed or become different for each program pulse during one program loop. In addition, as the level or voltage of the program voltage increases, the level or voltage of the string selection voltage may increase.

Operations S110, S210, S120 and S220 in FIG. 16 may be substantially the same as those described with reference to FIG. 8. In the first program interval, the string selection voltage having a first string selection level or voltage may be applied to the selected string selection line (operation S310). In the second program interval, the string selection voltage having a second string selection level or voltage different from the first string selection level or voltage may be applied to the selected string selection line (operation S320). Operations S310 and S320 may be included in operation S300 of FIG. 15.

In some example embodiments, in the L2H scheme described with reference to FIG. 6A, the second string selection level or voltage may be higher than the first string selection level or voltage, and the operations of FIG. 16 may be implemented as illustrated in FIG. 17A. For example, the program voltage VPGM may be substantially the same as that described with reference to FIG. 9A. Although not illustrated in FIG. 17A, the bitline shut-off signal BLSHF may also be substantially the same as that described with reference to FIG. 9A. In a first bitline setup interval BLSETUP11 and the first program execution interval PGMEXE11 included in the first program interval, the voltage V_SSL of the selected string selection line may have voltages or levels VS1, VS21a, VS31a and VS4. In a second bitline setup interval BLSETUP12 and the second program execution interval PGMEXE12 included in the second program interval, the voltage V_SSL of the selected string selection line may have voltages or levels VS1, VS22a, VS32a and VS4. The voltages or levels VS22a and VS32a may be higher than the voltages or levels VS21a and VS31a. For example, each of time points t11 and t12 may correspond to time point t1 in FIG. 7.

In some example embodiments, in the H2L scheme described with reference to FIG. 6B, the second string selection level or voltage may be lower than the first string selection level or voltage, and the operations of FIG. 16 may be implemented as illustrated in FIG. 17B. For example, the program voltage VPGM may be substantially the same as that described with reference to FIG. 9B. Although not illustrated in FIG. 17B, the bitline shut-off signal BLSHF may also be substantially the same as that described with reference to FIG. 9B. In the first bitline setup interval BLSETUP11 and the first program execution interval PGMEXE11, the voltage V_SSL of the selected string selection line may have voltages or levels VS1, VS21b, VS31b and VS4. In the second bitline setup interval BLSETUP12 and the second program execution interval PGMEXE12, the voltage V_SSL of the selected string selection line may have voltages or levels VS1, VS22b, VS32b and VS4. The voltages or levels VS22b and VS32b may be lower than the voltages or levels VS21b and VS31b.

Figure 18:
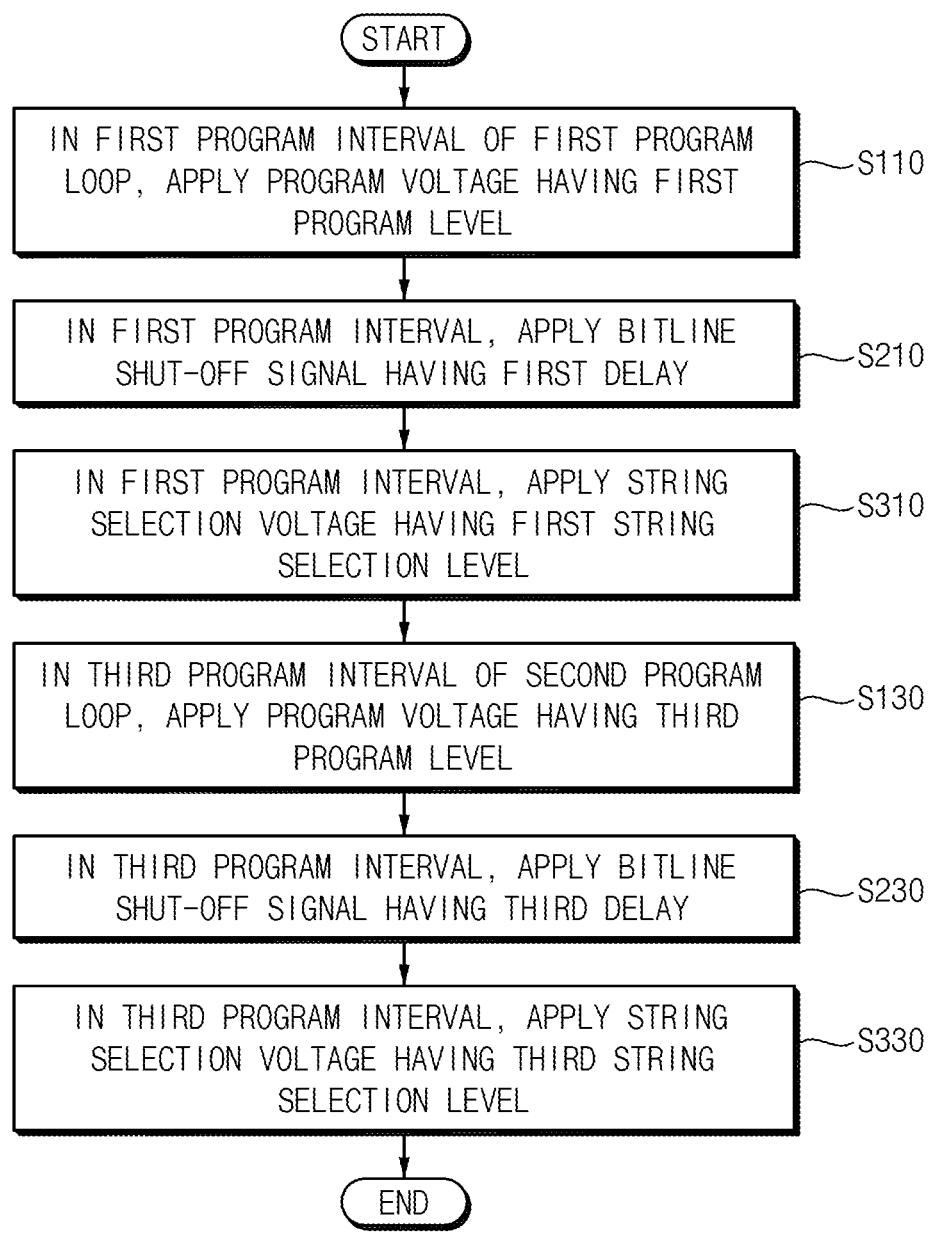
FIG. 18 is a flowchart illustrating an example of a method of programming data in a nonvolatile memory device of FIG. 15.
Figure 19A:
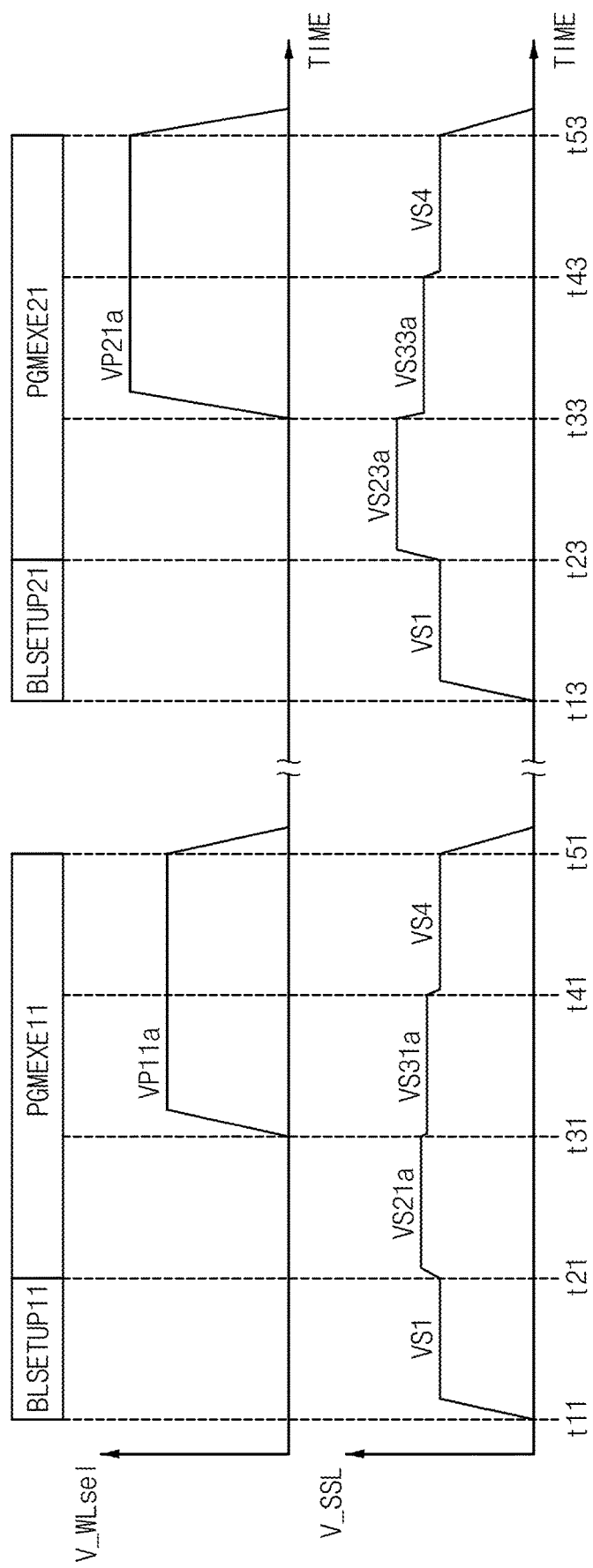
FIGS. 19A and 19B are diagrams for describing operations of FIG. 18.
Figure 19B:
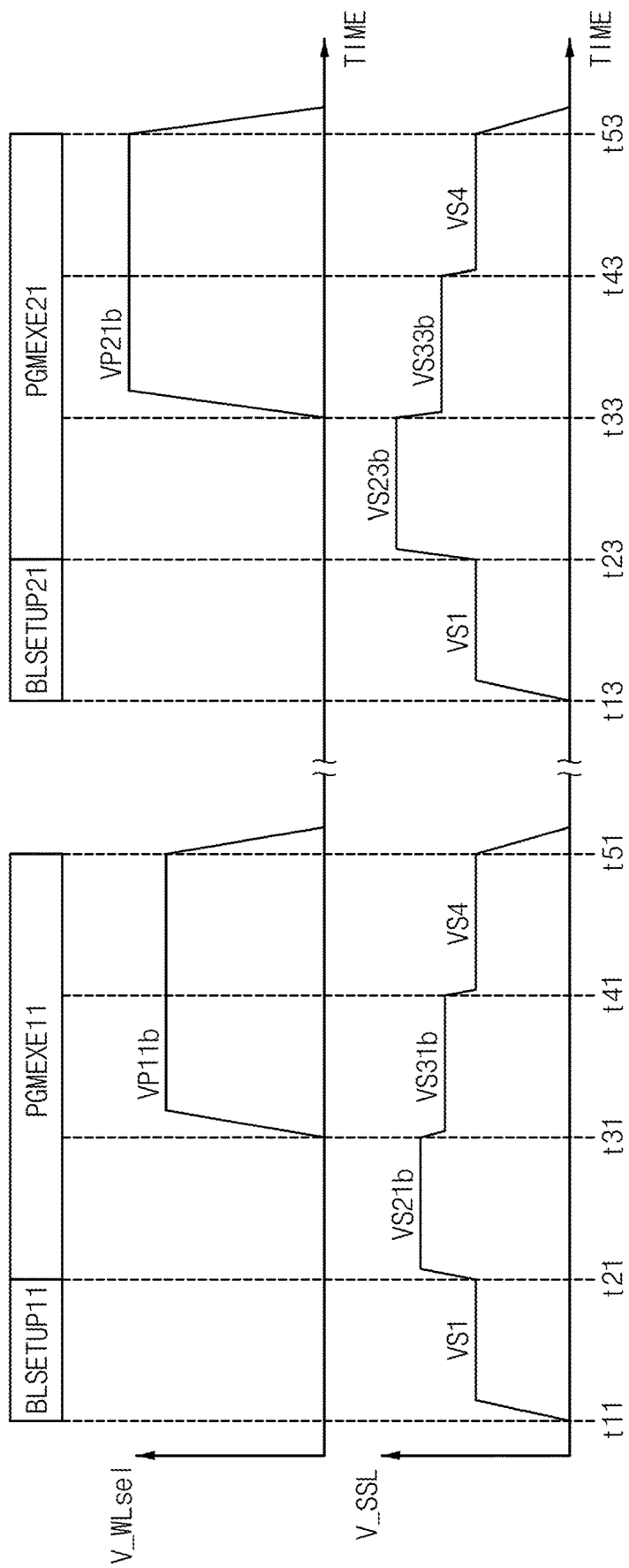

FIG. 18 is a flowchart illustrating an example of a method of programming data in a nonvolatile memory device of FIG. 15. FIGS. 19A and 19B are diagrams for describing an operation of FIG. 18. The descriptions repeated with FIGS. 10, 11A, 11B, 16, 17A and 17B will be omitted for brevity.

Referring to FIGS. 18, 19A and 19B, as the program loops are repeatedly performed, the level or voltage of the string selection voltage may be changed or become different. In addition, as the level or voltage of the program voltage increases, the level or voltage of the string selection voltage may increase. Further, as the number of times of the program loops increases, the level or voltage of the string selection voltage may increase.

Operations S110, S210, S310, S130 and S230 in FIG. 18 may be substantially the same as those described with reference to FIGS. 10 and 16. In the third program interval, the string selection voltage having a third string selection level or voltage higher than the first string selection level or voltage may be applied to the selected string selection line (operation S330). Operation S330 may be included in operation S300 of FIG. 15.

In some example embodiments, in the L2H scheme described with reference to FIG. 6A, the operations of FIG. 18 may be implemented as illustrated in FIG. 19A. For example, the operations in the first bitline setup interval BLSETUP11 and the first program execution interval PGMEXE11 of FIG. 19A may be substantially the same as those described with reference to FIG. 17A. In a third bitline setup interval BLSETUP21 and the third program execution interval PGMEXE21 included in the third program interval, the voltage V_SSL of the selected string selection line may have voltages or levels VS1, VS23a, VS33a and VS4. The voltages or levels VS23a and VS33a may be higher than the voltages or levels VS21a and VS31a. For example, time point t13 may correspond to time point t1 in FIG. 7.

In some example embodiments, in the H2L scheme described with reference to FIG. 6B, the operations of FIG. 18 may be implemented as illustrated in FIG. 19B. For example, the operations in the first bitline setup interval BLSETUP11 and the first program execution interval PGMEXE11 of FIG. 19B may be substantially the same as those described with reference to FIG. 17B. In the third bitline setup interval BLSETUP21 and the third program execution interval PGMEXE21, the voltage V_SSL of the selected string selection line may have voltages or levels VS1, VS23b, VS33b and VS4. The voltages or levels VS23b and VS33b may be higher than the voltages or levels VS21b and VS31b.

Figure 20:
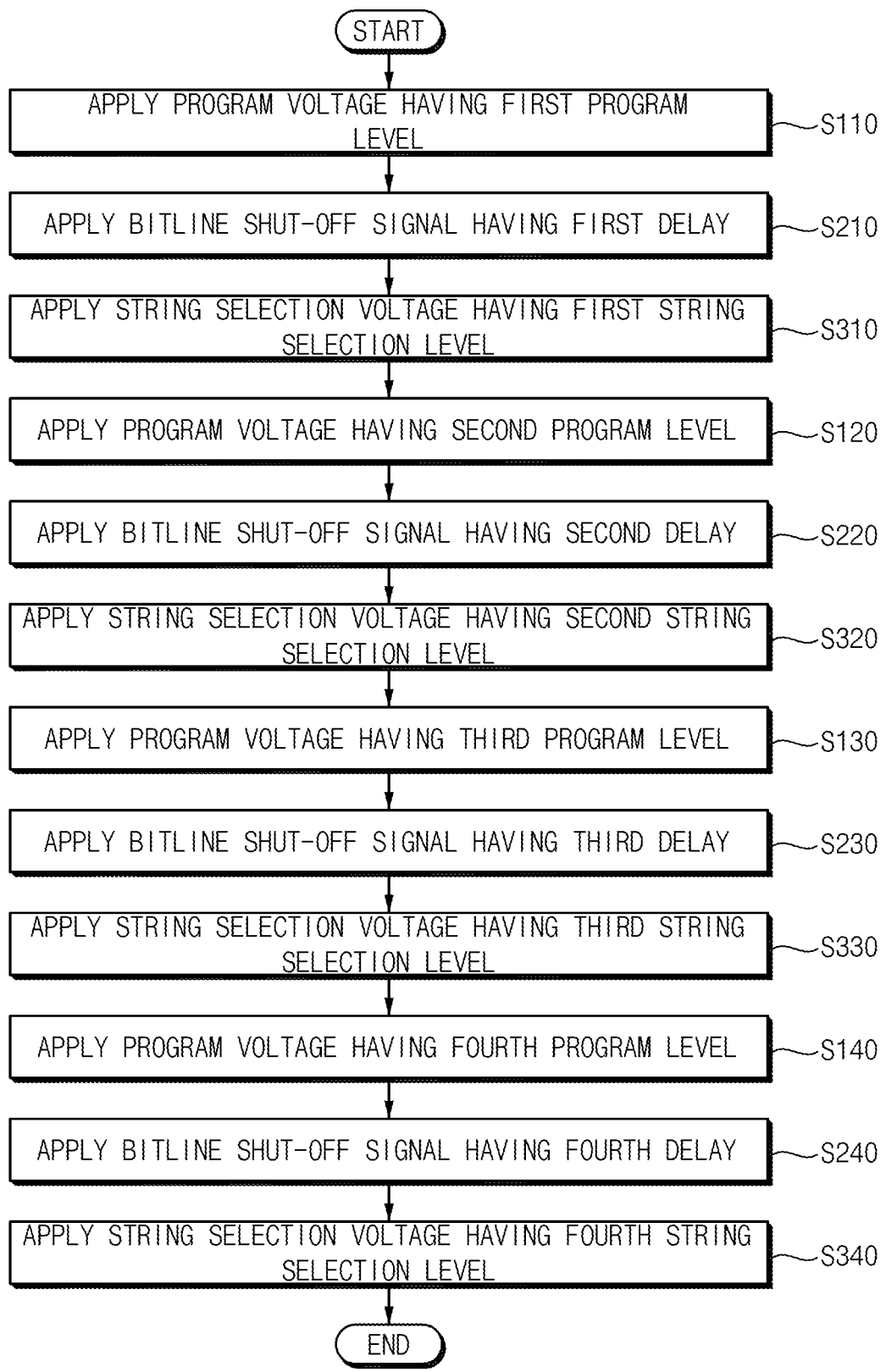
FIG. 20 is a flowchart illustrating an example of a method of programming data in a nonvolatile memory device of FIG. 15.
Figure 21A:
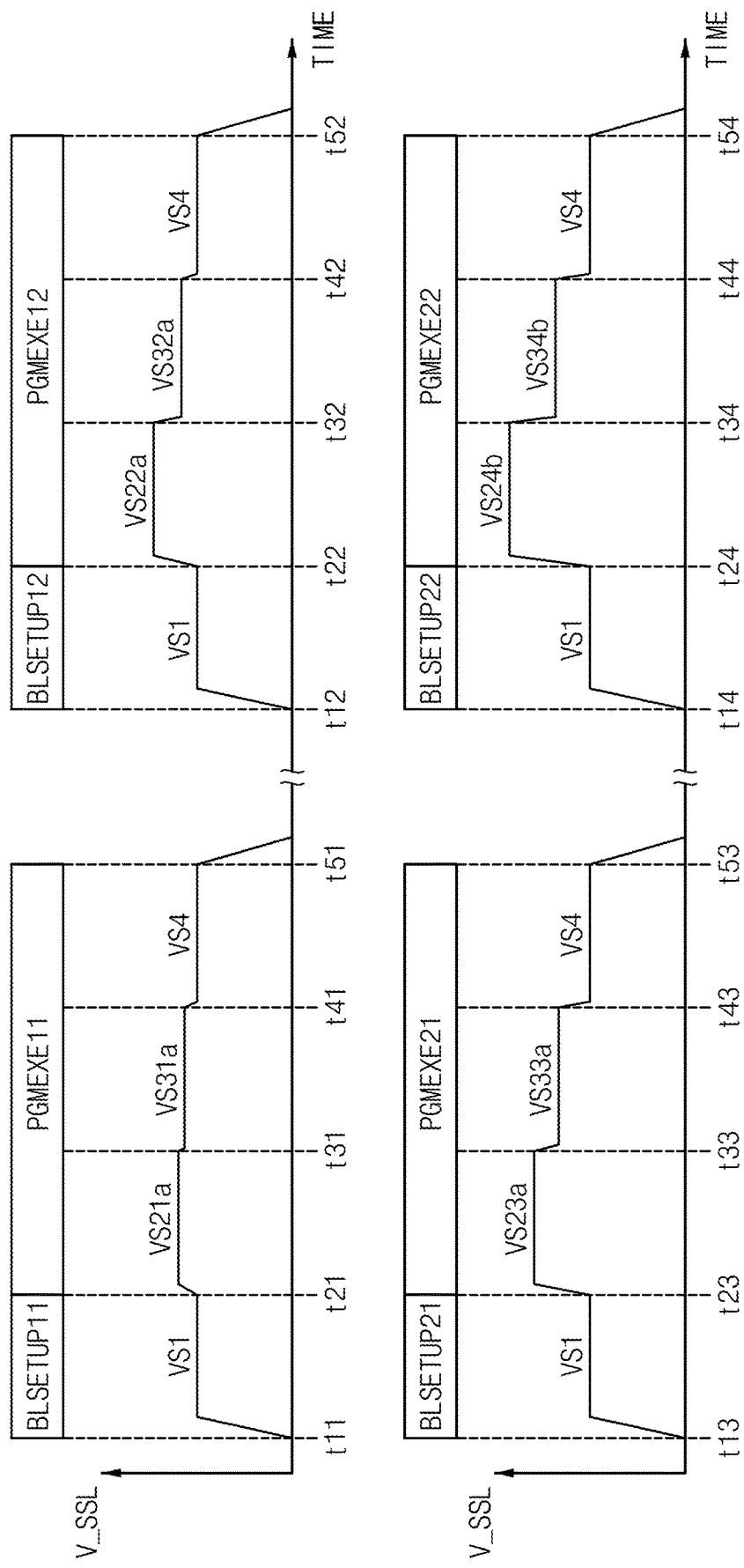
FIGS. 21A and 21B are diagrams for describing operations of FIG. 20.
Figure 21B:
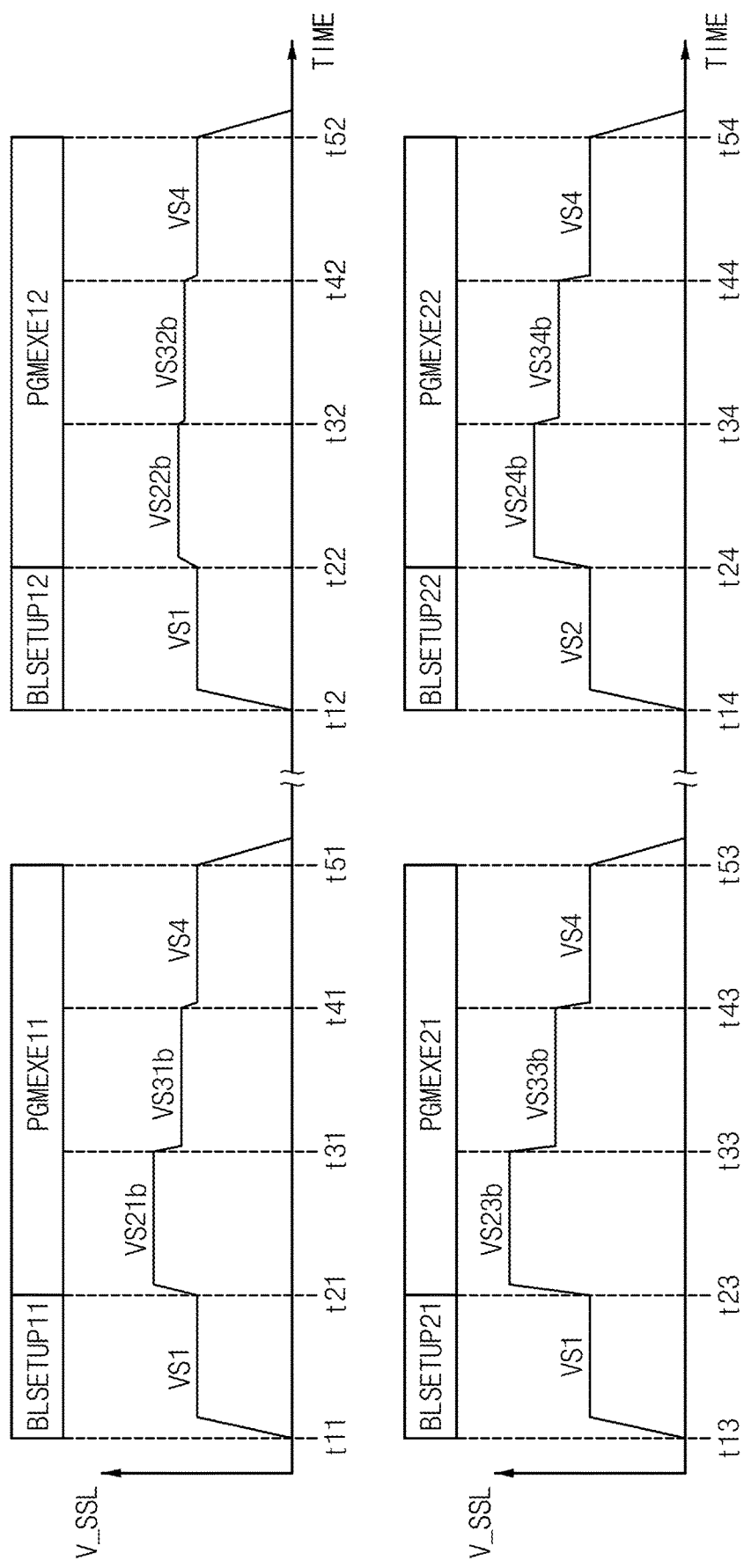

FIG. 20 is a flowchart illustrating an example of a method of programming data in a nonvolatile memory device of FIG. 15. FIGS. 21A and 21B are diagrams for describing an operation of FIG. 20. The descriptions repeated with FIGS. 12, 13A, 13B, 16, 17A, 17B, 18, 19A and 19B will be omitted for brevity.

Referring to FIGS. 20, 21A and 21B, the level or voltage of the string selection voltage may be changed or become different for each program pulse during one program loop. In addition, as the program loops are repeatedly performed, the level or voltage of the string selection voltage may be changed or become different. Further, as the level or voltage of the program voltage increases, the level or voltage of the string selection voltage may increase. FIG. 20 illustrates that the example of FIG. 16 and the example of FIG. 18 are combined.

Operations S110, S210, S310, S120, S220, S320, S130, S230, S330, S140 and S240 in FIG. 20 may be substantially the same as those described with reference to FIGS. 12, 16 and 18. In the fourth program interval, the string selection voltage having a fourth string selection level or voltage, which is higher than the second string selection level or voltage and different from the third string selection level or voltage, may be applied to the selected string selection line (operation S340). Operation S340 may be included in operation S300 of FIG. 15.

In some example embodiments, in the L2H scheme described with reference to FIG. 6A, the fourth string selection level or voltage may be higher than the third string selection level or voltage, and the operations of FIG. 20 may be implemented as illustrated in FIG. 21A. For example, although not illustrated in FIG. 21A, the program voltage VPGM and the bitline shut-off signal BLSHF may be substantially the same as those described with reference to FIG. 13A. The operations in the first, second and third bitline setup intervals BLSETUP11, BLSETUP12 and BLSETUP21 and the first, second and third program execution intervals PGMEXE11, PGMEXE12 and PGMEXE21 of FIG. 21A may be substantially the same as those described with reference to FIGS. 17A and 19A. For example, in a fourth bitline setup interval BLSETUP22 and the fourth program execution interval PGMEXE22 included in the fourth program interval, the voltage V_SSL of the selected string selection line may have voltages or levels VS1, VS24a, VS34a and VS4. The voltages or levels VS24a and VS34a may be higher than the voltages or levels VS23a and VS33a. For example, time point t14 may correspond to time point t1 in FIG. 7.

In some example embodiments, in the H2L scheme described with reference to FIG. 6B, the fourth string selection level or voltage may be lower than the third string selection level or voltage, and the operations of FIG. 20 may be implemented as illustrated in FIG. 21B. For example, although not illustrated in FIG. 21B, the program voltage VPGM and the bitline shut-off signal BLSHF may be substantially the same as those described with reference to FIG. 13B. The operations in the first, second and third bitline setup intervals BLSETUP11, BLSETUP12 and BLSETUP21 and the first, second and third program execution intervals PGMEXE11, PGMEXE12 and PGMEXE21 of FIG. 21B may be substantially the same as those described with reference to FIGS. 17B and 19B. For example, in the fourth bitline setup interval BLSETUP22 and the fourth program execution interval PGMEXE22, the voltage V_SSL of the selected string selection line may have voltages or levels VS1, VS24b, VS34b and VS4. The voltages or levels VS24b and VS34b may be lower than the voltages or levels VS23b and VS33b.

Although example embodiments are described based on the examples where one program loop includes two program intervals and the examples where two program loops are performed, example embodiments are not limited thereto, and the number of program intervals and/or the number of program loops may be variously determined according to example embodiments. In some example embodiments, when the ISPP scheme is not applied (or employed), the delay of the bitline shut-off signal may not increase and may maintain.

Figure 22:
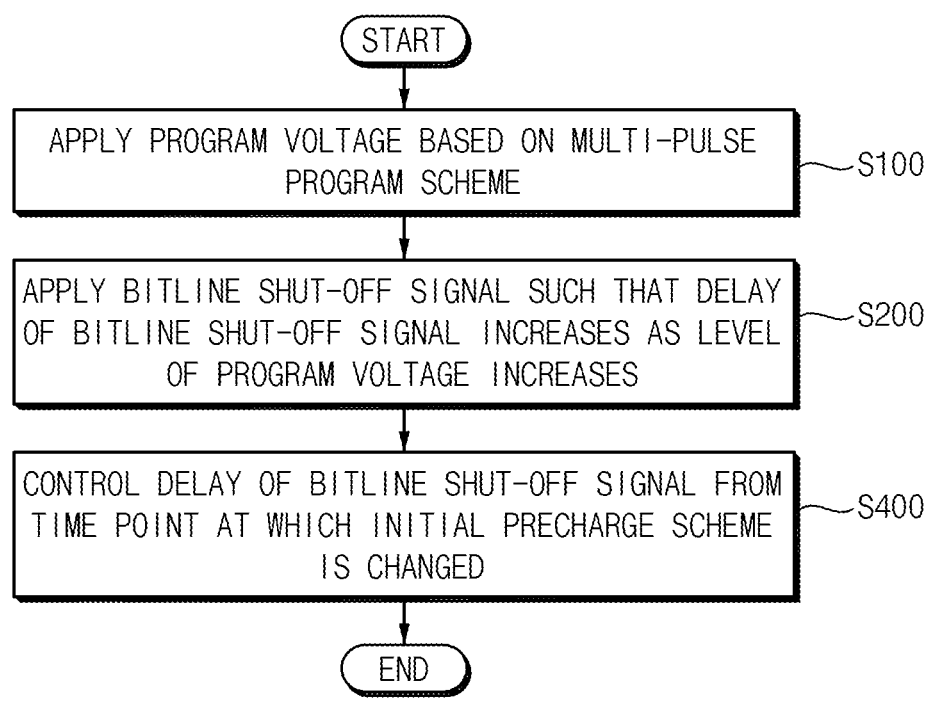
FIG. 22 is a flowchart illustrating a method of programming data in a nonvolatile memory device according to example embodiments.

FIG. 22 is a flowchart illustrating a method of programming data in a nonvolatile memory device according to example embodiments. The descriptions repeated with FIG. 1 will be omitted for brevity.

Referring to FIG. 22, in a method of programming data in a nonvolatile memory device according to example embodiments, operations S100 and S200 may be substantially the same as those described with reference to FIG. 1.

The delay of the bitline shut-off signal may be controlled from time point at which an initial precharge scheme is changed (operation S400). For example, at an initial operation time, the delay of the bitline shut-off signal may not increase and may maintain even when the level or voltage of the program voltage increases. For example, only after the initial precharge scheme is changed, the delay of the bitline shut-off signal may increase as the level or voltage of the program voltage increases.

In some example embodiments, operation S400 may be differently performed depending on a direction in which the program operation is performed, which will be described later.

Figure 23A:
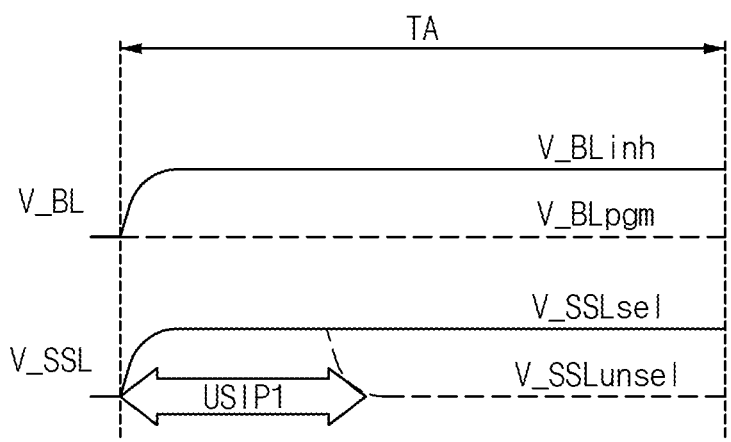
FIGS. 23A, 23B and 24 are diagrams for describing an initial precharge operation associated with a method of programming data in a nonvolatile memory device according to example embodiments.
Figure 23B:
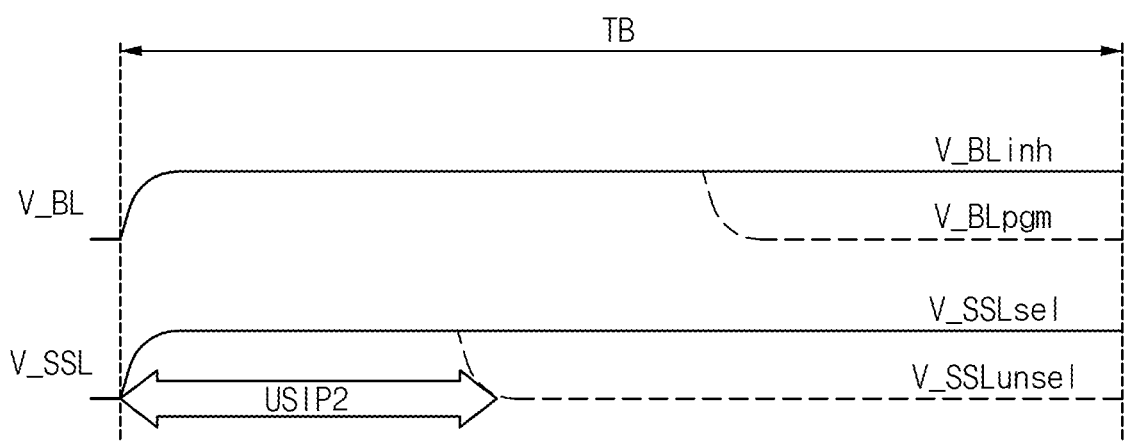
Figure 24:
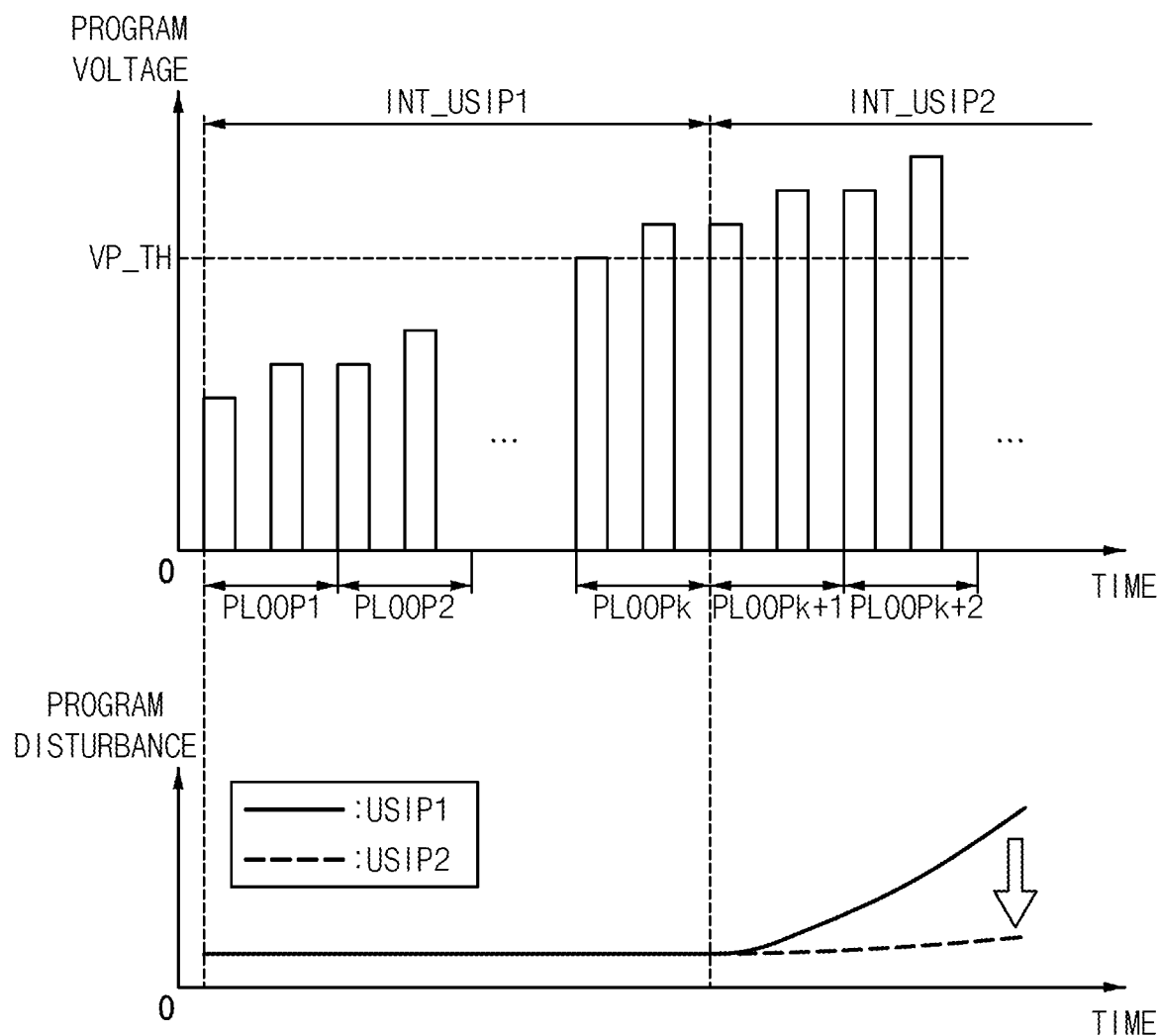

FIGS. 23A, 23B and 24 are diagrams for describing an initial precharge operation associated with a method of programming data in a nonvolatile memory device according to example embodiments.

Referring to FIG. 23A, an example where the initial precharge operation is performed based on a first scheme USIP1. For example, the first scheme USIP1 may be referred to as 1-step unselected string initial precharge (USIP) scheme. In FIG. 23A, 'V_BL' represents a level or voltage change in a voltage of the bitline, and 'V_BLinh' and 'V_BLpgm' represent the program inhibit bitline and the program target bitline, respectively. In addition, 'V_SSL' represents a level or voltage change in a voltage of the string selection line, and 'V_SSLsel' and 'V_SSLunsel' represent the selected string selection line and the unselected string selection line, respectively. For example, in the 1-step USIP scheme, a channel voltage V_CH may be a ground voltage or ground level GND or power supply voltage or a power supply voltage level VDD, and time interval required to perform the program operation may be 'TA'.

Referring to FIG. 23B, an example where the initial precharge operation is performed based on a second scheme USIP2 different from the first scheme USIP1. For example, the second scheme USIP2 may be referred to as 2-step USIP scheme. For example, in the 2-step USIP scheme, a channel voltage V_CH may be the power supply voltage or the power supply voltage level (VDD), and time interval required to perform the program operation may be 'TB'. For example, TA<<TB, and the time interval required to perform the program operation may be relatively long when the second scheme USIP2 is used. In other words, the first scheme USIP1 may be more advantageous than the second scheme USIP2 in terms of performance.

Referring to FIG. 24, when the initial precharge operation is performed based on the first scheme USIP1 and the second scheme USIP2, changes in the program disturbance depending on repetition of the program loops PLOOP1, PLOOP2, . . . , PLOOPk, PLOOPk+1, PLOOPk+2 are illustrated, where k is a natural number greater than or equal to two. From the first program loop PLOOP1 to the k-th program loop PLOOPk, there may be little difference in the program disturbance between the examples of using the first scheme USIP1 and the second scheme USIP2. However, from the (k+1)-th program loop PLOOPk+1 the program disturbance may increase more when the first scheme USIP1 is used than when the second scheme USIP2 is used. In other words, the second scheme USIP2 may be more advantageous than the first scheme USIP1 in terms of reliability.

Accordingly, both the first scheme USIP1 and the second scheme USIP2 may be used in consideration of both performance and reliability. For example, in the program loops PLOOP1 to PLOOPk included in an early time interval INT_USIP1 during which the level or voltage of the program voltage VPGM is lower than or equal to a threshold (or reference) level VP_TH or threshold voltage, the initial precharge operation may be performed based on the first scheme USIP1. For example, in the program loops PLOOPk+1 and PLOOPk+2 included in a later time interval INT_USIP2 during which the level or voltage of the program voltage VPGM is higher than the threshold level VP_TH or threshold voltage, the initial precharge operation may be performed based on the second scheme USIP2.

FIGS. 25A, 25B, 26A, 26B, 27A and 27B are diagrams for describing an operation of controlling a delay of a bitline shut-off signal from time point at which an initial precharge scheme is changed in FIG. 22.

Figure 25A:
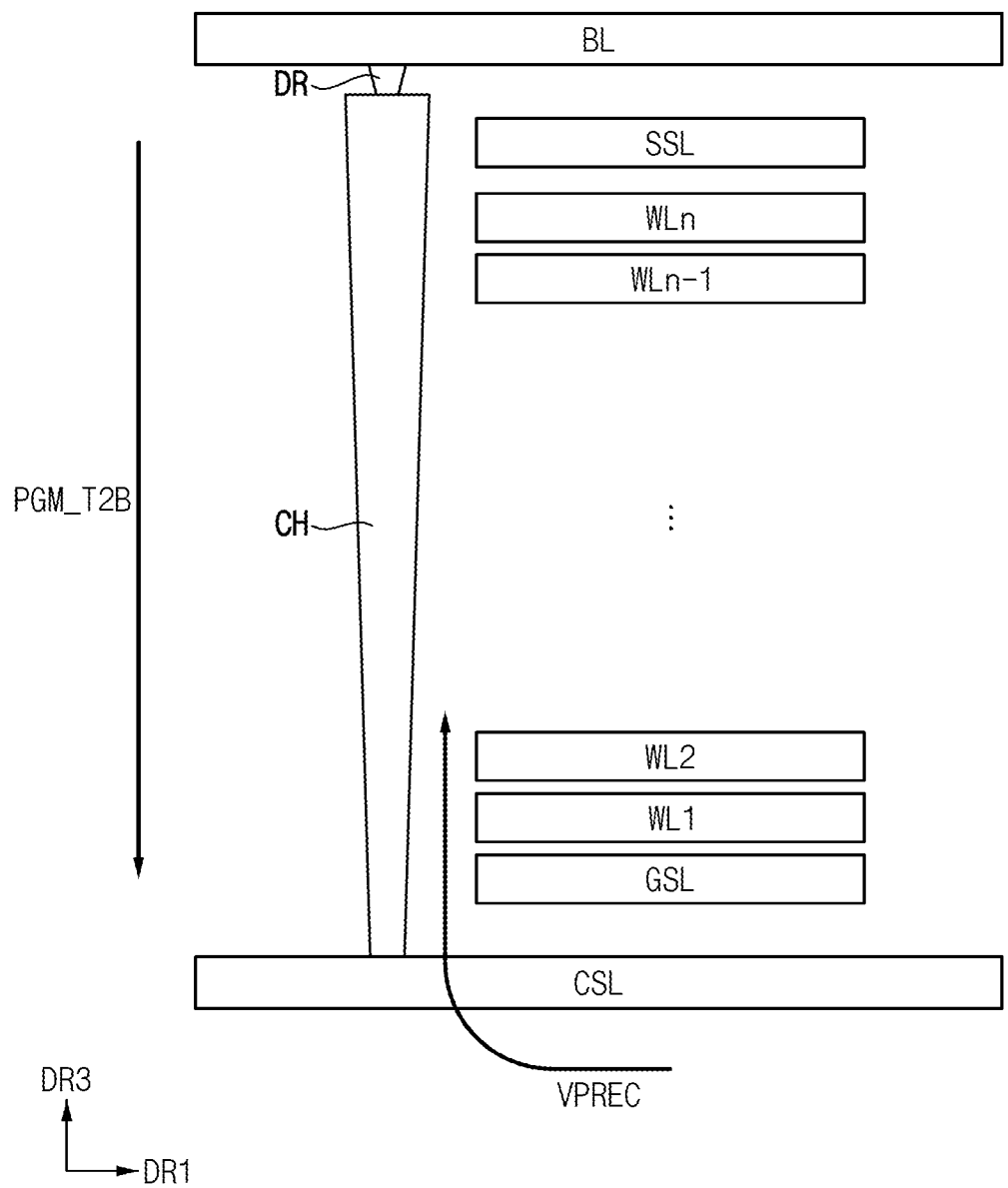
FIGS. 25A, 25B, 26A, 26B, 27A and 27B are diagrams for describing operations of controlling a delay of a bitline shut-off signal from time point at which an initial precharge scheme is changed in FIG. 22.
Figure 25B:
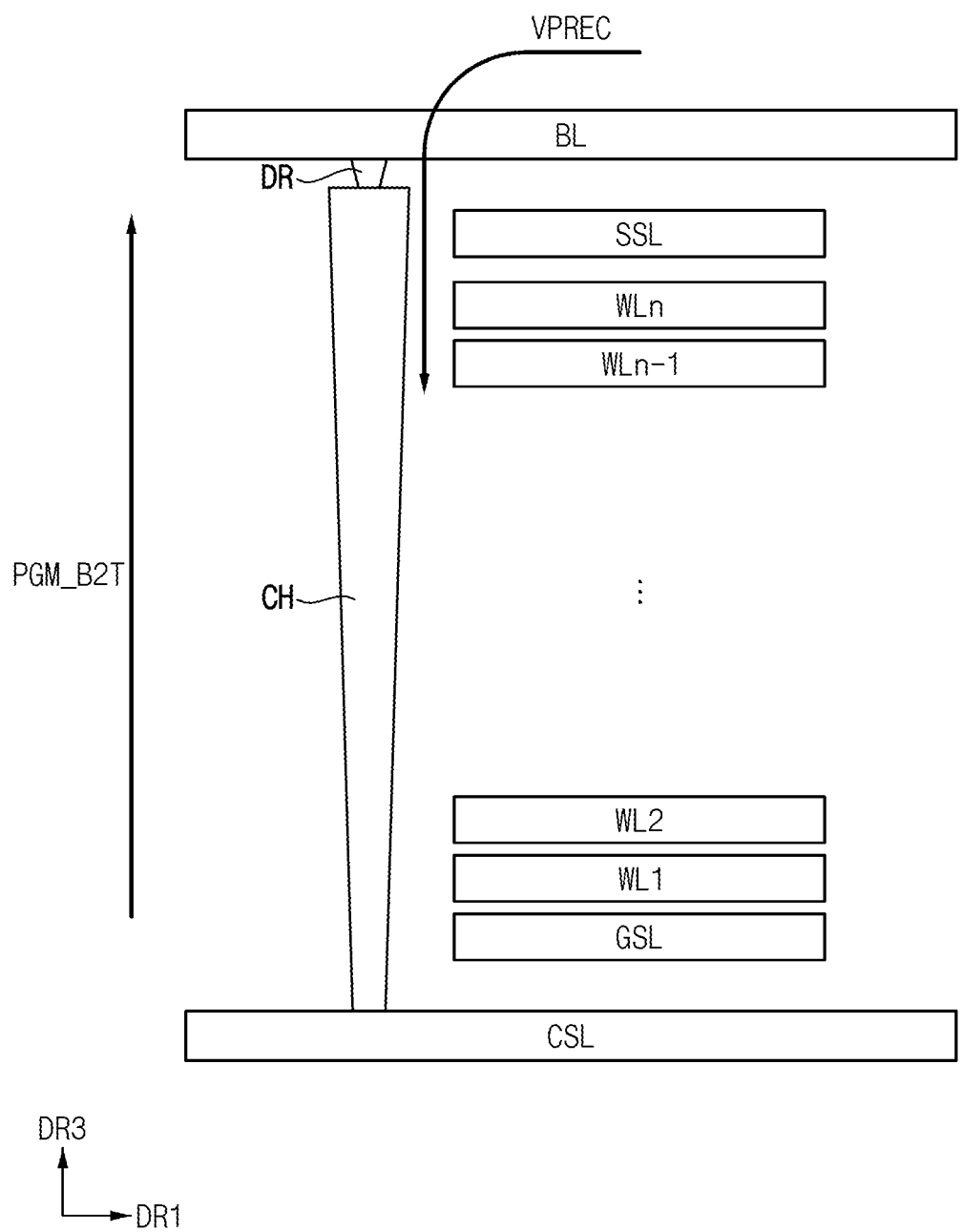

Referring to FIGS. 25A and 25B, a structure of a plurality of lines CSL, GSL, WL1, WL2, . . . , WLn−1, WLn, SSL, BL and a channel CH included in one memory block is schematically illustrated. For example, the memory block and the channel CH may correspond to the memory block BLKi and the pillar 113 of FIG. 3, respectively.

The common source line CSL, the ground selection line GSL, the wordlines WL1 to WLn, the string selection line SSL and the bitline BL may be stacked on the substrate 111 in the third direction DR3 and may extend along the first direction DR1, where n is a natural number greater than or equal to two. The channel CH may extend along the third direction DR3 and may be connected to the bitline BL through a drain DR.

In some example embodiments, as illustrated in FIG. 25A, the program operation may be sequentially performed from the uppermost memory cell to the lowermost memory cell. The uppermost memory cell may be connected to the uppermost wordline WLn and farthest from the substrate 111, and the lowermost memory cell may be connected to the lowermost wordline WL1 and closest to the substrate 111. The program scheme illustrated in FIG. 25A may be referred to as a top-to-bottom (T2B) scheme, and a direction in which the program operation is performed in FIG. 25A may be 'PGM_T2B.' In this example, the initial precharge operation may be performed using a precharge voltage VPREC provided through the common source line CSL by turning on the ground selection transistor connected to the ground selection line GSL.

In some example embodiments, as illustrated in FIG. 25B, the program operation may be sequentially performed from the lowermost memory cell to the uppermost memory cell. The program scheme illustrated in FIG. 25B may be referred to as a bottom-to-top (B2T) scheme, and a direction in which the program operation is performed in FIG. 25B may be 'PGM_B2T.' In this example, the initial precharge operation may be performed using a precharge voltage VPREC provided through the bitline BL by turning on the string selection transistor connected to the string selection line SSL.

Figure 26A:
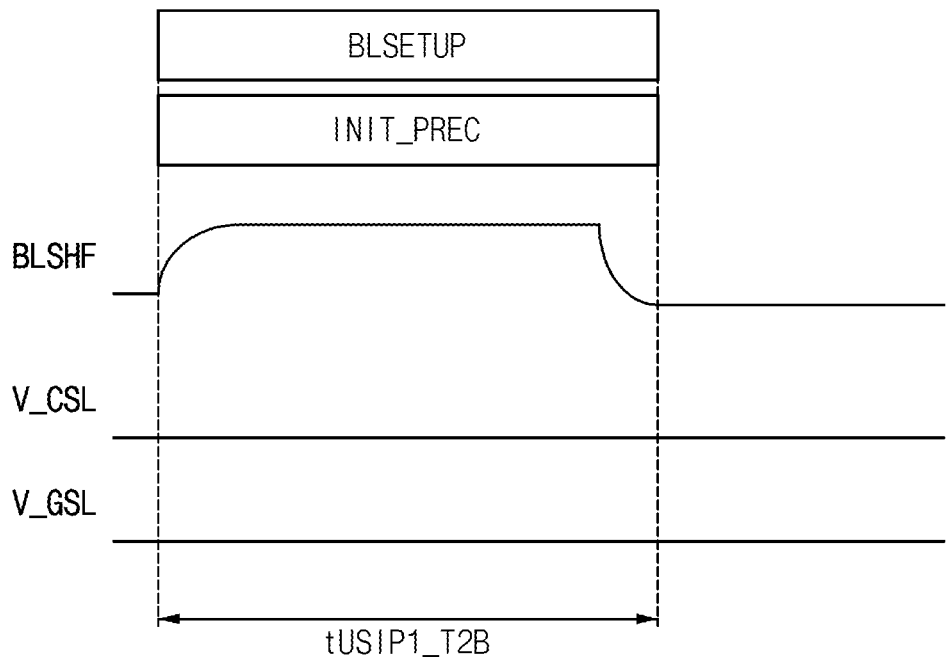
Figure 26B:
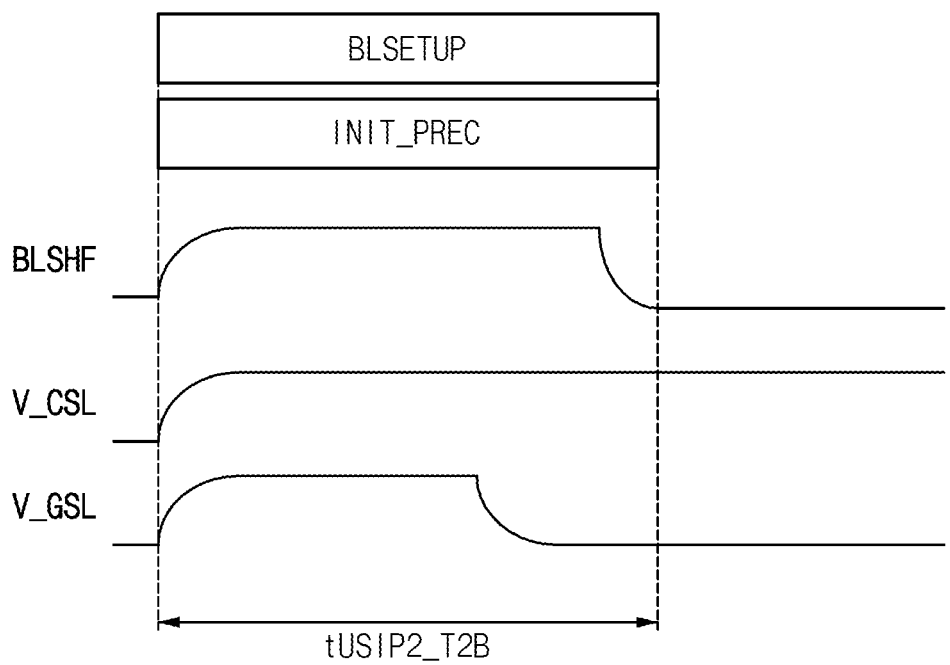

Referring to FIGS. 26A and 26B, an example where the initial precharge scheme is changed in the T2B scheme described with reference to FIG. 25A is illustrated.

In the early time interval INT_USIP1 during which the initial precharge operation is performed based on the first scheme USIP1, a voltage V_CSL of the common source line and a voltage V_GSL of the ground selection line may not be changed and may be fixed, as illustrated in FIG. 26A. In the later time interval INT_USIP2 during which the initial precharge operation is performed based on the second scheme USIP2, the voltage V_CSL of the common source line and the voltage V_GSL of the ground selection line may be changed, as illustrated in FIG. 26B. In the T2B scheme, an initial precharge operation INIT_PREC may be always performed in the bitline setup interval BLSETUP as illustrated in FIGS. 26A and 26B. In FIGS. 26A and 26B, 'tUSIP1_T2B' and 'tUSIP2_T2B' represent time interval required to perform the initial precharge operation and the bitline setup operation.

Accordingly, when the program operation is performed based on the T2B scheme and when operation S400 is performed, the operation of controlling the delay of the bitline shut-off signal BLSHF may start from a P-th program loop among the plurality of program loops performed on the target memory cell, where P is a natural number. While the initial precharge operation is performed in the P-th program loop and subsequent program loops, the level or voltage of the ground selection voltage V_GSL applied to the selected ground selection line connected to the target ground selection transistor connected to the target memory cell or the level or voltage of the common source voltage V_CSL applied to the common source line may be changed. In contrast, while the initial precharge operation is performed in the first to (P−1)-th program loops, the level or voltage of the ground selection voltage V_GSL and the level or voltage of the common source voltage V_CSL may not be changed.

Figure 27A:
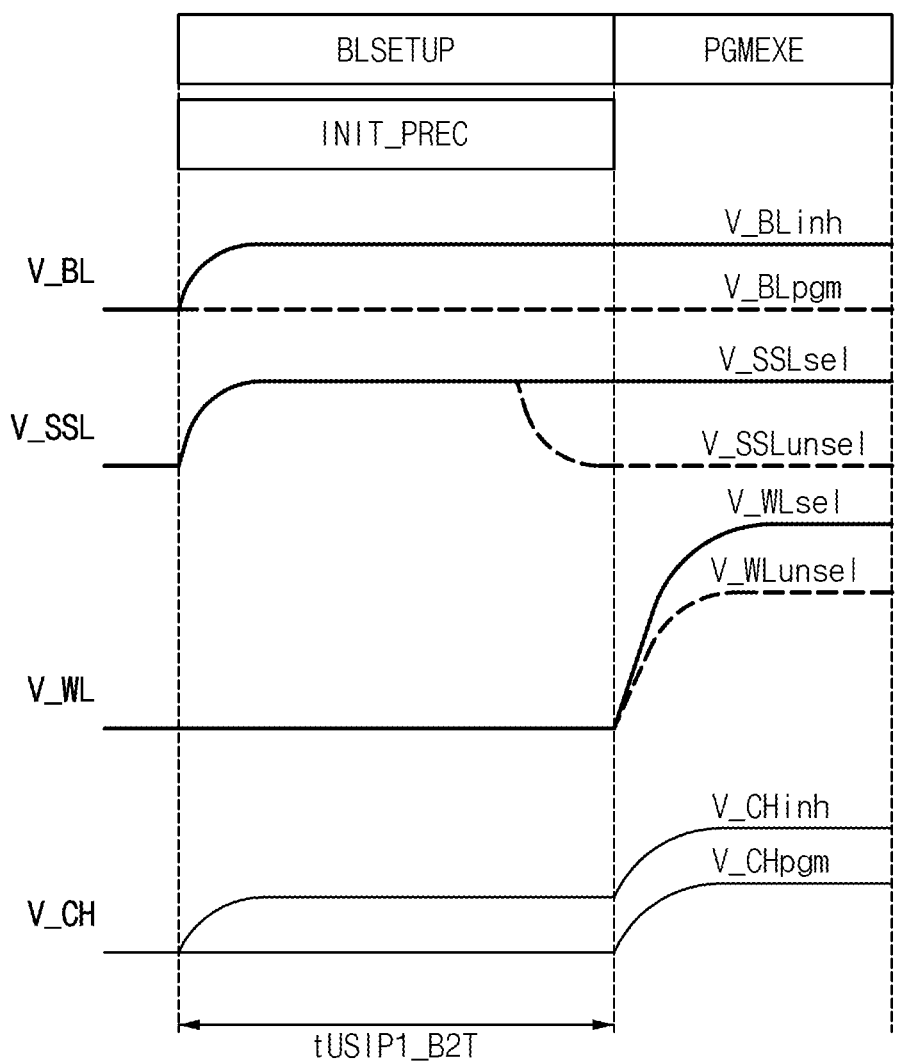
Figure 27B:
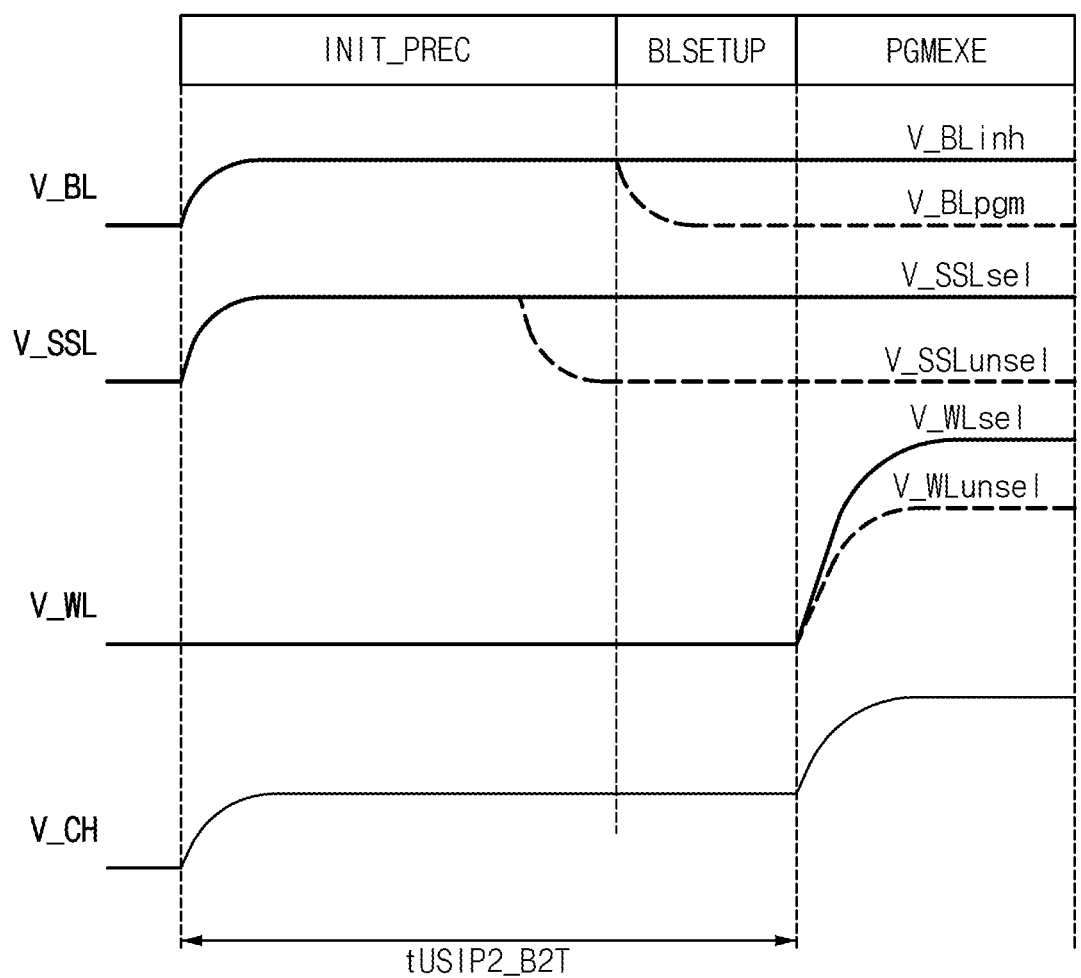

Referring to FIGS. 27A and 27B, an example where the initial precharge scheme is changed in the B2T scheme described with reference to FIG. 25B is illustrated.

In the early time interval INT_USIP1 during which the initial precharge operation is performed based on the first scheme USIP1, the voltage V_BL of the bitline, the voltage V_SSL of the string selection line, the voltage V_WL of the wordline, and the channel voltage V_CH may be changed as illustrated in FIG. 27A, and the initial precharge operation INIT_PREC may be performed in the bitline setup interval BLSETUP as illustrated in FIG. 27A. In the later time interval INT_USIP2 during which the initial precharge operation is performed based on the second scheme USIP2, the voltage V_BL of the bitline, the voltage V_SSL of the string selection line, the voltage V_WL of the wordline, and the channel voltage V_CH may be changed as illustrated in FIG. 27B, and the bitline setup interval BLSETUP may start after the initial precharge operation INIT_PREC is performed as illustrated in FIG. 27B. In FIGS. 27A and 27B, 'tUSIP1_B2T' and 'tUSIP2_B2T' represent time interval required to perform the initial precharge operation and the bitline setup operation.

Accordingly, when the program operation is performed based on the B2T scheme and when operation S400 is performed, the operation of controlling the delay of the bitline shut-off signal may start from a Q-th program loop among the plurality of program loops performed on the target memory cell, where Q is a natural number. In the Q-th program loop and subsequent program loops, a timing of performing the initial precharge operation and a timing of performing the bitline setup operation may become different from each other. In contrast, in the first to (Q−1)-th program loops, the timing of performing the initial precharge operation and the timing of performing the bitline setup operation may be substantially the same as each other.

Figure 28:
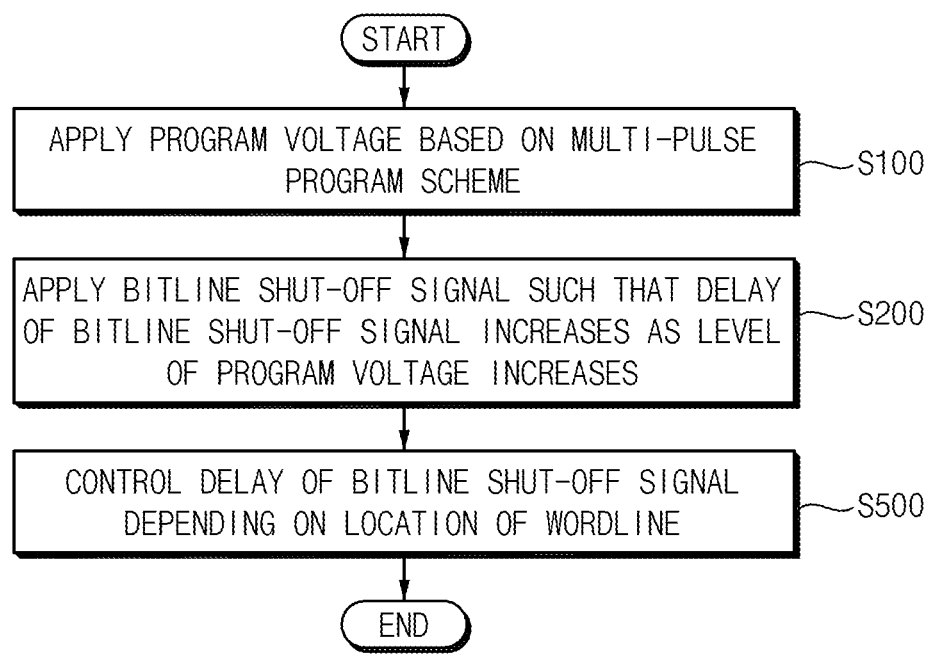
FIG. 28 is a flowchart illustrating a method of programming data in a nonvolatile memory device according to example embodiments.
Figure 29A:
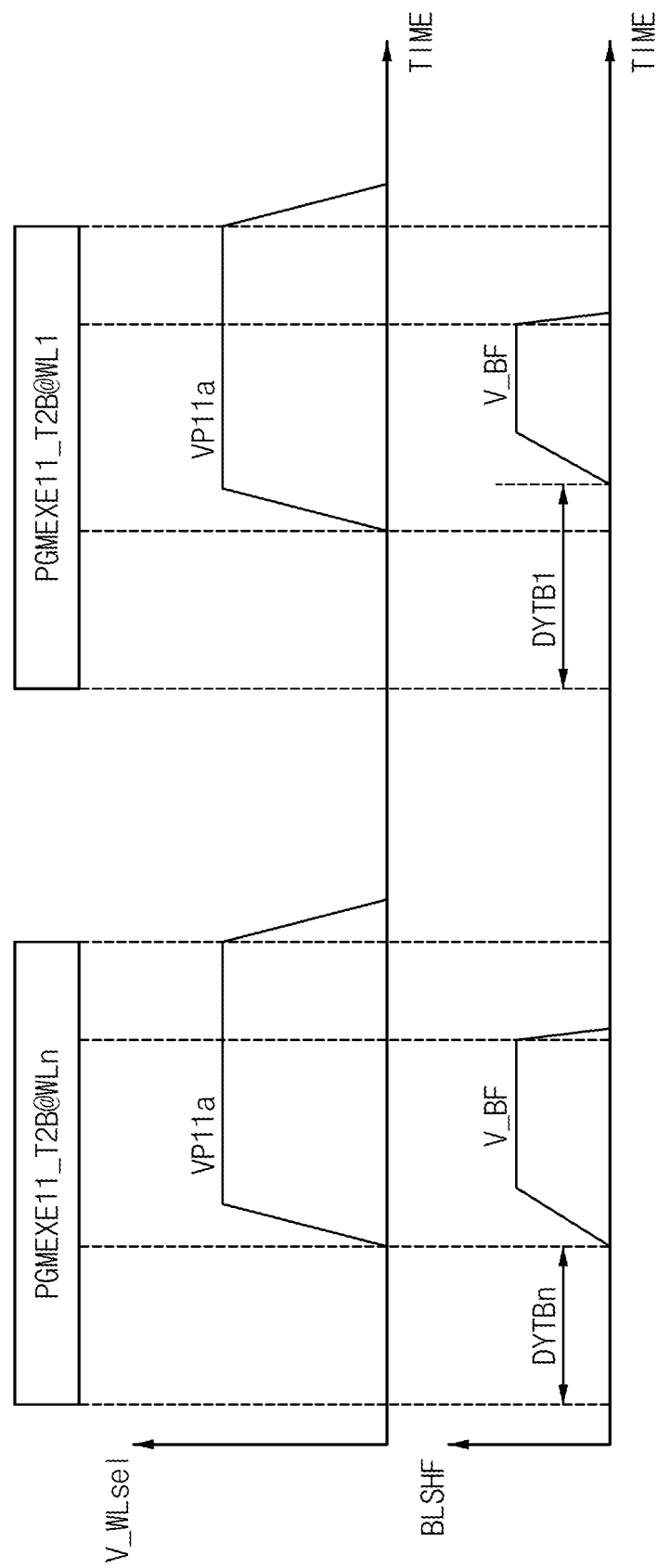
FIGS. 29A and 29B are diagrams for describing operations of FIG. 28.
Figure 29B:
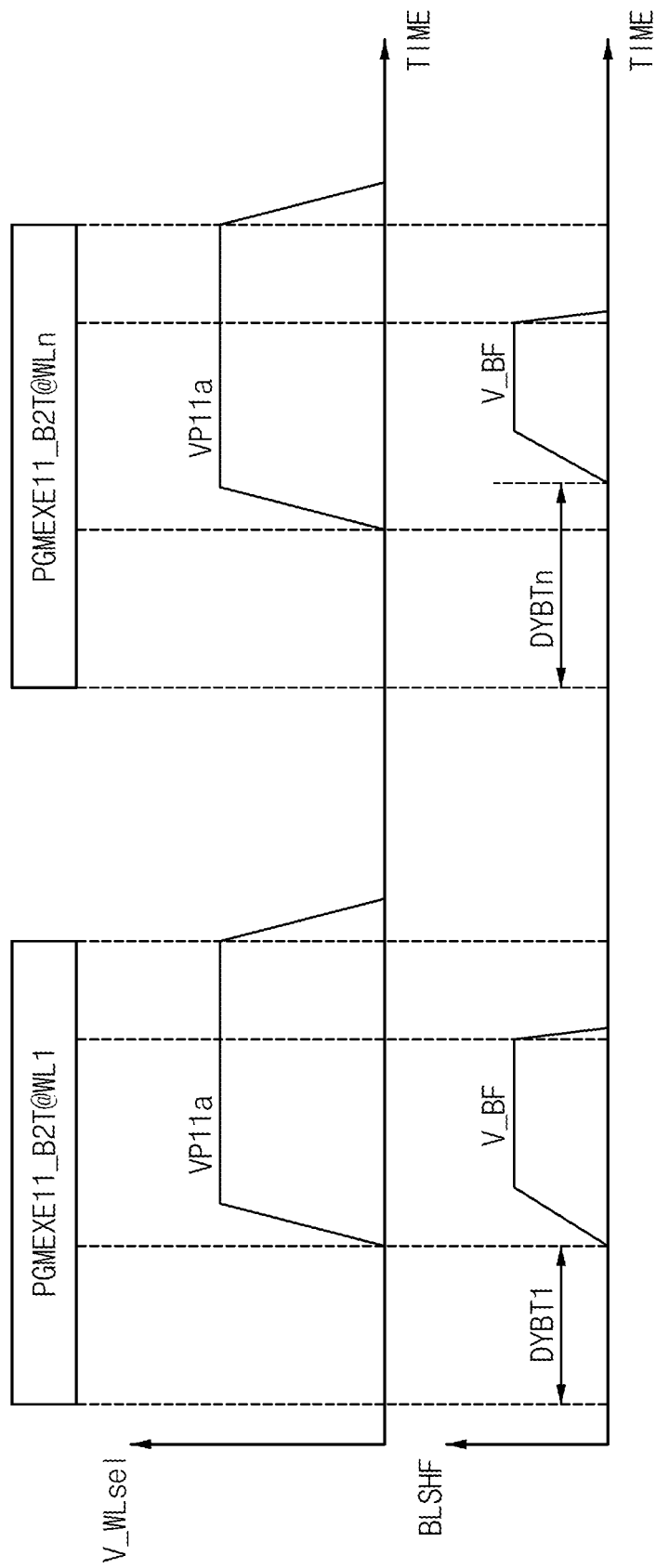

FIG. 28 is a flowchart illustrating a method of programming data in a nonvolatile memory device according to example embodiments. FIGS. 29A and 29B are diagrams for describing an operation of FIG. 28. The descriptions repeated with FIG. 1 will be omitted for brevity.

Referring to FIGS. 28, 29A and 29B, in a method of programming data in a nonvolatile memory device according to example embodiments, operations S100 and S200 may be substantially the same as those described with reference to FIG. 1.

The delay of the bitline shut-off signal may be differently controlled depending on the location of the selected wordline (operation S500). For example, the delay of the bitline shut-off signal may increase for a wordline on which the program operation is performed later.

In some example embodiments, in the T2B scheme described with reference to FIG. 25A, the operations of FIG. 28 may be implemented as illustrated in FIG. 29A. For example, as a distance between the target memory cell and the substrate decreases, the delay of the bitline shut-off signal may increase while the program operation is performed. For example, the operations in the first program execution interval PGMEXE11 may be performed on the n-th wordline WLn and the first wordline WL1 using the program voltage VPGM having the same voltage or level VP11a. In a first program execution interval PGMEXE11_T2B@WLn for a memory cell connected to the n-th wordline WLn, the bitline shut-off signal BLSHF may have a delay DYTBn. In a first program execution interval PGMEXE11_T2B@WL1 for a memory cell connected to the first wordline WL1, the bitline shut-off signal BLSHF may have a delay DYTB1. The delay DYTB1 of the bitline shut-off signal BLSHF for the lowermost memory cell closest to the substrate may be longer than the delay DYTBn of the bitline shut-off signal BLSHF for the uppermost memory cell farthest from the substrate.

In some example embodiments, in the B2T scheme described with reference to FIG. 25B, the operations of FIG. 28 may be implemented as illustrated in FIG. 29B. For example, as a distance between the target memory cell and the substrate increases, the delay of the bitline shut-off signal increases while the program operation is performed. For example, the operations in the first program execution interval PGMEXE11 may be performed on the first wordline WL1 and the n-th wordline WLn using the program voltage VPGM having the same voltage or level VP11a. In a first program execution interval PGMEXE11_B2T@WL1 for a memory cell connected to the first wordline WL1, the bitline shut-off signal BLSHF may have a delay DYBT1. In a first program execution interval PGMEXE11_B2T@WLn for a memory cell connected to the n-th wordline WLn, the bitline shut-off signal BLSHF may have a delay DYBTn. The DYBTn of the bitline shut-off signal BLSHF for the uppermost memory cell farthest from the substrate may be longer than the delay DYBT1 of the bitline shut-off signal BLSHF for the lowermost memory cell closest to the substrate.

Figure 30:
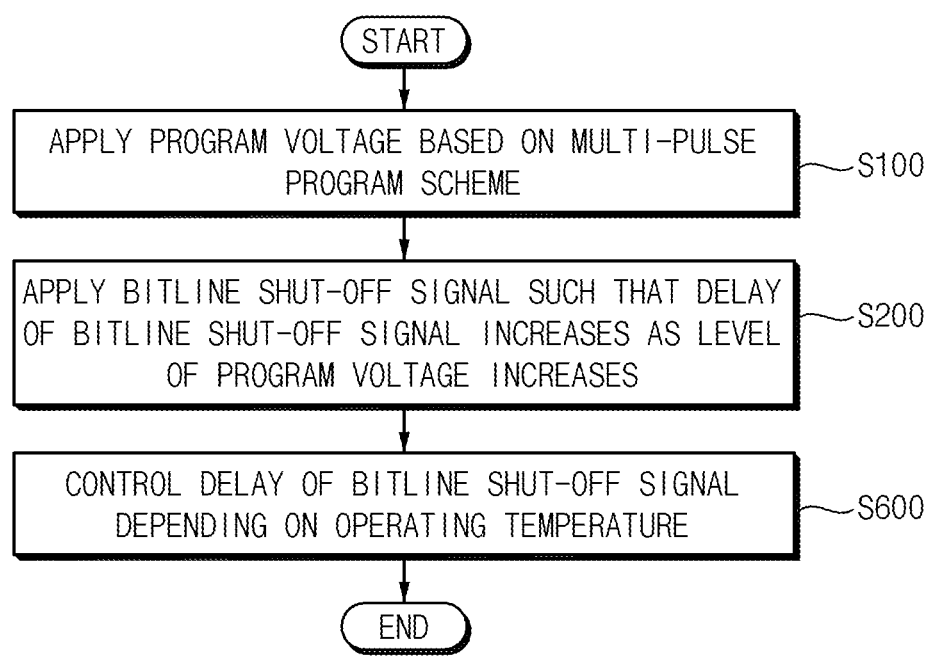
FIG. 30 is a flowchart illustrating a method of programming data in a nonvolatile memory device according to example embodiments.
Figure 31:
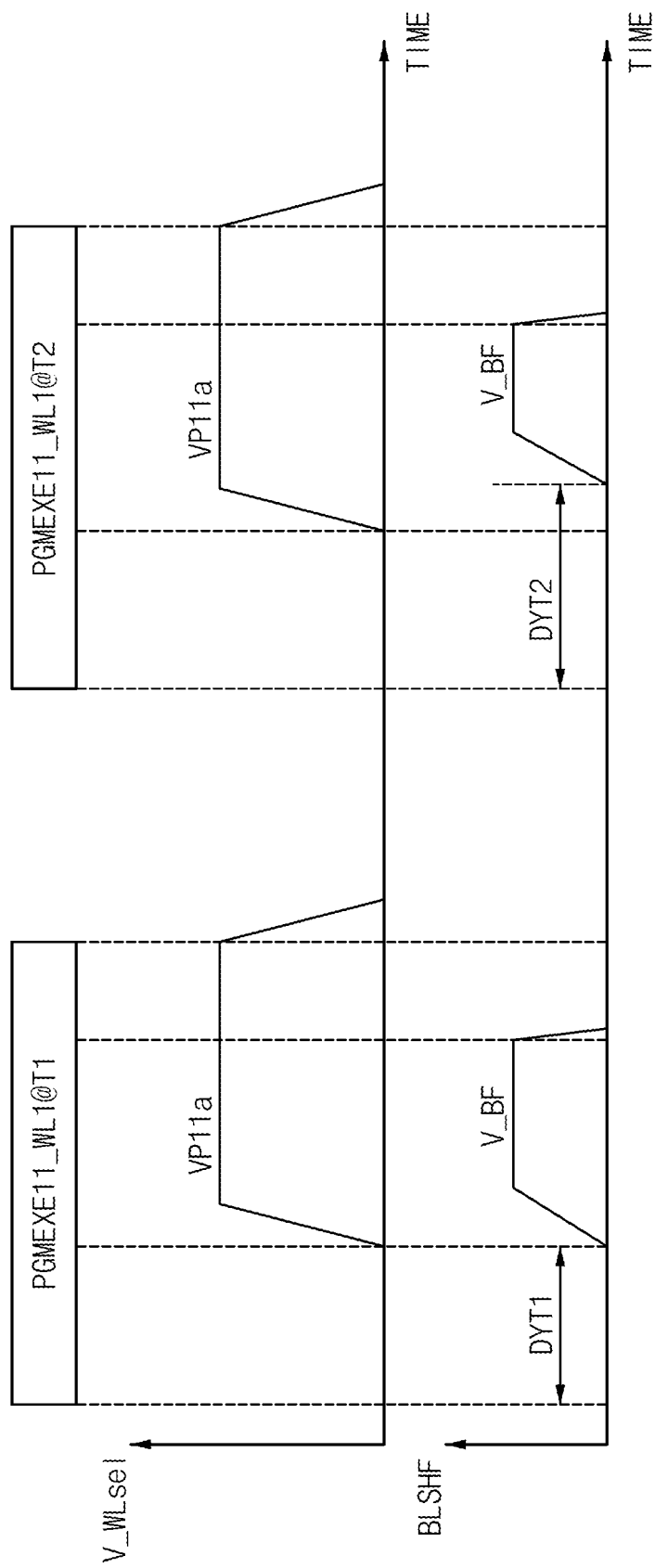
FIG. 31 is a diagram for describing operations of FIG. 30.

FIG. 30 is a flowchart illustrating a method of programming data in a nonvolatile memory device according to example embodiments. FIG. 31 is a diagram for describing an operation of FIG. 30. The descriptions repeated with FIG. 1 will be omitted for brevity.

Referring to FIGS. 30 and 31, in a method of programming data in a nonvolatile memory device according to example embodiments, operations S100 and S200 may be substantially the same as those described with reference to FIG. 1.

The delay of the bitline shut-off signal may be differently controlled depending on an operating temperature of the nonvolatile memory device (operation S600). For example, as the operating temperature of the nonvolatile memory device increases, the delay of the bitline shut-off signal may increase while the program operation is performed.

For example, as illustrated in FIG. 31, the operation in the first program execution interval PGMEXE11 may be performed on the same first wordline WL1 using the program voltage VPGM having the same voltage or level VP11a. When the operating temperature is a first temperature T1, in a first program execution interval PGMEXE11_WL1@T1 for a memory cell connected to the first wordline WL1, the bitline shut-off signal BLSHF may have a delay DYT1. When the operating temperature is a second temperature T2 higher than the first temperature T1, in a first program execution interval PGMEXE11_WL1@T2 for the memory cell connected to the first wordline WL1, the bitline shut-off signal BLSHF may have a delay DYT2. The DYT2 of the bitline shut-off signal BLSHF at the higher temperature T2 may be longer than the delay DYT1 of the bitline shut-off signal BLSHF at the lower temperature T1.

In some example embodiments, the method of programming data in the nonvolatile memory device according to example embodiments may be implemented to include two or more of operations S300, S400, S500 and S600 in FIGS. 15, 22, 28 and 30.

Figure 32:
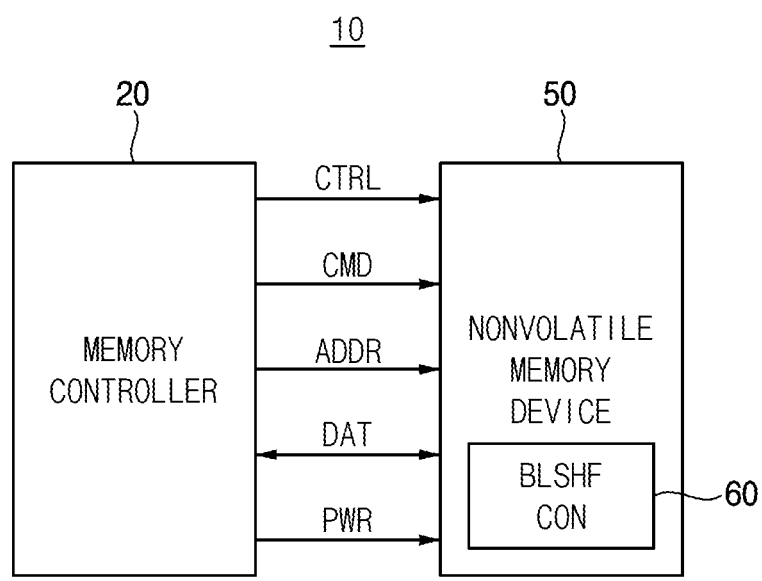
FIG. 32 is a block diagram illustrating a memory system including a nonvolatile memory device according to example embodiments.

FIG. 32 is a block diagram illustrating a memory system including a nonvolatile memory device according to example embodiments.

Referring to FIG. 32, a memory system 10 includes a memory controller 20 and a nonvolatile memory device 50.

The nonvolatile memory device 50 may perform data erase, write (or program) and/or read operations under control of the memory controller 20. The nonvolatile memory device 50 may receive a command CMD and an address ADDR through input/output (I/O) lines from the memory controller 20 for performing such data erase, write and/or read operations, and may exchange data DAT with the memory controller 20 for performing such data write and/or read operations. In addition, the nonvolatile memory device 50 may receive a control signal CTRL through a control line from the memory controller 20. Further, the nonvolatile memory device 50 may receive power PWR through a power line from the memory controller 20.

The nonvolatile memory device 50 may be the nonvolatile memory device according to example embodiments, and may perform the method of programming data according to example embodiments.

Figure 33:
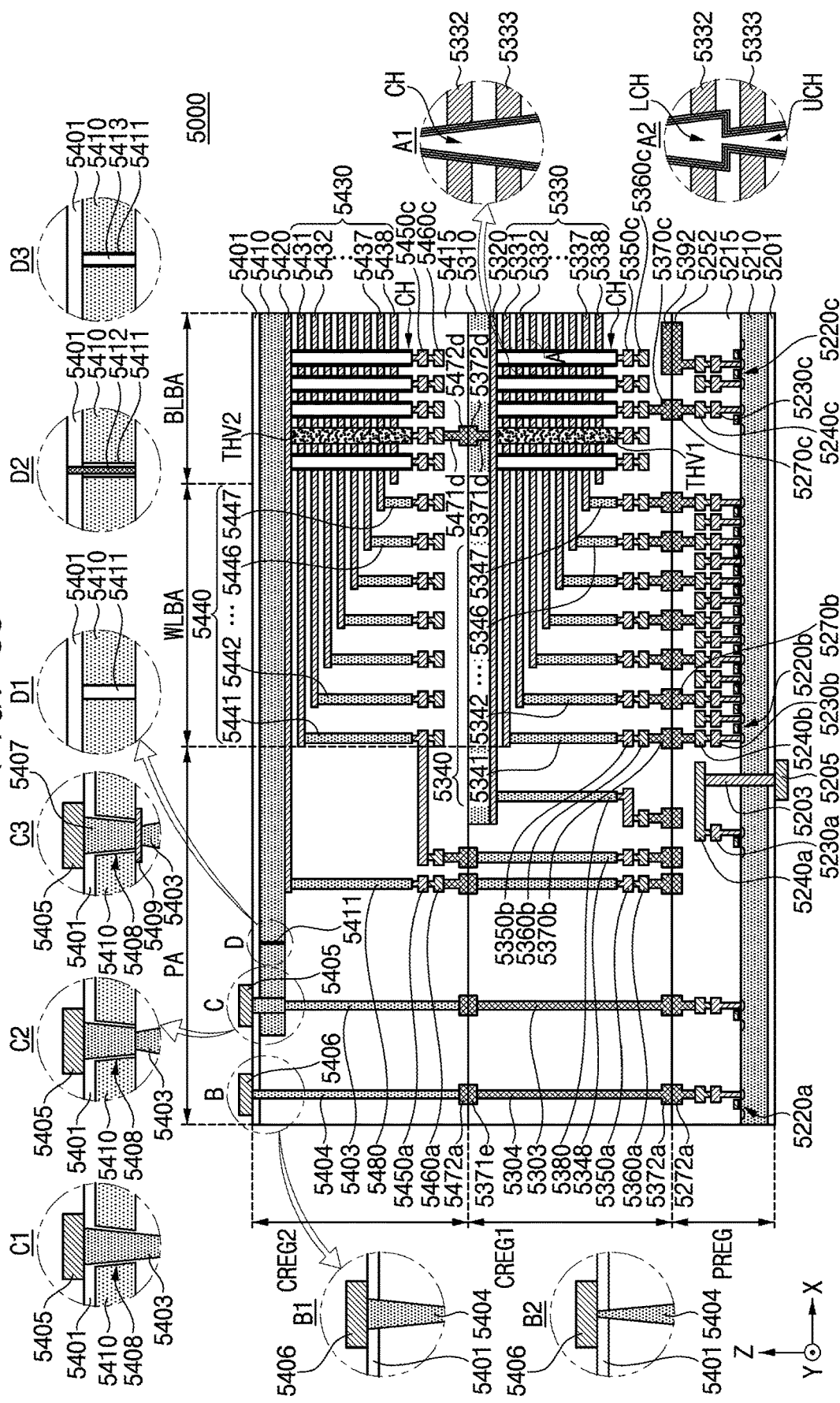
FIG. 33 is a cross-sectional view of a memory device according to example embodiments.

FIG. 33 is a cross-sectional view of a memory device according to example embodiments.

Referring to FIG. 33, a memory device (or nonvolatile memory device) 5000 may have a chip-to-chip (C2C) structure. At least one upper chip including a cell region and a lower chip including a peripheral circuit region PREG may be manufactured separately, and then, the at least one upper chip and the lower chip may be connected to each other by a bonding method to realize the C2C structure. For example, the bonding method may mean a method of electrically or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding method may be a Cu—Cu bonding method. Alternatively, the bonding metal patterns may be formed of aluminum (Al) or tungsten (W).

The memory device 5000 may include the at least one upper chip including the cell region. For example, as illustrated in FIG. 33, the memory device 5000 may include two upper chips. However, the number of the upper chips is not limited thereto. In the case in which the memory device 5000 includes the two upper chips, a first upper chip including a first cell region CREG1, a second upper chip including a second cell region CREG2 and the lower chip including the peripheral circuit region PREG may be manufactured separately, and then, the first upper chip, the second upper chip and the lower chip may be connected to each other by the bonding method to manufacture the memory device 5000. The first upper chip may be turned over and then may be connected to the lower chip by the bonding method, and the second upper chip may also be turned over and then may be connected to the first upper chip by the bonding method. Hereinafter, upper and lower portions of each of the first and second upper chips will be defined based on before each of the first and second upper chips is turned over. In other words, an upper portion of the lower chip may mean an upper portion defined based on a +Z-axis direction, and the upper portion of each of the first and second upper chips may mean an upper portion defined based on a −Z-axis direction in FIG. 33. However, example embodiments are not limited thereto. In some example embodiments, one of the first upper chip and the second upper chip may be turned over and then may be connected to a corresponding chip by the bonding method.

Each of the peripheral circuit region PREG and the first and second cell regions CREG1 and CREG2 of the memory device 5000 may include an external pad bonding region PA, a wordline bonding region WLBA, and a bitline bonding region BLBA.

The peripheral circuit region PREG may include a first substrate 5210 and a plurality of circuit elements 5220*a*, 5220*b* and 5220*c* formed on the first substrate 5210. An interlayer insulating layer 5215 including one or more insulating layers may be provided on the plurality of circuit elements 5220*a*, 5220*b* and 5220*c*, and a plurality of metal lines electrically connected to the plurality of circuit elements 5220*a*, 5220*b* and 5220*c* may be provided in the interlayer insulating layer 5215. For example, the plurality of metal lines may include first metal lines 5230*a*, 5230*b* and 5230*c* connected to the plurality of circuit elements 5220*a*, 5220*b* and 5220*c*, and second metal lines 5240*a*, 5240*b* and 5240*c* formed on the first metal lines 5230*a*, 5230*b* and 5230*c*. The plurality of metal lines may be formed of at least one of various conductive materials. For example, the first metal lines 5230*a*, 5230*b* and 5230*c* may be formed of tungsten having a relatively high electrical resistivity, and the second metal lines 5240*a*, 5240*b* and 5240*c* may be formed of copper having a relatively low electrical resistivity.

The first metal lines 5230*a*, 5230*b* and 5230*c* and the second metal lines 5240*a*, 5240*b* and 5240*c* are illustrated and described in some example embodiments. However, example embodiments are not limited thereto. In some example embodiments, at least one or more additional metal lines may further be formed on the second metal lines 5240*a*, 5240*b* and 5240*c*. In this case, the second metal lines 5240*a*, 5240*b* and 5240*c* may be formed of aluminum, and at least some of the additional metal lines formed on the second metal lines 5240*a*, 5240*b* and 5240*c* may be formed of copper having an electrical resistivity lower than that of aluminum of the second metal lines 5240*a*, 5240*b* and 5240*c*.

The interlayer insulating layer 5215 may be disposed on the first substrate 5210 and may include an insulating material such as silicon oxide and/or silicon nitride.

Each of the first and second cell regions CREG1 and CREG2 may include at least one memory block. The first cell region CREG1 may include a second substrate 5310 and a common source line 5320. A plurality of wordlines 5330 (5331 to 5338) may be stacked on the second substrate 5310 in a direction (i.e., the Z-axis direction) perpendicular to a top surface of the second substrate 5310. String selection lines and a ground selection line may be disposed on and under the wordlines 5330, and the plurality of wordlines 5330 may be disposed between the string selection lines and the ground selection line. Likewise, the second cell region CREG2 may include a third substrate 5410 and a common source line 5420, and a plurality of wordlines 5430 (5431 to 5438) may be stacked on the third substrate 5410 in a direction (i.e., the Z-axis direction) perpendicular to a top surface of the third substrate 5410. Each of the second substrate 5310 and the third substrate 5410 may be formed of at least one of various materials and may be, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CREG1 and CREG2.

In some example embodiments, as illustrated in a region 'A1', the channel structure CH may be provided in the bitline bonding region BLBA and may extend in the direction perpendicular to the top surface of the second substrate 5310 to penetrate the wordlines 5330, the string selection lines, and the ground selection line. The channel structure CH may include a data storage layer, a channel layer, and a filling insulation layer. The channel layer may be electrically connected to a first metal line 5350*c* and a second metal line 5360*c* in the bitline bonding region BLBA. For example, the second metal line 5360*c* may be a bitline and may be connected to the channel structure CH through the first metal line 5350*c*. The bitline 5360*c* may extend in a first direction (e.g., a Y-axis direction) parallel to the top surface of the second substrate 5310.

In some example embodiments, as illustrated in a region 'A2', the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 5310 to penetrate the common source line 5320 and lower wordlines 5331 and 5332. The lower channel LCH may include a data storage layer, a channel layer, and a filling insulation layer and may be connected to the upper channel UCH. The upper channel UCH may penetrate upper wordlines 5333 to 5338. The upper channel UCH may include a data storage layer, a channel layer, and a filling insulation layer, and the channel layer of the upper channel UCH may be electrically connected to the first metal line 5350*c* and the second metal line 5360*c*. As a length of a channel increases, due to characteristics of manufacturing processes, it may be difficult to form a channel having a substantially uniform width. The memory device 5000 according to some example embodiments may include a channel having improved width uniformity due to the lower channel LCH and the upper channel UCH which are formed by the processes performed sequentially.

In the case in which the channel structure CH includes the lower channel LCH and the upper channel UCH as illustrated in the region 'A2', a wordline located near to a boundary between the lower channel LCH and the upper channel UCH may be a dummy wordline. For example, the wordlines 5332 and 5333 adjacent to the boundary between the lower channel LCH and the upper channel UCH may be the dummy wordlines. In this case, data may not be stored in memory cells connected to the dummy wordline. Alternatively, the number of pages corresponding to the memory cells connected to the dummy wordline may be less than the number of pages corresponding to the memory cells connected to a general wordline. A voltage or level of a voltage applied to the dummy wordline may be different from a voltage or level of a voltage applied to the general wordline, and thus it is possible to reduce an influence of a non-uniform channel width between the lower and upper channels LCH and UCH on an operation of the memory device 5000.

In some example embodiments, the number of the lower wordlines 5331 and 5332 penetrated by the lower channel LCH is less than the number of the upper wordlines 5333 to 5338 penetrated by the upper channel UCH in the region 'A2'. However, example embodiments are not limited thereto. In some example embodiments, the number of the lower wordlines penetrated by the lower channel LCH may be equal to or more than the number of the upper wordlines penetrated by the upper channel UCH. In addition, structural features and connection relation of the channel structure CH disposed in the second cell region CREG2 may be substantially the same as those of the channel structure CH disposed in the first cell region CREG1.

In the bitline bonding region BLBA, a first through-electrode THV1 may be provided in the first cell region CREG1, and a second through-electrode THV2 may be provided in the second cell region CREG2. As illustrated in FIG. 33, the first through-electrode THV1 may penetrate the common source line 5320 and the plurality of wordlines 5330. In some example embodiments, the first through-electrode THV1 may further penetrate the second substrate 5310. The first through-electrode THV1 may include a conductive material. Alternatively, the first through-electrode THV1 may include a conductive material surrounded by an insulating material. The second through-electrode THV2 may have the same shape and structure as the first through-electrode THV1.

In some example embodiments, the first through-electrode THV1 and the second through-electrode THV2 may be electrically connected to each other through a first through-metal pattern 5372d and a second through-metal pattern 5472d. The first through-metal pattern 5372d may be formed at a bottom end of the first upper chip including the first cell region CREG1, and the second through-metal pattern 5472d may be formed at a top end of the second upper chip including the second cell region CREG2. The first through-electrode THV1 may be electrically connected to the first metal line 5350c and the second metal line 5360c. A lower via 5371d may be formed between the first through-electrode THV1 and the first through-metal pattern 5372d, and an upper via 5471d may be formed between the second through-electrode THV2 and the second through-metal pattern 5472d. The first through-metal pattern 5372d and the second through-metal pattern 5472d may be connected to each other by the bonding method.

In addition, in the bitline bonding region BLBA, an upper metal pattern 5252 may be formed in an uppermost metal layer of the peripheral circuit region PERI, and an upper metal pattern 5392 having the same shape as the upper metal pattern 5252 may be formed in an uppermost metal layer of the first cell region CREG1. The upper metal pattern 5392 of the first cell region CREG1 and the upper metal pattern 5252 of the peripheral circuit region PREG may be electrically connected to each other by the bonding method. In the bitline bonding region BLBA, the bitline 5360c may be electrically connected to a page buffer included in the peripheral circuit region PERI. For example, some of the circuit elements 5220c of the peripheral circuit region PREG may constitute the page buffer, and the bitline 5360c may be electrically connected to the circuit elements 5220c constituting the page buffer through an upper bonding metal pattern 5370c of the first cell region CREG1 and an upper bonding metal pattern 5270c of the peripheral circuit region PERI.

Referring continuously to FIG. 33, in the wordline bonding region WLBA, the wordlines 5330 of the first cell region CREG1 may extend in a second direction (e.g., an X-axis direction) parallel to the top surface of the second substrate 5310 and may be connected to a plurality of cell contact plugs 5340 (5341 to 5347). First metal lines 5350b and second metal lines 5360b may be sequentially connected onto the cell contact plugs 5340 connected to the wordlines 5330. In the wordline bonding region WLBA, the cell contact plugs 5340 may be connected to the peripheral circuit region PREG through upper bonding metal patterns 5370b of the first cell region CREG1 and upper bonding metal patterns 5270b of the peripheral circuit region PERI.

The cell contact plugs 5340 may be electrically connected to a row decoder included in the peripheral circuit region PERI. For example, some of the circuit elements 5220b of the peripheral circuit region PREG may constitute the row decoder, and the cell contact plugs 5340 may be electrically connected to the circuit elements 5220b constituting the row decoder through the upper bonding metal patterns 5370b of the first cell region CREG1 and the upper bonding metal patterns 5270b of the peripheral circuit region PERI. In some example embodiments, an operating voltage of the circuit elements 5220b constituting the row decoder may be different from an operating voltage of the circuit elements 5220c constituting the page buffer. For example, the operating voltage of the circuit elements 5220c constituting the page buffer may be greater than the operating voltage of the circuit elements 5220b constituting the row decoder.

Likewise, in the wordline bonding region WLBA, the wordlines 5430 of the second cell region CREG2 may extend in the second direction (e.g., the X-axis direction) parallel to the top surface of the third substrate 5410 and may be connected to a plurality of cell contact plugs 5440 (5441 to 5447). The cell contact plugs 5440 may be connected to the peripheral circuit region PREG through an upper metal pattern of the second cell region CREG2 and lower and upper metal patterns and a cell contact plug 5348 of the first cell region CREG1.

In the wordline bonding region WLBA, the upper bonding metal patterns 5370b may be formed in the first cell region CREG1, and the upper bonding metal patterns 5270b may be formed in the peripheral circuit region PERI. The upper bonding metal patterns 5370b of the first cell region CREG1 and the upper bonding metal patterns 5270b of the peripheral circuit region PREG may be electrically connected to each other by the bonding method. The upper bonding metal patterns 5370b and the upper bonding metal patterns 5270b may be formed of aluminum, copper, or tungsten.

In the external pad bonding region PA, a lower metal pattern 5371e may be formed in a lower portion of the first cell region CREG1, and an upper metal pattern 5472a may be formed in an upper portion of the second cell region CREG2. The lower metal pattern 5371e of the first cell region CREG1 and the upper metal pattern 5472a of the second cell region CREG2 may be connected to each other by the bonding method in the external pad bonding region PA. Likewise, an upper metal pattern 5372*a* may be formed in an upper portion of the first cell region CREG1, and an upper metal pattern 5272*a* may be formed in an upper portion of the peripheral circuit region PERI. The upper metal pattern 5372*a* of the first cell region CREG1 and the upper metal pattern 5272*a* of the peripheral circuit region PREG may be connected to each other by the bonding method.

Common source line contact plugs 5380 and 5480 may be disposed in the external pad bonding region PA. The common source line contact plugs 5380 and 5480 may be formed of a conductive material such as a metal, a metal compound, and/or doped polysilicon. The common source line contact plug 5380 of the first cell region CREG1 may be electrically connected to the common source line 5320, and the common source line contact plug 5480 of the second cell region CREG2 may be electrically connected to the common source line 5420. A first metal line 5350*a* and a second metal line 5360*a* may be sequentially stacked on the common source line contact plug 5380 of the first cell region CREG1, and a first metal line 5450*a* and a second metal line 5460*a* may be sequentially stacked on the common source line contact plug 5480 of the second cell region CREG2.

Input/output pads 5205, 5405 and 5406 may be disposed in the external pad bonding region PA. Referring to FIG. 33, a lower insulating layer 5201 may cover, overlap, or be on a bottom surface of the first substrate 5210, and a first input/output pad 5205 may be formed on the lower insulating layer 5201. The first input/output pad 5205 may be connected to at least one of a plurality of the circuit elements 5220*a* disposed in the peripheral circuit region PREG through a first input/output contact plug 5203 and may be separated from the first substrate 5210 by the lower insulating layer 5201. In addition, a side insulating layer may be disposed between the first input/output contact plug 5203 and the first substrate 5210 to electrically isolate the first input/output contact plug 5203 from the first substrate 5210.

An upper insulating layer 5401 covering, overlapping, or be on a top surface (in a +Z-axis direction) of the third substrate 5410 may be formed on the third substrate 5410. A second input/output pad 5405 and/or a third input/output pad 5406 may be disposed on the upper insulating layer 5401. The second input/output pad 5405 may be connected to at least one of the plurality of circuit elements 5220*a* disposed in the peripheral circuit region PREG through second input/output contact plugs 5403 and 5303, and the third input/output pad 5406 may be connected to at least one of the plurality of circuit elements 5220*a* disposed in the peripheral circuit region PREG through third input/output contact plugs 5404 and 5304.

In some example embodiments, the third substrate 5410 v not be disposed in a region in which the input/output contact plug is disposed. For example, as illustrated in a region 'B', the third input/output contact plug 5404 may be separated from the third substrate 5410 in a direction parallel to the top surface of the third substrate 5410 (e.g., an X-axis direction) and may penetrate an interlayer insulating layer 5415 of the second cell region CREG2 so as to be connected to the third input/output pad 5406. In this case, the third input/output contact plug 5404 may be formed by at least one of various processes.

In some example embodiments, as illustrated in a region 'B1', the third input/output contact plug 5404 may extend in a third direction (e.g., the Z-axis direction), and a diameter of the third input/output contact plug 5404 may become progressively greater (e.g. increase) toward the upper insulating layer 5401. In other words, a diameter of the channel structure CH described in the region 'A1' may become progressively less (e.g. decrease) toward the upper insulating layer 5401, but the diameter of the third input/output contact plug 5404 may become progressively greater toward the upper insulating layer 5401. For example, the third input/output contact plug 5404 may be formed after the second cell region CREG2 and the first cell region CREG1 are bonded to each other by the bonding method.

In some example embodiments, as illustrated in a region 'B2', the third input/output contact plug 5404 may extend in the third direction (e.g., the Z-axis direction), and a diameter of the third input/output contact plug 5404 may become progressively less toward the upper insulating layer 5401. In other words, like the channel structure CH described in the region 'A1', the diameter of the third input/output contact plug 5404 may become progressively less toward the upper insulating layer 5401. For example, the third input/output contact plug 5404 may be formed together with the cell contact plugs 5440 before the second cell region CREG2 and the first cell region CREG1 are bonded to each other.

In some example embodiments, the input/output contact plug may overlap with the third substrate 5410. For example, as illustrated in a region 'C', the second input/output contact plug 5403 may penetrate the interlayer insulating layer 5415 of the second cell region CREG2 in the third direction (e.g., the Z-axis direction) and may be electrically connected to the second input/output pad 5405 through the third substrate 5410. In this case, a connection structure of the second input/output contact plug 5403 and the second input/output pad 5405 may be realized by various methods.

In some example embodiments, as illustrated in a region 'C1', an opening 5408 may be formed to penetrate the third substrate 5410, and the second input/output contact plug 5403 may be connected directly to the second input/output pad 5405 through the opening 5408 formed in the third substrate 5410. In this case, as illustrated in the region 'C1', a diameter of the second input/output contact plug 5403 may become progressively greater toward the second input/output pad 5405. However, example embodiments are not limited thereto, and in some example embodiments, the diameter of the second input/output contact plug 5403 may become progressively less toward the second input/output pad 5405.

In some example embodiments, as illustrated in a region 'C2', the opening 5408 penetrating the third substrate 5410 may be formed, and a contact 5407 may be formed in the opening 5408. An end of the contact 5407 may be connected to the second input/output pad 5405, and another end of the contact 5407 may be connected to the second input/output contact plug 5403. Thus, the second input/output may plug 5403 may be electrically connected to the second input/output pad 5405 through the contact 5407 in the opening 5408. In this case, as illustrated in the region 'C2', a diameter of the contact 5407 may become progressively greater toward the second input/output pad 5405, and a diameter of the second input/output contact plug 5403 may become progressively less toward the second input/output pad 5405. For example, the second input/output contact plug 5403 may be formed together with the cell contact plugs 5440 before the second cell region CREG2 and the first cell region CREG1 are bonded to each other, and the contact 5407 may be formed after the second cell region CREG2 and the first cell region CREG1 are bonded to each other.

In some example embodiments illustrated in a region 'C3', a stopper 5409 may further be formed on a bottom end of the opening 5408 of the third substrate 5410, as compared with the embodiments of the region 'C2'. The stopper 5409 may be a metal line formed in the same layer as the common source line 5420. Alternatively, the stopper 5409 may be a metal line formed in the same layer as at least one of the wordlines 5430. The second input/output contact plug 5403 may be electrically connected to the second input/output pad 5405 through the contact 5407 and the stopper 5409.

Like the second and third input/output contact plugs 5403 and 5404 of the second cell region CREG2, a diameter of each of the second and third input/output contact plugs 5303 and 5304 of the first cell region CREG1 may become progressively less toward the lower metal pattern 5371e or may become progressively greater toward the lower metal pattern 5371e.

In some example embodiments, a slit 5411 may be formed in the third substrate 5410. For example, the slit 5411 may be formed at a certain position of the external pad bonding region PA. For example, as illustrated in a region 'D', the slit 5411 may be located between the second input/output pad 5405 and the cell contact plugs 5440 when viewed in a plan view. Alternatively, the second input/output pad 5405 may be located between the slit 5411 and the cell contact plugs 5440 when viewed in a plan view.

In some example embodiments, as illustrated in a region 'D1', the slit 5411 may be formed to penetrate the third substrate 5410. For example, the slit 5411 may be used to prevent the third substrate 5410 from being finely cracked when the opening 5408 is formed. However, example embodiments are not limited thereto, and in some example embodiments, the slit 5411 may be formed to have a depth ranging from about 60% to about 70% of a thickness of the third substrate 5410.

In some example embodiments, as illustrated in a region 'D2', a conductive material 5412 may be formed in the slit 5411. For example, the conductive material 5412 may be used to discharge a leakage current occurring in driving of the circuit elements in the external pad bonding region PA to the outside (e.g., external to the memory device 500). In this case, the conductive material 5412 may be connected to an external ground line.

In some example embodiments, as illustrated in a region 'D3', an insulating material 5413 may be formed in the slit 5411. For example, the insulating material 5413 may be used to electrically isolate the second input/output pad 5405 and the second input/output contact plug 5403 disposed in the external pad bonding region PA from the wordline bonding region WLBA. Since the insulating material 5413 is formed in the slit 5411, it is possible to prevent a voltage provided through the second input/output pad 5405 from affecting a metal layer disposed on the third substrate 5410 in the wordline bonding region WLBA.

In some example embodiments, the first to third input/output pads 5205, 5405 and 5406 may be selectively formed. For example, the memory device 5000 may be realized to include only the first input/output pad 5205 disposed on the first substrate 5210, to include only the second input/output pad 5405 disposed on the third substrate 5410, or to include only the third input/output pad 5406 disposed on the upper insulating layer 5401.

In some example embodiments, at least one of the second substrate 5310 of the first cell region CREG1 or the third substrate 5410 of the second cell region CREG2 may be used as a sacrificial substrate and may be completely or partially removed before or after a bonding process. An additional layer may be stacked after the removal of the substrate. For example, the second substrate 5310 of the first cell region CREG1 may be removed before or after the bonding process of the peripheral circuit region PREG and the first cell region CREG1, and then, an insulating layer covering, overlapping or on a top surface of the common source line 5320 or a conductive layer for connection may be formed. Likewise, the third substrate 5410 of the second cell region CREG2 may be removed before or after the bonding process of the first cell region CREG1 and the second cell region CREG2, and then, the upper insulating layer 5401 covering, overlapping, or on a top surface of the common source line 5420 or a conductive layer for connection may be formed.

The example embodiments may be applied to various electronic devices and systems that include the storage devices. For example, the example embodiments may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of programming data in a nonvolatile memory device including a plurality of memory cells and a page buffer configured to control the plurality of memory cells, wherein the plurality of memory cells are electrically connected to a plurality of wordlines and a plurality of bitlines, the method comprising:
   in a first program time period of a first program loop, applying a program voltage having a first program voltage to a selected wordline that is electrically connected to a target memory cell on which a program operation is performed; and
   in the first program time period, applying a bitline shut-off signal having a first delay to the page buffer,
   wherein the program voltage is applied to the selected wordline multiple times during one program loop while a magnitude of the program voltage is changed for each of the multiple times that the program voltage is applied,
   wherein, as the magnitude of the program voltage increases, a delay of the bitline shut-off signal increases, and
   wherein the delay of the bitline shut-off signal corresponds to a time period during which the bitline shut-off signal maintains a ground voltage.

2. The method of claim 1, further comprising:
in a second program time period of the first program loop after the first program time period of the first program loop, applying the program voltage having a second program voltage different from the first program voltage to the selected wordline; and
in the second program time period, applying the bitline shut-off signal having a second delay different from the first delay to the page buffer.

3. The method of claim 2,
wherein the second program voltage is higher than the first program voltage, and
wherein the second delay is longer than the first delay.

4. The method of claim 2,
wherein the second program voltage is lower than the first program voltage, and
wherein the second delay is shorter than the first delay.

5. The method of claim 1, further comprising:
in a third program time period of a second program loop after the first program loop, applying the program voltage having a third program voltage higher than the first program voltage to the selected wordline; and
in the third program time period, applying the bitline shut-off signal having a third delay longer than the first delay to the page buffer.

6. The method of claim 1,
wherein, as the magnitude of the program voltage increases, the delay of the bitline shut-off signal increases, and a slope of the bitline shut-off signal increases, and
wherein the slope of the bitline shut-off signal corresponds to an increase from the ground voltage to a bitline forcing voltage.

7. The method of claim 6,
wherein the bitline shut-off signal has a plurality of step waveforms and increases from the ground voltage to the bitline forcing voltage,
wherein the slope of the bitline shut-off signal is based on adjusting at least one of a cycle and a step difference,
wherein the cycle corresponds to a time period during which each of the plurality of step waveforms has a fixed voltage, and
wherein the step difference corresponds to a difference between voltages of adjacent step waveforms.

8. The method of claim 1,
wherein the nonvolatile memory device further includes:
a plurality of string selection transistors electrically connected to a plurality of string selection lines and electrically connected to some of the plurality of memory cells,
wherein the method further comprises:
in the first program time period, applying a string selection voltage having a first string selection voltage to a selected string selection line that is electrically connected to a target string selection transistor and electrically connected to the target memory cell, and
wherein, as the magnitude of the program voltage increases, the string selection voltage increases.

9. The method of claim 8, further comprising:
in a second program time period of the first program loop after the first program time period of the first program loop, applying the program voltage having a second program voltage different from the first program voltage to the selected wordline;
in the second program time period, applying the bitline shut-off signal having a second delay different from the first delay to the page buffer; and
in the second program time period, applying the string selection voltage having a second string selection voltage different from the first string selection voltage to the selected string selection line.

10. The method of claim 8, further comprising:
in a third program time period of a second program loop after the first program loop, applying the program voltage having a third program voltage higher than the first program voltage to the selected wordline;
in the third program time period, applying the bitline shut-off signal having a third delay longer than the first delay to the page buffer; and
in the third program time period, applying the string selection voltage having a third string selection voltage higher than the first string selection voltage to the selected string selection line.

11. The method of claim 1,
wherein the plurality of memory cells are in a vertical direction on a substrate, and
wherein the program operation is sequentially performed from an uppermost memory cell farthest from the substrate of the plurality of memory cells to a lowermost memory cell closest to the substrate of the plurality of memory cells.

12. The method of claim 11,
wherein the nonvolatile memory device further includes:
a plurality of ground selection transistors electrically connected to a plurality of ground selection lines and a common source line and electrically connected to some of the plurality of memory cells, and further comprising:
controlling the delay of the bitline shut-off signal starting from a P-th program loop among a plurality of program loops performed on the target memory cell, where P is a natural number, and
wherein, while an initial precharge operation is performed in the P-th program loop, a magnitude of a ground selection voltage applied to a selected ground selection line that is electrically connected to a target ground selection transistor and electrically connected to the target memory cell, or a magnitude of a common source voltage applied to the common source line is changed.

13. The method of claim 11, wherein, as a distance between the target memory cell and the substrate decreases, the delay of the bitline shut-off signal increases while the program operation is performed.

14. The method of claim 1,
wherein the plurality of memory cells are in a vertical direction on a substrate, and
wherein the program operation is sequentially performed from a lowermost memory cell closest to the substrate of the plurality of memory cells to an uppermost memory cell farthest from the substrate of the plurality of memory cells.

15. The method of claim 14, further comprising:
controlling the delay of the bitline shut-off signal starting from a Q-th program loop among a plurality of program loops performed on the target memory cell, where Q is a natural number, and
wherein, in the Q-th program loop, a timing of performing an initial precharge operation and a timing of performing a bitline setup operation are different from each other.

16. The method of claim 14, wherein, as a distance between the target memory cell and the substrate increases, the delay of the bitline shut-off signal increases while the program operation is performed.

17. The method of claim 1, wherein, as an operating temperature of the nonvolatile memory device increases, the delay of the bitline shut-off signal increases while the program operation is performed.

18. A nonvolatile memory device comprising:
a memory cell array including a plurality of memory cells electrically connected to a plurality of wordlines and a plurality of bitlines;
a page buffer circuit including a page buffer configured to control the plurality of memory cells; and
a control circuit configured to apply a program voltage having a first program voltage to a selected wordline that is electrically connected to a target memory cell on which a program operation is performed in a first program time period of a first program loop, and configured to apply a bitline shut-off signal having a first delay to the page buffer in the first program time period,
wherein the control circuit is configured to apply the program voltage to the selected wordline multiple times during one program loop while a magnitude of the program voltage is changed for each of the multiple times that the program voltage is applied,
wherein, as the magnitude of the program voltage increases, a delay of the bitline shut-off signal increases, and
wherein the delay of the bitline shut-off signal corresponds to a time period during which the bitline shut-off signal maintains a ground voltage.

19. The nonvolatile memory device of claim 18, wherein the page buffer includes:
a bitline selection circuit configured to be selectively electrically connected to a selected bitline that is electrically connected to the target memory cell based on the bitline shut-off signal;
a sensing latch configured to store bitline setup information received by the selected bitline; and
a forcing latch configured to store bitline forcing information received by the selected bitline.

20. A method of programming data in a nonvolatile memory device including a plurality of memory cells and a page buffer configured to control the plurality of memory cells, wherein the plurality of memory cells are electrically connected to a plurality of wordlines and a plurality of bitlines, the method comprising:
in a first program time period of a first program loop, applying a program voltage having a first program voltage to a selected wordline that is electrically connected to a target memory cell on which a program operation is performed;
in the first program time period, applying a bitline shut-off signal having a first delay to the page buffer;
in a second program time period of the first program loop after the first program time period of the first program loop, applying the program voltage having a second program voltage different from the first program voltage to the selected wordline;
in the second program time period, applying the bitline shut-off signal having a second delay different from the first delay to the page buffer;
in a third program time period of a second program loop after the first program loop, applying the program voltage having a third program voltage higher than the first program voltage to the selected wordline; and
in the third program time period, applying the bitline shut-off signal having a third delay longer than the first delay to the page buffer,
wherein the program voltage is applied to the selected wordline multiple times during one program loop while a magnitude of the program voltage is changed for each of the multiple times that the program voltage is applied,
wherein, as the magnitude of the program voltage increases, a delay of the bitline shut-off signal increases, and a slope of the bitline shut-off signal increases,
wherein the delay of the bitline shut-off signal corresponds to a time period during which the bitline shut-off signal maintains a ground voltage,
wherein the slope of the bitline shut-off signal corresponds to an increase from the ground voltage to a bitline forcing voltage,
wherein, in response to the second program voltage being higher than the first program voltage, the second delay is longer than the first delay, and
wherein, in response to the second program voltage being lower than the first program voltage, the second delay is shorter than the first delay.

* * * * *